United States Patent
Evans et al.

(10) Patent No.: US 10,620,378 B2
(45) Date of Patent: Apr. 14, 2020

(54) METHOD OF MAKING AN ENHANCED COUPLING STRENGTH GRATING HAVING A COVER LAYER

(71) Applicants: Southern Methodist University, Dallas, TX (US); Oracle International Corporation, Redwood Shores, CA (US)

(72) Inventors: Gary A. Evans, Plano, TX (US); Jerome K. Butler, Richardson, TX (US); Jay B. Kirk, Plano, TX (US); Ruo-Hua He, Dallas, TX (US); Jin Yao, San Diego, CA (US); Guoliang Li, San Diego, CA (US); Xuezhe Zheng, San Diego, CA (US); Ashok V. Krishnamoorthy, San Diego, CA (US)

(73) Assignees: Southern Methodist University, Dallas, TX (US); Oracle International Corporation, Redwood Shores, CA (US)

( * ) Notice: Subject to any disclaimer, the term of this patent is extended or adjusted under 35 U.S.C. 154(b) by 0 days.

(21) Appl. No.: 16/522,544

(22) Filed: Jul. 25, 2019

(65) Prior Publication Data
US 2019/0353846 A1 Nov. 21, 2019

Related U.S. Application Data

(62) Division of application No. 14/479,039, filed on Sep. 5, 2014, now Pat. No. 10,371,898.
(Continued)

(51) Int. Cl.
*G02B 6/34* (2006.01)
*G02B 6/132* (2006.01)
(Continued)

(52) U.S. Cl.
CPC ............... *G02B 6/34* (2013.01); *G02B 6/132* (2013.01); *G02B 6/136* (2013.01); *G02B 6/036* (2013.01);
(Continued)

(58) Field of Classification Search
CPC .......... G02B 6/34; G02B 6/132; G02B 6/136; G02B 6/1223; G02B 6/036;
(Continued)

(56) References Cited

U.S. PATENT DOCUMENTS

| 5,420,947 A | 5/1995 | Li et al. |
| 6,760,359 B2 | 7/2004 | Evans |

(Continued)

OTHER PUBLICATIONS

Stoll, H.M., "Distributed Bragg deflector: a multifunctional integrated optical device," Applied Optics, vol. 17, No. 16, Aug. 15, 1978, pp. 2562-2569.

*Primary Examiner* — Andrew Jordan
(74) *Attorney, Agent, or Firm* — Daniel J. Chalker; Chalker Flores, LLP

(57) ABSTRACT

The present invention includes an optical waveguide with a grating and a method of making the same for increasing the effectiveness of the grating. In one example, the grating is at least partially covered by a liner layer disposed on at least a portion of a grating; and a cover layer disposed on the liner layer, wherein a first material selected for the core and ridges and a second material selected for the liner layer are selected to provide a difference in the index of refraction between the first and second material that is sufficient to provide a contrast therebetween.

38 Claims, 36 Drawing Sheets

Related U.S. Application Data

(60) Provisional application No. 61/874,162, filed on Sep. 5, 2013.

(51) Int. Cl.
| | | |
|---|---|---|
| *G02B 6/136* | (2006.01) | |
| *G02B 6/036* | (2006.01) | |
| *G02B 6/12* | (2006.01) | |
| *G02B 6/122* | (2006.01) | |
| *H01S 3/063* | (2006.01) | |
| *H01S 5/12* | (2006.01) | |
| *H01S 5/125* | (2006.01) | |
| *H01S 5/187* | (2006.01) | |

(52) U.S. Cl.
CPC .. *G02B 6/1223* (2013.01); *G02B 2006/12107* (2013.01); *G02B 2006/12176* (2013.01); *H01S 3/0635* (2013.01); *H01S 5/12* (2013.01); *H01S 5/125* (2013.01); *H01S 5/1231* (2013.01); *H01S 5/187* (2013.01)

(58) Field of Classification Search
CPC ........... G02B 2006/12107; G02B 2006/12176; H01S 5/12; H01S 5/125; H01S 5/1231; H01S 5/187; H01S 3/0635
See application file for complete search history.

(56) References Cited

U.S. PATENT DOCUMENTS

| | | | |
|---|---|---|---|
| 6,775,427 B2 | 8/2004 | Evans | |
| 7,006,732 B2 | 2/2006 | Gunn, III et al. | |
| 7,068,887 B1 | 7/2006 | Gunn, III et al. | |
| 8,384,630 B2 | 2/2013 | Ray et al. | |
| 8,395,568 B2 | 3/2013 | Ray et al. | |
| 8,456,392 B2 | 6/2013 | Ray et al. | |
| 8,456,393 B2 | 6/2013 | Ray et al. | |
| 8,611,007 B2 | 12/2013 | Davis | |
| 8,617,912 B2 | 12/2013 | Yanagisawa | |
| 8,906,721 B2 | 12/2014 | Hatori et al. | |
| 8,989,537 B2 | 3/2015 | Mossberg et al. | |
| 9,236,527 B2 | 1/2016 | Ray et al. | |
| 9,236,528 B2 | 1/2016 | Ray et al. | |
| 9,310,566 B2 | 4/2016 | Valera et al. | |
| 9,348,076 B2 | 5/2016 | Wang et al. | |
| 9,354,374 B2 | 5/2016 | Wang et al. | |
| 9,762,025 B2 | 9/2017 | Johnson et al. | |
| 10,371,898 B2 | 8/2019 | Evans et al. | |
| 2002/0105725 A1 | 8/2002 | Sweatt et al. | |
| 2002/0135876 A1 | 9/2002 | Holm et al. | |
| 2004/0165637 A1 | 8/2004 | Bullington et al. | |
| 2006/0001969 A1 | 1/2006 | Wang et al. | |
| 2009/0041971 A1 | 2/2009 | Wang et al. | |
| 2009/0086785 A1 | 4/2009 | Hatori et al. | |
| 2010/0065862 A1* | 3/2010 | Ray | B82Y 20/00 257/88 |
| 2010/0065863 A1* | 3/2010 | Ray | B82Y 20/00 257/88 |
| 2010/0068838 A1* | 3/2010 | Ray | B82Y 20/00 438/29 |
| 2010/0068839 A1* | 3/2010 | Ray | B82Y 20/00 438/29 |
| 2010/0167441 A1 | 7/2010 | Ray et al. | |
| 2011/0271210 A1 | 11/2011 | Jones et al. | |
| 2012/0064303 A1 | 3/2012 | Yashiki et al. | |
| 2013/0098437 A1 | 4/2013 | Thony et al. | |
| 2013/0134438 A1* | 5/2013 | Ray | B82Y 20/00 257/76 |
| 2013/0146905 A1 | 6/2013 | Ray et al. | |
| 2013/0267052 A1* | 10/2013 | Hatori | B82Y 20/00 438/32 |
| 2015/0063753 A1* | 3/2015 | Evans | G02B 6/136 385/37 |
| 2015/0086163 A1* | 3/2015 | Valera | G02B 6/0035 385/37 |
| 2016/0126417 A1 | 5/2016 | Ray et al. | |
| 2017/0237226 A1* | 8/2017 | Johnson | H01S 5/0265 385/2 |
| 2019/0353846 A1* | 11/2019 | Evans | G02B 6/34 |
| 2019/0353847 A1* | 11/2019 | Evans | G02B 6/132 |
| 2019/0369309 A1* | 12/2019 | Jacob | G02B 5/1847 |

\* cited by examiner

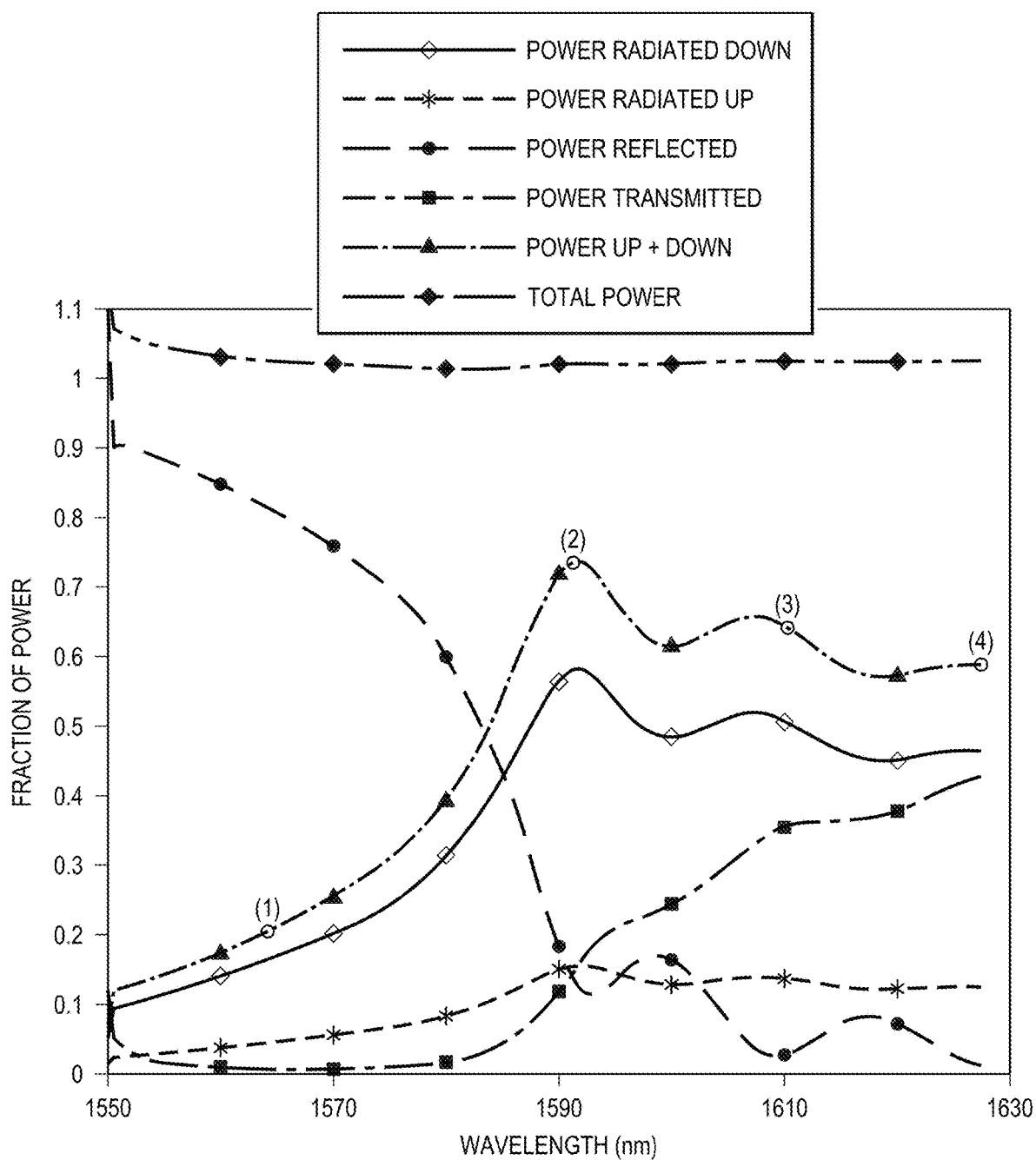

METHOD OF MAKING AN ENHANCED COUPLING STRENGTH GRATING HAVING A COVER LAYER

CROSS-REFERENCE TO RELATED APPLICATIONS

This application is a divisional application of U.S. patent application Ser. No. 14/479,039 filed on Sep. 5, 2014, now U.S. Pat. No. 10,371,898, which claims priority based on U.S. provisional Application No. 61/874,162, filed Sep. 5, 2013. The contents of which is incorporated by reference in its entirety.

STATEMENT OF FEDERALLY FUNDED RESEARCH

This invention was made with Government support under Agreement No. HR0011-08-9-0001 awarded by DARPA. The Government has certain rights in the invention.

TECHNICAL FIELD OF THE INVENTION

The present invention relates in general to the field of electromagnetic radiation, and more particularly, to an apparatus and methods to enhance the coupling strength of electromagnetic radiation coupled by gratings in optical waveguides.

BACKGROUND OF THE INVENTION

Without limiting the scope of the invention, its background is described in connection with optical waveguides.

High index contrast silicon/silicon dioxide optical waveguides can radiate 60 to 100% of the light propagating in the waveguide from a grating etched into one surface of the waveguide in short distances—in about 10 to 20 microns (or about 20 to 40 grating periods). The period of these radiating gratings is typically at or near the second Bragg condition, meaning that the grating period is equal, or approximately equal to the wavelength of the radiated light propagating in the waveguide (or the free space wavelength $\lambda_o$ divided by the effective index). At or near the second Bragg condition, there can be a significant second-order Bragg in-plane reflection. This often undesired reflection could be eliminated by tilting the radiated light (e.g., with an appropriate choice of the grating period) sufficiently off of the axis normal to the laser surface, or by the addition of one or more additional slits (grating grooves or ridges) appropriately spaced away from the coupler grating. The additional slit(s) serve as a partially reflecting mirror and by destructive interference cancel the in-plane reflection.

However, generating light on a silicon wafer is problematic. There are numerous other semiconductors, often alloys of elements in columns III and V (III-V compounds—which include GaAs and InP alloys) and columns II and VI (II-VI compounds) of the periodic table that commonly generate light and from which semiconductor light-emitting diodes (LEDs) and semiconductor lasers are fabricated. Being able to couple light out of a short section of a waveguide formed in a compound semiconductor optical waveguide has several advantages including: 1) optimum coupling to single- and multi-mode optical fibers; 2) optimum coupling to silicon photonic waveguides; and 3) economic gains by reducing the real estate used by the grating coupler.

One example is taught in U.S. Pat. No. 7,006,732, issued to Gunn, III, et al., entitled, "Polarization splitting grating couplers." Briefly, this patent teaches a polarization splitting grating coupler (PSGC) that connects an optical signal from an optical element, such as a fiber, to an optoelectronic integrated circuit. The PSGC is said to separate a received optical signal into two orthogonal polarizations and to direct the two polarizations to separate waveguides on an integrated circuit.

Another example is taught in U.S. Pat. No. 7,068,887, also by Gunn, III, et al., entitled, "Polarization splitting grating couplers." Again, a polarization splitting grating coupler (PSGC) is said to connect to an optical signal from an optical element, such as a fiber, to an optoelectronic integrated circuit, and is capable of separating a received optical signal into two orthogonal polarizations, and directs the two polarizations to separate waveguides on an integrated circuit. The two separated polarizations can then be processed, as needed for a particular application by the integrated circuit. The PSGC can also operate in the reverse direction.

Another example is taught in U.S. Pat. No. 6,760,359, also by present inventor (Evans), and is entitled, "Grating-outcoupled surface-emitting lasers with flared gain regions." Briefly, a laser system is taught that includes a laser diode with an active region and reflectors at both ends. An outcoupling aperture is located between the reflectors to couple light out of the device through the surface. The gain region increases in width as it nears the outcoupling aperture.

High index contrast silicon/silicon dioxide optical waveguides can radiate 60 to 100% of the light propagating in the waveguide from a grating etched into one surface of the waveguide in short distances—in about 10 to 20 microns (or about 20 to 40 grating periods) at a wavelength of 1550 nm. The term "light" and "optical" refer to electromagnetic waves that extend to wavelengths shorter (ultraviolet) and longer (infrared) than light visible to the human eye. Presently semiconductor LEDs and lasers span the wavelength range from about 0.3 microns to many tens of microns.

Despite many advances in the field, a need remains to enhance coupling of electromagnetic radiation due to gratings.

SUMMARY OF THE INVENTION

The present invention describes devices and methods for enhancing the coupling strength of gratings formed in dielectric waveguides of all types, including optical waveguides formed in compound semiconductor waveguides and optical waveguides formed in glasses and used for fiber optics. Such Enhanced Coupling Strength (ECS) gratings in compound semiconductor waveguides can match the performance of gratings in high index contrast silicon/silicon dioxide optical waveguides. In particular, ECS gratings couple power in very short distances compared to common gratings in semiconductor waveguides.

The present invention applies to gratings in all dielectric waveguides for any region of the electromagnetic spectrum. Although the examples shown in this patent primarily relates to gratings used to couple light into or out of a waveguide (commonly referred to as gratings with periods that are at or near the $2^{nd}$ order), this invention applies to gratings of all orders. In particular this patent applies to gratings with periods that are at the first order. Such first order gratings are used for feedback in distributed feedback (DFB) lasers and as integrated mirror reflectors in distributed Bragg reflector (DBR) lasers.

The present invention applies to all wavelengths (including microwave and millimeter waves) of the electromagnetic spectrum that is guided by dielectric waveguides or waveguides that contain dielectrics. This invention also applies to making the gratings in high index contrast silicon/silicon dioxide waveguides more effective, too. In addition, this invention applies to gratings used for coupling light into and out of optical waveguides, to gratings used for reflecting light, to gratings used for transmitting light, and to gratings used for deflecting light. Being able to efficiently couple light out of (or into) a short section of a waveguide formed in a compound semiconductor optical waveguide has several advantages including: 1) optimum coupling to single- and multi-mode optical fibers; 2) optimum coupling to silicon photonic waveguides; and 3) economic gains by reducing the real estate used by the grating coupler. In the following discussion, for simplicity, calculations are made for waveguides with a one-dimensional cross section with TE polarized modes, although the results for TM polarized modes differ by very little. Further, the invention can be used to enhance the coupling strength of high-index contrast $Si/SiO_2$ gratings and applies equally to waveguides with two-dimensional cross sections. The waveguide grating couplers obey reciprocity and therefore can be used to couple light into or out of optical waveguides with equal efficiency. The described method of enhancing the coupling strength of gratings can also be used to reduce losses at discontinuities in optical waveguides.

In one embodiment, the present invention includes an enhanced coupling strength grating, comprising: a substrate (12); a core (14) disposed on the substrate (12); one or more ridges (16) and one or more grooves (17) formed on the core (14), wherein the one or more grooves (17) are adjacent to, or between the one or more ridges (16), wherein the ridges (16) and grooves (17) form a grating (19); a liner layer (18) disposed on at least a portion of a grating cycle; and a cover layer (20) disposed on the liner layer (18), wherein a first material selected for the core (14) and ridges (16) and a second material selected for the liner layer (18) are selected to provide a first difference in the index of refraction between the first and second material that is sufficient to provide a contrast therebetween. In one aspect, the liner layer (18) is disposed on at least one of: the bottom (28) of the groove (17); one or more sidewalls (22, 24) of the ridges (16); on the top (26) of the one or more ridges (16); two or more liner layers (18) in the groove (17); or on the sides of the ridges (16) that do not have a top (26). In another aspect, the liner layer (18) selected from one or more of the following optional configurations: (a) the liner layer (18) is not contiguous; (b) the liner layer (18) is disposed on a first sidewall (22), a second sidewall (24), or both the first and second sidewalls (22, 24) of the ridges (16); (c) the liner layer (18) is defined further as one or more liner layers (18) that are contiguous and that follow the contour of the ridges (16) and the grooves (17); (d) the liner layer (18) is not contiguous, wherein the liner layer (18) is defined further as being substantially parallel to a bottom of the one or more grooves (17), and the non-contiguous layers are separated by one or more cover layers (30); (e) the liner layer (18) is defined further as two or more liner layers (18) that are contiguous and that follow the contour of the ridges (16), and each of the two or more liner layers (18) are separated by one or more cover layers (20); (f) the liner layer (18) is disposed on one or more tops (26) of the ridges (16), one or more grooves (17) between the ridges (16), or both the top (26) of the ridges (16), and the grooves (17) between the ridges (16); (g) the liner layer (18) is disposed on a first sidewall (22), one or more tops (26) of the ridges (16), and one or more grooves (17) between the ridges (16), to provide an effective blazed grating; (h) the liner layer (18) is disposed on a first sidewall (22) and one or more tops (26) of the ridges (16); or (i) the liner layer (18) is disposed on one or more first sidewall (22) or second sidewall (24) of one or more waveguiding structures for grating coupling (inward or outward).

In another aspect, the liner layer (18) is disposed on a high index contrast $Si/SiO2$ waveguide to further enhance the performance of the grating. In another aspect, a third layer for the cover layer (20) is selected to provide a similar index contrast or second difference in the index of refraction between the cover layer (20) and the liner layer (18) as the contrast or first difference in the index of refraction provided between the core (14) and the liner layer (18). In another aspect, the liner layer (18) is selected from at least one of $SiO$, $SiO_2$, $MgF_2$, $Al_2O_3$, $HfO_2$, $Ta_2O_{4-5}$, $Sc_2O_3$, $ZrO_2$, $TiO_2$, $CaF_2$, $ThF_4$, $ZnS$, $ZnSe$, polymers, and silicon nitride. In another aspect, the liner layer (18) comprises a variable thickness to provide at least one of varying the strength of the coupling, an effective variable duty cycle, an effective variable grating depth, a Gaussian profile in a radiating coupler grating, or a near-Gaussian profile in a radiating coupler grating. In another aspect, the liner layer (18) is selected to provide at least one of an optical loss or an optical gain.

In another aspect, the optical waveguide is at least one of a distributed Bragg reflectors (DBRs) or a distributed Bragg deflectors (DBDs). In another aspect, the optical waveguide is defined further as comprising at least two ECS gratings to make an edge-emitting DBR laser; one ECS grating and one regular DBR grating to make an edge-emitting DBR laser; two ECS gratings with a straight ECS outcoupler grating to make a surface-emitting laser; ECS grating and one regular DBR grating with a straight ECS outcoupler grating to make a surface-emitting laser; two ECS gratings with a "fan-out" ECS outcoupler grating to make a surface-emitting laser; one ECS grating and one regular DBR grating with a "fan-out" ECS outcoupler grating to make a surface-emitting laser; two ECS gratings with a standard grating outcoupler grating to make a surface-emitting laser; or one ECS grating and one regular DBR grating with a standard grating outcoupler grating to make a surface-emitting laser; one or more ECS grating output couplers with low back reflection on both ends to make a surface-normal coupled semiconductor optical amplifier (SOA) or optical gain block; or one or more ECS gratings or regular DBR gratings configures as a mirror with high reflectivity and another ECS grating as an output coupler to make a surface-emitting reflective semiconductor optical amplifier (RSOA) or an optical gain block; a hybrid external cavity laser and tunable laser using SOA or RSOA with ECS grating output couplers integrated with a waveguide or free space wavelength control optics; or an enhanced grating for high density and low loss integration of III/V laser sources for silicon photonic interconnects.

In another aspect, the optical waveguide is an enhanced grating on mesas with gratings etched into the sides of the mesas; an enhanced grating for grating-assisted directional couplers; enhanced grating for multiple resonant distributed feedback lasers; or an enhanced grating for multiplying resonant distributed Bragg reflector lasers; an enhanced coupling strength (ECS) grating in optical fibers for sampling or detecting light in optical fibers by grating outcouplers; an enhanced grating in optical fibers for (1) sampling or detecting light in optical fibers by ECS grating outcouplers operating near the second order Bragg condition; (2) sampling or detecting light in optical fibers by ECS grating outcouplers operating as distributed Bragg deflectors; (3) to couple light into optical fibers; a curved, enhanced grating to make unstable resonator semiconductor lasers; an enhanced grating to reduce the etch depth for the placement of distributed Bragg reflector gratings in semiconductor lasers, which results in simplified processing for DBR lasers; an enhanced grating to reduce the etch depth for the placement of distributed Bragg reflector gratings in photonic devices, which results in simplified processing for photonic devices; and enhanced gratings to reduce the etch depth for the placement of gratings in photonic devices, which results in simplified processing for photonic devices; or an enhanced grating to reduce the etch depth for the placement of coupling gratings in photonic devices, which results in simplified processing for photonic devices. In another aspect, the grating (19) comprise a period that is equal to about the wavelength of the light propagating in the optical waveguide to produce an outcoupling in about 10 to 50 grating cycles. In another aspect, the grating (19) comprise a period that is equal to about one half the wavelength of the light propagating in the optical waveguide, resulting in an in-plane reflectivity of up to about 100% in about 5 to 50 grating cycles for light in a typical III-V waveguide.

In another aspect, the cover layer (20) is defined further as an amorphous or crystalline cover layer selected from at least one of Si, GaAs, AlGaAs, InP, InGaAsP, GaN, AlGaN, InGaAsPSb, GaP, spin polymers, other column IV, column III-V, or column II-VI semiconductors. In another aspect, the cover layer (20) is defined further as an amorphous or crystalline high index layer or an amorphous or crystalline low index cover layer and the cover layer (20) is deposited or formed by at least one of sputtering, vapor phase deposition, plasma enhanced chemical vapor deposition, vapor phase epitaxy, molecular beam deposition, molecular beam epitaxy, spin-on, or atomic layer deposition or epitaxial growth over dielectrics through openings in the dielectric to exposed epitaxial material. In another aspect, the cover layer (20) is defined further as an amorphous low index cover layer selected from at least one of silicon nitride, polymer, SiO, $SiO_2$, $MgF_2$, $Al_2O_3$, $HfO_2$, $Ta_2O_{4-5}$, $Sc_2O_3$, $ZrO_2$, $TiO_2$, $CaF_2$, $ThF_4$, ZnS, ZnSe, and other dielectrics. In another aspect, the cover layer (20) is defined further as an amorphous low index cover layer deposited by at least one of sputtering, vapor phase deposition, plasma enhanced chemical vapor deposition, vapor phase epitaxy, molecular beam deposition, molecular beam epitaxy, atomic layer deposition, or by a spin-on processes. In another aspect, the cover layer (20) converts a grating from a grating region that does not support a bound-mode to a grating region that does support a bound-mode. In another aspect, the optical waveguide is defined further as comprising a non-grating transition waveguide, wherein the non-grating transition waveguide comprises a high index cover layer or a low index cover layer that converts a high loss discontinuity between the waveguide and the transition waveguide to a low loss discontinuity, and may optionally further comprise a second contrasting cover layer. In another aspect, the cover layer (20) when applied over a liner layer converts a grating from a grating region that does not support a bound-mode to a grating region that does support a bound-mode. In another aspect, the ridges (16) of the grating (19) extend above the core layer (14). In another aspect, the thickness of each of the core layer (14), grating (19) liner layer (18), and cover layer (20) are varied to optimize the ratio of upward coupled radiation to downward coupled radiation or in the upwards or downwards direction. In another aspect, a period is selected that couples radiation at an angle sufficiently tilted from a surface-normal to reduce or eliminate second-order in-plane Bragg reflection. In another aspect, the optical waveguide further comprises one or more additional grooves (17) or ridges (16) each with enhanced coupling strength gratings to provide a partially reflecting mirror that reduces or cancels a second-order in-plane Bragg reflection by destructive interference. In another aspect, the optical waveguide further comprises one or more additional grooves (17) or ridges (16) to provide a partially reflecting mirror that reduces or cancels a second-order in-plane Bragg reflection by destructive interference. In another aspect, the optical waveguide further comprises one or more additional grooves (17) or ridges (16) that are not covered by at least one of the liner layer (18) or cover layer (20) to provide a partially reflecting mirror that reduces or cancels a second-order in-plane Bragg reflection by destructive interference. In another aspect, the optical waveguide further comprises one or more additional grating ridges that are not covered by at least one of a liner layer or a cover layer.

In another aspect, the index of refraction of the liner layer (18) is the range of ~1.3 to ~1.7, 1.7 to ~2.2, ~2.2 to ~3, or 3 to ~3.8. In another aspect, the cover layer (20) is at least one of amorphous or crystalline silicon and is defined further as a high index cover layer that is compatible with silicon processing. In another aspect, the grating period of the ridges (19) is adapted for use with wavelengths in the range of 0.1 to 0.4, 0.4 to 1.0, 0.5 to 1.1, 0.6 to 1.1, and greater than 1.1. In another aspect, the selection of the materials for the ridges (16) is adapted for use with wavelengths in the range of 0.1 to 0.4, 0.4 to 1.0, 0.5 to 1.1, 0.6 to 1.1, and greater than 1.1. In another aspect, the core (14) and the ridges (16) are unitary. In another aspect, the grating forms at least a portion of an optical waveguide.

In another embodiment, the present invention includes a method of making a grating comprising: depositing on a first portion of substrate (12), a core (14) on the substrate (12), a superstrate (42) on the core (14), and a photoresist (44) on the superstrate (42); etching the superstrate (42) to (or into) the core (14); etching through a grating mask (48) formed on the core (14) to form the grating (48); removing the grating mask depositing a liner layer (50) on the grating 48, wherein a first material is selected for the core (14) and ridges (16) and a second material selected for the liner layer (50), wherein the first and second materials are selected to provide a first difference in the index of refraction sufficient to provide a contrast therebetween; and depositing a cover layer (52) on the liner layer (50). In one aspect, the grating (48) comprises at least a portion of a waveguide (40). In another aspect, the grating (48) is defined further as comprising on at least one of: a bottom (28) of a groove (17); one or more sidewalls (22, 24) of one or more ridges (16); a top (26) on the one or more ridges (16); two or more liner layers (18) in the groove (17); or one or more sidewalls (22, 24) on the one or more ridges (16) that do not have a top (26). In another aspect, the liner layer (18) selected from one or more of the following optional configurations: (a) the liner layer (18) is not contiguous; (b) the liner layer (18) is disposed on a first sidewall (22), a second sidewall (24) or both the first and second sidewalls (22, 24) of the ridges (16); (c) the liner layer (18) is defined further as one or more liner layers (18) that are contiguous and that follow the contour of the ridges (16) and the grooves (17); (d) the liner layer (18) is not contiguous, wherein the liner layer (18) is defined further as being substantially parallel to a bottom of the one or more grooves (17), and the non-contiguous layers are separated by one or more cover layers (30); (e) the liner layer (18) is defined further as two or more liner layers (18) that are contiguous and that follow the contour of the ridges (16), and each of the two or more liner layers (18) are separated by one or more cover layers (20); (f) the liner layer (18) is disposed on one or more tops (26) of the ridges (16), one or more grooves (17) between the ridges (16), or both the top (26) of the ridges (16), and the grooves (17) between the ridges (16); (g) the liner layer (18) is disposed on a first sidewall (22), one or more tops (26) of the ridges (16), and one or more grooves (17) between the ridges (16), to provide an effective blazed grating; (h) the liner layer (18) is disposed on a first sidewall (22) and one or more tops (26) of the ridges (16); or (i) the liner layer (18) is disposed on one or more first sidewall (22) or second sidewall (24) of one or more waveguiding structures for grating coupling (inward or outward).

In another aspect, the liner layer (50) is disposed on a high index contrast Si/SiO2 waveguide to further enhance the performance of the grating. In another aspect, a third material for the cover layer (20) is selected to provide a similar index contrast or second difference in the index of refraction between the cover layer (20) and the liner layer (18) as the contrast or first difference in the index of refraction provided between the core (14) and the liner layer (18). In another aspect, the liner layer (50) is selected from at least one of SiO, $SiO_2$, $MgF_2$, $Al_2O_3$, $HfO_2$, $Ta_2O_{4-5}$, $Sc_2O_3$, $ZrO_2$, $TiO_2$, $CaF_2$, $ThF_4$, ZnS, ZnSe, polymers, and silicon nitride. In another aspect, the liner layer (50) comprises a variable thickness to provide at least one of varying the strength of the coupling, an effective variable duty cycle, an effective variable grating depth, a Gaussian profile in a radiating coupler grating, or a near-Gaussian profile in a radiating coupler grating. In another aspect, the optical waveguide is at least one of a distributed Bragg reflectors (DBRs) or a distributed Bragg deflectors (DBDs). In another aspect, the optical waveguide is defined further as comprising at least two ECS gratings to make an edge-emitting DBR laser; one ECS grating and one regular DBR grating to make an edge-emitting DBR laser; two ECS gratings with a straight ECS outcoupler grating to make a surface-emitting laser; ECS grating and one regular DBR grating with a straight ECS outcoupler grating to make a surface-emitting laser; two ECS gratings with a "fan-out" ECS outcoupler grating to make a surface-emitting laser; one ECS grating and one regular DBR grating with a "fan-out" ECS outcoupler grating to make a surface-emitting laser; two ECS gratings with a standard grating outcoupler grating to make a surface-emitting laser; or one ECS grating and one regular DBR grating with a standard grating outcoupler grating to make a surface-emitting laser; one or more ECS grating output couplers with low back reflection on both ends to make a surface-normal coupled semiconductor optical amplifier (SOA) or optical gain block; or one or more ECS gratings or regular DBR gratings configured as a mirror with high reflectivity and another ECS grating as an output coupler to make a surface-emitting reflective semiconductor optical amplifier (RSOA) or an optical gain block; a hybrid external cavity laser and tunable laser using SOA or RSOA with ECS grating output couplers integrated with a waveguide or free space wavelength control optics; or an enhanced grating for high density and low loss integration of III/V laser sources for silicon photonic interconnects.

In another aspect, the optical waveguide is formed into at least one of an enhanced grating on a mesa waveguide with gratings etched into the sides of the mesa; an enhanced grating for grating-assisted directional couplers; an enhanced grating for multiple resonant distributed feedback lasers; or an enhanced grating for multiplying resonant distributed Bragg reflector lasers; an enhanced grating in optical fibers for sampling or detecting light in optical fibers by grating outcouplers; an enhanced gratings in optical fibers for (1) sampling or detecting light in optical fibers by grating outcouplers operating near the second order Bragg condition; (2) sampling or detecting light in optical fibers by grating outcouplers operating as distributed Bragg deflectors; (3) to couple light into optical fibers; a curved, enhanced gratings to make unstable resonator semiconductor lasers; an enhanced grating to reduce the etch depth for the placement of distributed Bragg reflector gratings in semiconductor lasers, which results in simplified processing for DBR lasers; an enhanced grating to reduce the etch depth for the placement of distributed Bragg reflector gratings in photonic devices, which results in simplified processing for photonic devices; and enhanced grating to reduce the etch depth for the placement of gratings in photonic devices, which results in simplified processing for photonic devices; or an enhanced grating to reduce the etch depth for the placement of coupling gratings in photonic devices, which results in simplified processing for photonic devices. In another aspect, the grating (19) comprise a period that is equal to about the wavelength of the light propagating in the optical waveguide to produce an outcoupling in about 10 to 50 grating cycles. In another aspect, the grating (19) comprise a period that is equal to about one half the wavelength of the light propagating in the optical waveguide, and up to about 100% in-plane reflectivity occurs in about 5 to 50 grating cycles for light in a typical III-V waveguide. In another aspect, the cover layer (52) is defined further as an amorphous or crystalline cover layer selected from at least one of Si, GaAs, AlGaAs, InP, InGaAsP, GaN, AlGaN, InGaAsPSb, GaP, other column IV, column III-V, column II-VI semiconductors, SiO, $SiO_2$, $MgF_2$, $Al_2O_3$, $HfO_2$, $Ta_2O_{4-5}$, $Sc_2O_3$, $ZrO_2$, $TiO_2$, $CaF_2$, $ThF_4$, ZnS, ZnSe, polymers, and silicon nitride. In another aspect, the cover layer (52) is defined further as an amorphous or crystalline high index layer or an amorphous or crystalline low index cover layer and the cover layer (52) is deposited or formed by at least one of sputtering, vapor phase deposition, plasma enhanced chemical vapor deposition, vapor phase epitaxy, molecular beam deposition, molecular beam epitaxy, spin-on process, or atomic layer deposition or epitaxial growth over the liner layer through openings in the liner layer to exposed epitaxial material. In another aspect, the cover layer (52) is defined further as an amorphous low index cover layer deposited by at least one of sputtering, vapor phase deposition, plasma enhanced chemical vapor deposition, vapor phase epitaxy, molecular beam deposition, molecular beam epitaxy, atomic layer deposition, or by a spin-on processes. In another aspect, the cover layer (52) converts a grating from a grating region that does not support a bound-mode to a grating region that does support a bound-mode. In another aspect, the optical waveguide is defined further as comprising a non-grating transition waveguide, wherein the non-grating transition waveguide comprises: (a) a high index cover layer or a low index cover layer that converts a high loss discontinuity between the waveguide and the transition waveguide to a low loss discontinuity, (b) a high index cover layer or a low index cover layer that converts a high loss discontinuity between the waveguide and the transition waveguide to a low loss discontinuity and may optionally further comprise a second contrasting cover layer; or (c) a tapered waveguide; or (d) an inverse-tapered waveguide. In another aspect, the ridges (16) of the grating (19) extend above the core layer (14). In another aspect, the thickness of each of the core layer (14), grating (19) liner layer (18), and cover layer (20) are varied to optimize the ratio of upward coupled radiation to downward coupled radiation or in the upwards or downwards direction. In another aspect, a period is selected that couples radiation at an angle sufficiently tilted from a surface-normal to reduce or eliminate second-order in-plane Bragg reflection. In another aspect, the optical waveguide further comprises one or more additional grooves (17) or ridges (16) each with enhanced coupling strength gratings to provide a partially reflecting mirror that reduces or cancels a second-order in-plane Bragg reflection by destructive interference. In another aspect, the optical waveguide further comprises one or more additional grooves (17) or ridges (16) to provide a partially reflecting mirror that reduces or cancels a second-order in-plane Bragg reflection by destructive interference. In another aspect, the optical waveguide further comprises one or more additional grooves (17) or ridges (16) that are not covered by at least one of the liner layer (18) or cover layer (20) to provide a partially reflecting mirror that reduces or cancels a second-order in-plane Bragg reflection by destructive interference.

In another aspect, the optical waveguide further comprises one or more additional grating ridges or teeth that are not covered by a cover layer. In another aspect, the index of refraction of the liner layer (50) is the range of ~1.3 to ~1.7, 1.7 to ~2.2, ~2.2 to ~3, or 3 to ~3.8. In another aspect, the cover layer (52) is at least one of amorphous or crystalline silicon and is defined further as a high index cover layer that is compatible with silicon processing. In another aspect, the grating period of the ridges (16) are adapted for use with wavelengths in the range of 0.1 to 0.4, 0.4 to 1.0, 0.5 to 1.1, 0.6 to 1.1, and greater than 1.1. In another aspect, the selection of the materials for the ridges (16) is adapted for use with wavelengths in the range of 0.1 to 0.4, 0.4 to 1.0, 0.5 to 1.1, 0.6 to 1.1, and greater than 1.1. In another aspect, the core (14) and the ridges (16) are unitary.

In another embodiment, the present invention includes an optical waveguide comprising: one or more cladding layers deposited on one or more core layers, wherein the cladding layers comprise a refractive index that is lower than the refractive index of the core layers, wherein the optical waveguide is further defined as comprising a gating etched into at least one of a cladding layer, the core, or the cladding and core layers. In one aspect, the refractive index of the cladding layers and core layers are ~1 to 2. In another aspect, the optical waveguide is further defined as comprising a grating etched into at least one of a cladding layer, the core, or the cladding and core layers. In another aspect, the optical waveguide is further defined as comprising a grating that has a liner layer disposed thereon and the liner layer has a cover layer, wherein the cover layer has at least one of a lower-index of refraction than the liner layer or a higher index of refraction than the liner layer. In another aspect, the optical waveguide is further defined as comprising a grating that has a cover layer disposed thereon and the index of refraction of the cover layer is ~1 to ~2, or ~2 to 4. In another aspect, the optical waveguide is further defined as comprising a grating with a period that is equal to about the wavelength of the light propagating in the waveguide to produce a coupling in 5 to 50 grating cycles. In another aspect, the optical waveguide is further defined as comprising a grating with a period that is equal to about the wavelength of the light propagating in the waveguide to produce a coupling in 5 to 50 microns for light in a typical III-V waveguide at a free space wavelength of about 1.5 or even 1.55 micron.

BRIEF DESCRIPTION OF THE DRAWINGS

For a more complete understanding of the features and advantages of the present invention, reference is now made to the detailed description of the invention along with the accompanying figures and in which:

FIG. 5 is a modified version of the DBR waveguide shown in FIG. 3 using the present invention.

FIG. 12A is an index profile of the ECS-grating coupler waveguide (FIG. 5) with a fixed core thickness of 0.2 microns, a variable thickness for the grating layer and a fixed thickness of 0.1 microns for the cover layer. FIG. 12B shows the grating confinement factor as a function of the thickness of the grating layer. FIG. 12C shows a field intensity plots for grating thicknesses ranging from 0.1 to 0.5 microns as shown in the figure legend.

FIG. 13A shows a sketch of a waveguide that includes a grating with liner and cover layers. FIG. 13B shows a grating confinement factor as a function of grating depth for core thicknesses varying from 0.1 to 0.4 microns as shown in the figure legend. FIG. 13C shows the field intensity plots for a fixed grating depth of 0.1 microns for core thicknesses varying from 0.1 to 0.4 microns as shown in the figure legend.

FIG. 7 is an ECS version of FIG. 1. In these examples all waveguides have the same core thicknesses (0.2 microns) and grating depths (0.1 microns). The ECS DBR waveguide and the ECS Si/SiO$_2$ waveguide each have a liner thickness of 5 nm. In the right two panels, a liner is depicted above the grating and core.

FIG. 18A shows grating ridges consisting of InP (index=3.16492), the layer below the grating is InGaAsP (index=3.35110), the liner layer is silicon dioxide (index=1.46) and the cover layer is amorphous silicon (index=3.476). FIG. 18B shows etching the grating further into the SCH layer requires adding a fourth "average relative permittivity" layer.

FIG. 19A shows plots of the field intensities and index profiles in the laser waveguide region (Section 1 of FIG. 17, □ index profile and □ field plot); in Section 2 of FIG. 17 with no liner or cover layer (× index profile and × field plot, 93% overlap); and in Section 2 of FIG. 17 with a liner layer and an amorphous Si cover layer (Δ index profile and Δ field plot, 99% overlap). FIG. 19B shows plots of the field intensities and index profiles in the laser waveguide region (Section 1 of FIG. 17, □ index profile and □ field plot); in Section 3 of FIG. 17 with no liner or cover layer (× index profile and × field plot, 73% overlap); and in Section 3 of FIG. 17 with only an amorphous Si cover layer (Δ index profile and Δ field plot, 93% overlap); and in Section 3 of FIG. 17 with a liner and amorphous Si cover layer (○ index and ○ field plot, 97% overlap). FIG. 19C shows plots of the field intensities and index profiles in the laser waveguide region (Section I of FIG. 17, □ index profile and □ field plot); and in Section 4 of FIG. 17 with a liner and cover layer (× index profile and × field plot, 94% overlap).

FIG. 21 shows the fraction of incident power radiated down (◇), fraction of incident power radiated up (*), fraction of incident power reflected backwards (•), fraction of incident power transmitted forward (■); fraction of incident power radiated both upwards and downwards (▲) and the sum of the fractions of incident power reflected, transmitted and radiated (♦) as a function of wavelength (assuming a fixed grating with a 50% duty cycle) for the waveguide shown in FIG. 19C and Table 4. The deviation of the total power plot (♦) from unity indicates that the maximum error of the Floquet Bloch analysis is about 10% at a wavelength of 1550 nm and drops to less than 3% for wavelengths greater than 1560 nm. The points (1), (2), (3) and (4) in FIG. 21 correspond to the same four points shown in FIG. 20. These calculations assumed a grating length of 19.5 microns and a grating period of 0.4882 microns. FIG. 22A shows the intensity distribution in the 5 QW grating waveguide region shown in FIG. 19C and Table 4 at point (1) in FIGS. 20 and 21, which is the peak of the attenuation curve and occurs at a wavelength of 1565 nm. At point (1) the total radiated power is ~20% and the total reflected power is ~80%, which illustrates that the wavelength of maximum attenuation is not the desired wavelength for maximum outcoupled radiation. FIG. 22B shows the intensity distribution in the 5 QW grating waveguide region shown in FIG. 19C and Table 4 at point (2) in FIGS. 20 and 21, which corresponds to the wavelength (1592 nm) at which the maximum total power is radiated (74%) and the reflected power is ~10%. FIG. 22C shows the intensity distribution in the 5 QW grating waveguide region shown in FIG. 19C and Table 4 at point (3) in FIGS. 20 and 21, which corresponds to the wavelength (1610 nm) at which the total power radiated is ~67% and the power reflected is low (~5%). FIG. 22D shows the intensity distribution in the 5 QW grating waveguide region shown in FIG. 19C and Table 4 at point (4) in FIGS. 20 and 21, which corresponds to the wavelength (1630 nm) at which the total power radiated is ~60% and the power reflected is very low (less than 1%). The white lines within the frame of the colored plots outline the ridges and grooves of the grating. For wavelengths sufficiently far away from a Bragg resonance, the intensity distribution within a grating cycle remains constant along the direction of propagation.

FIG. 31C shows that all the gratings (for example a short period grating and a long period grating) are formed at the same vertical level of the structure and that all gratings have the same depth, in general gratings can be formed at different levels and with different depths.

The following figures also show one possible sequence (out of numerous possible sequences) of how an ECS grating coupler could be fabricated.

Figure 32:
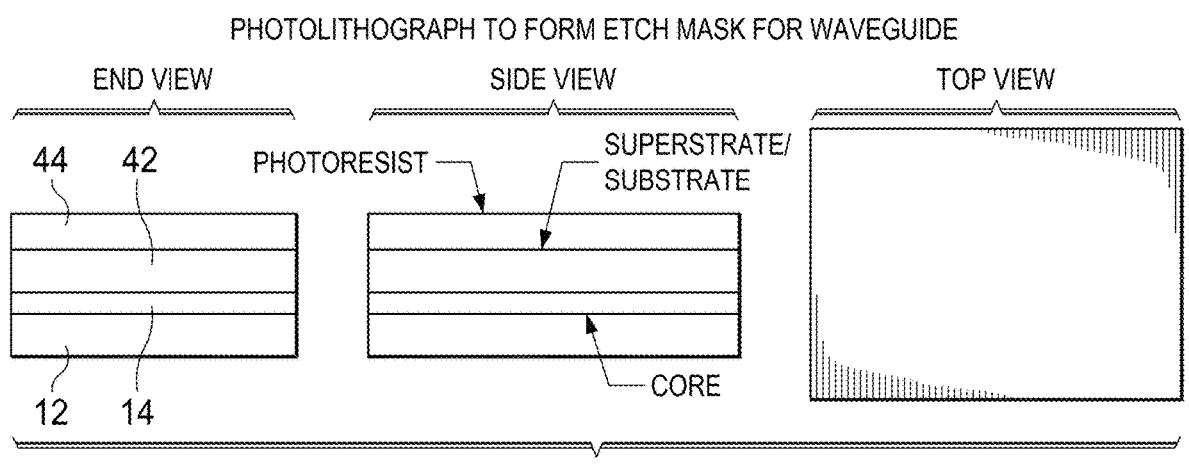

FIG. 32 shows the initial step in fabricating an ECS grating coupler requires covering the wafer containing the waveguide with photoresist. The left, middle and right view corresponds to the end, side and top view of a section of the wafer.

Figure 33:
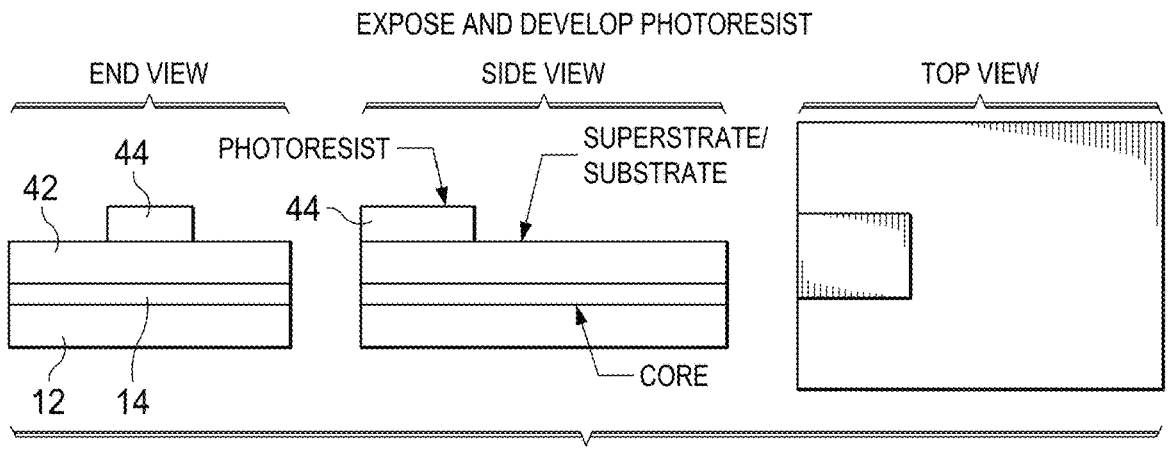

FIG. 33 shows the second step in fabricating an ECS grating coupler and shows the definition in photoresist of a mesa- or ridge-waveguide. The left, middle and right view corresponds to the end, side and top view of a section of the wafer.

Figure 34:
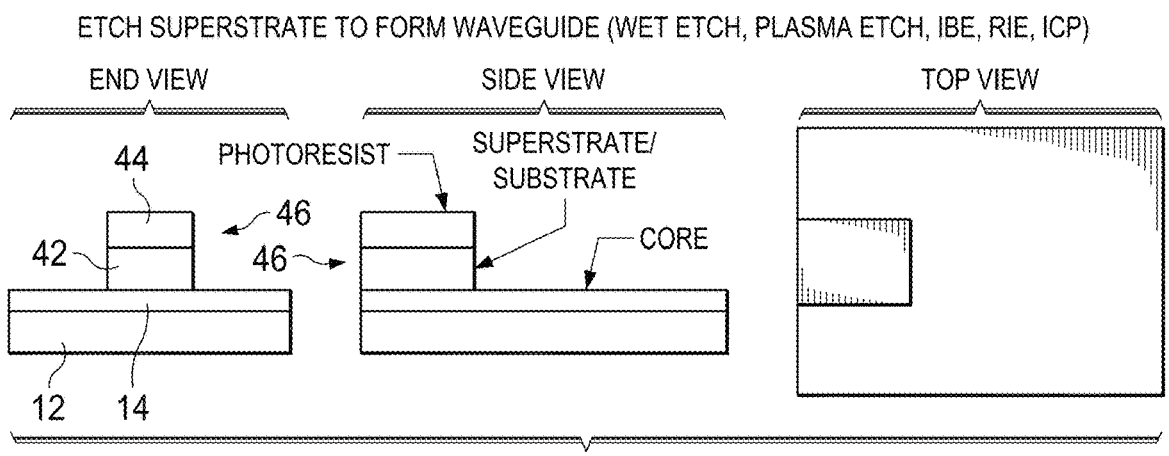

FIG. 34 shows the third step in fabricating an ECS grating coupler defines the mesa waveguide by etching away a section of the superstrate. The left, middle and right view corresponds to the end, side and top view of a section of the wafer.

Figure 35:
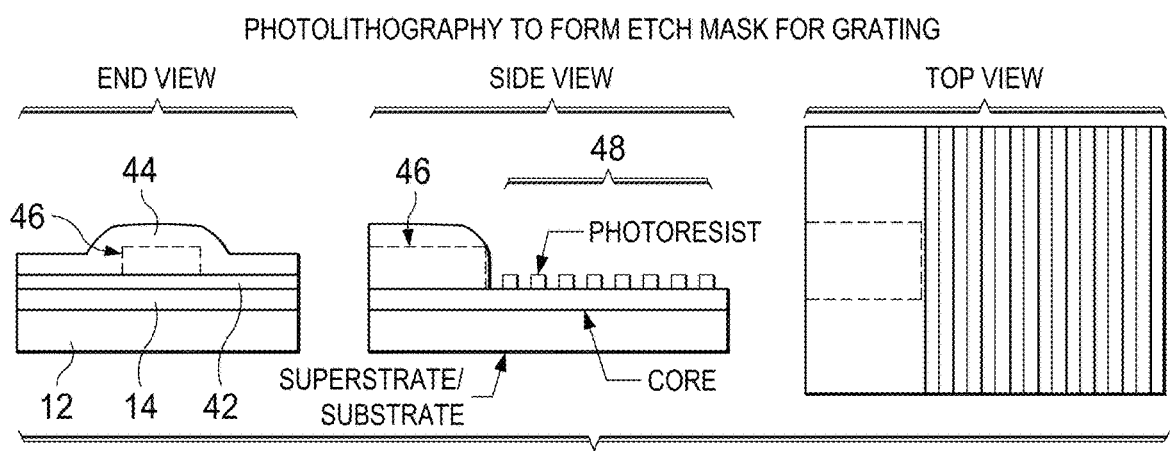

FIG. 35 shows the fourth step in fabricating an ECS grating coupler protects the mesa with photoresist and defines a grating in photoresist. The photoresist grating can be formed by several procedures such as holography, e-beam writing, or standard lithography. The left, middle and right view corresponds to the end, side and top view of a section of the wafer.

Figure 36:
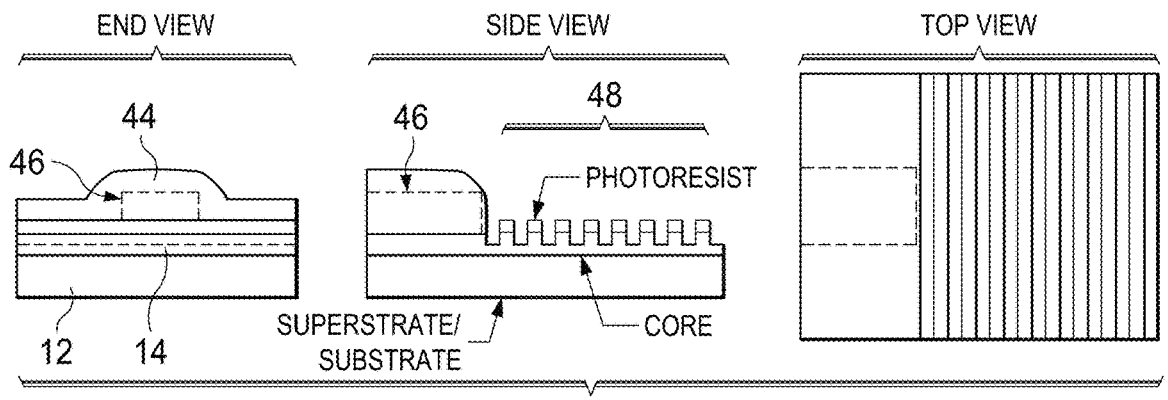

FIG. 36 shows the fifth step in fabricating an ECS grating coupler is replicating the photoresist grating into the waveguide by any of several etching procedures such as wet chemical etching, plasma etching, ion beam etching, reactive ion etching, chemically assisted ion beam etching or inductively coupled plasma etching. The left, middle and right view corresponds to the end, side and top view of a section of the wafer.

Figure 37:
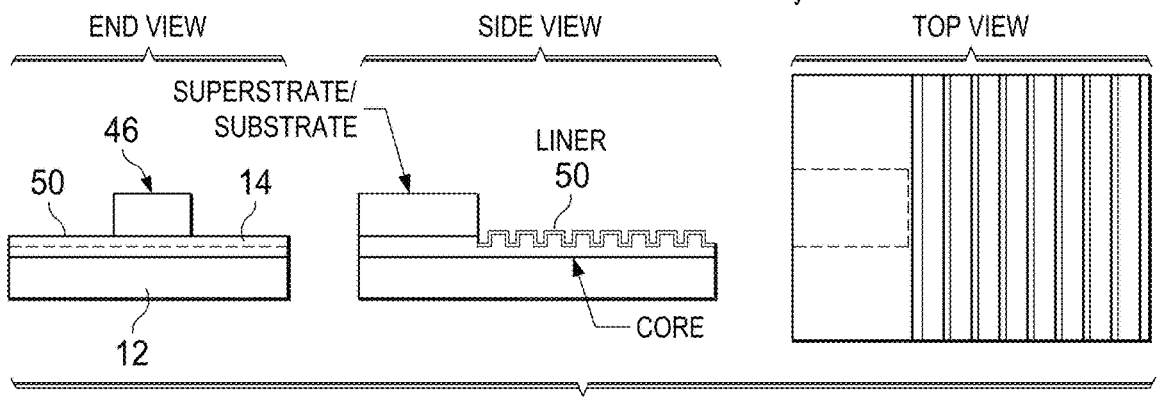

FIG. 37 shows the sixth step in fabricating an ECS grating coupler is depositing a liner material over the exposed grating. The left, middle and right view corresponds to the end, side and top view of a section of the wafer.

Figure 38:
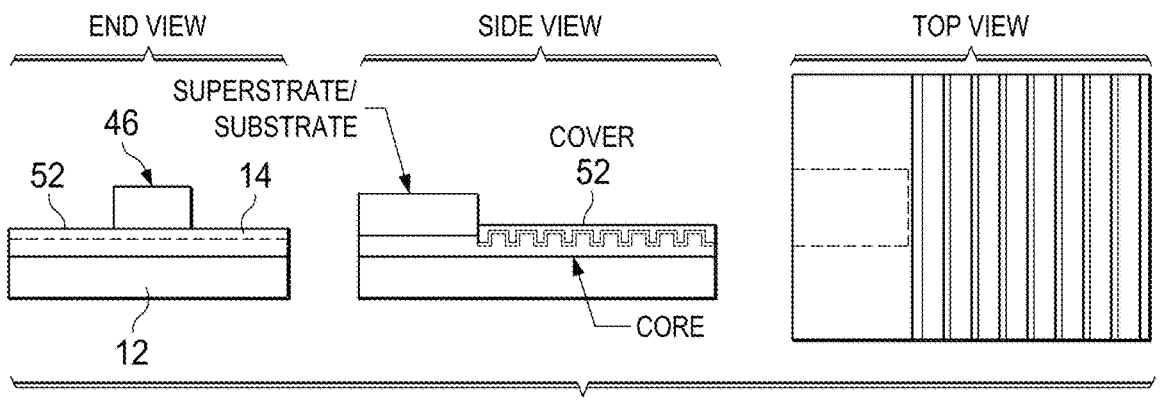

FIG. 38 shows the final step in fabricating an ECS grating coupler is the deposition of a cover layer over the liner material. The left, middle and right view corresponds to the end, side and top view of a section of the wafer.

DETAILED DESCRIPTION OF THE INVENTION

While the making and using of various embodiments of the present invention are discussed in detail below, it should be appreciated that the present invention provides many applicable inventive concepts that can be embodied in a wide variety of specific contexts. The specific embodiments discussed herein are merely illustrative of specific ways to make and use the invention and do not delimit the scope of the invention.

To facilitate the understanding of this invention, a number of terms are defined below. Terms defined herein have meanings as commonly understood by a person of ordinary skill in the areas relevant to the present invention. Terms such as "a", "an" and "the" are not intended to refer to only a singular entity, but include the general class of which a specific example may be used for illustration. The terminology herein is used to describe specific embodiments of the invention, but their usage does not delimit the invention, except as outlined in the claims.

The present invention includes an optical waveguide with a grating and a method of increasing the effectiveness of the grating. The optical waveguide includes at least one core layer surrounded by cladding layers with (at least slightly) lower indices of refraction. The cladding layers are sometimes referred to as a substrate layer and a superstrate layer. The present invention solves a number of problems in the art. First, a new class of optical waveguide grating couplers is formed in compound semiconductor materials including GaAs and InP alloys. In the present invention, the core layer(s) of most semiconductor materials have a relatively high index of refraction (2.5 to 4.0 or so) with one (see description of DBR structure, FIG. 3) or both (see description of DFB structure, FIG. 1) cladding layers having a slightly lower (difference in index can be 0.001 to 0.5, 0.01 to about 0.4, 0.1 to about 3.0, 0.001 to 0.3, 0.1, 0.2, 0.3, 0.4, 1.0, 1.5, 2.0, 2.5, 3.0) index. In this case a "low index liner layer" (over the grating formed in the high index (core or cladding) material) covered with a high index cover layer results in an enhanced grating.

The present invention solves the problem of the lack of availability of strong gratings in III-V semiconductor waveguides. The present invention also allows the making of strong gratings on low index glass waveguides. The present invention also allows for one or more liner layers and/or cover layers, or just cover layers, on the grating that reduce losses at waveguide transitions. Finally, the liner/cover layers of the present invention addressed the need to make a strong silicon photonics grating even stronger. Thus, in certain embodiments, a "high index liner layer" (over the grating formed in the low index (core or cladding) material) is covered with a low index cover layer that also results in an enhanced grating. In another embodiment, the present invention can use a low-index liner material and a high index cover layer material when the core and grating ridges are high-index. In another embodiment, the present invention can use a high index liner material and a low index cover material when the core and grating ridges are low index.

Figure 1:
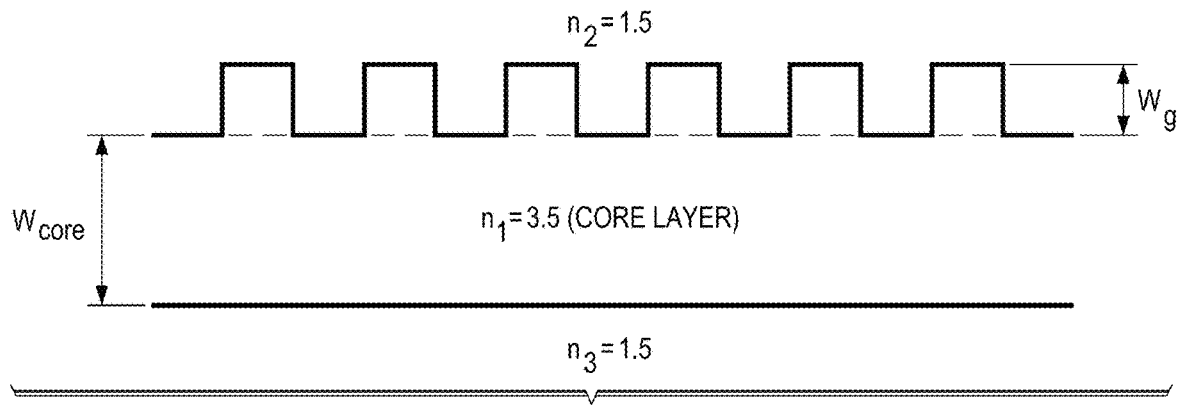
FIG. 1 shows a typical silicon photonics waveguide of the prior art.
Figure 2:
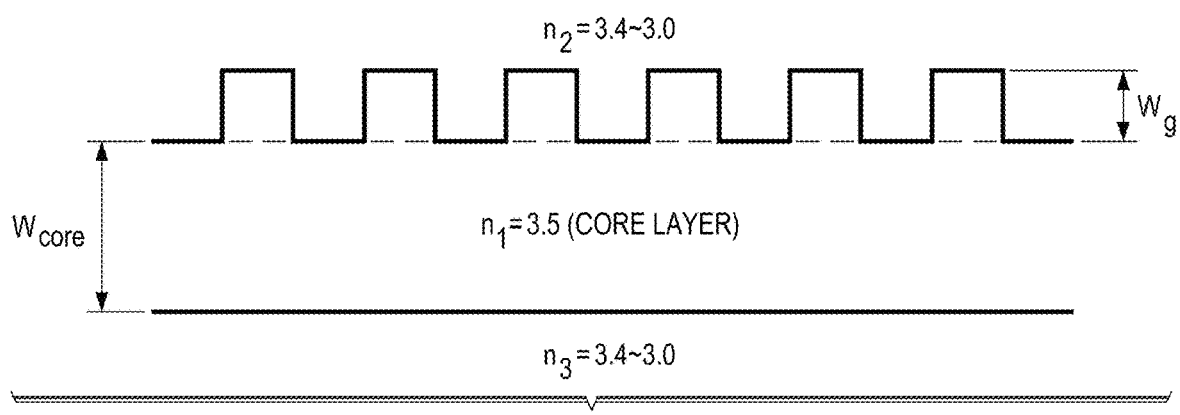
FIG. 2 shows a typical DFB waveguide of the prior art.
Figure 3:
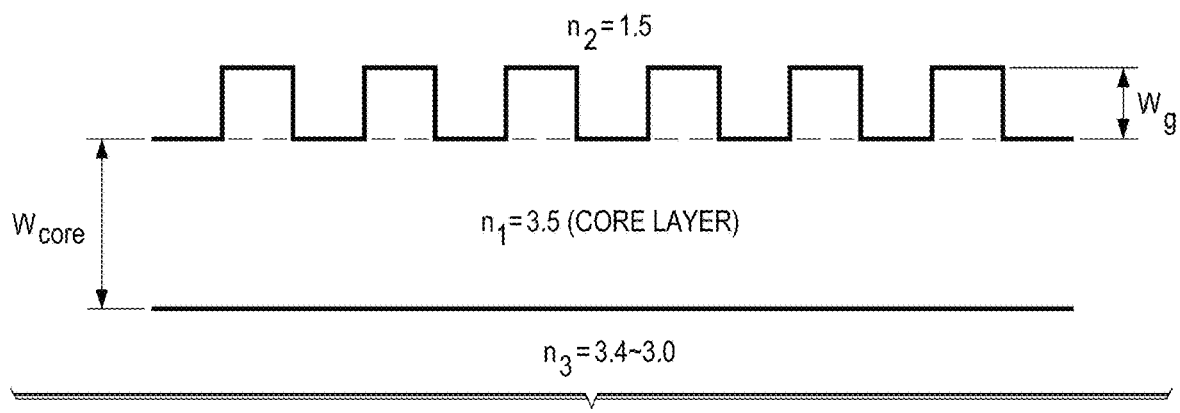
FIG. 3 shows a typical DBR waveguide of the prior art.

The present invention is based on the need to have a short, efficient grating (e.g., the high index contrast $Si/SiO_2$ waveguide grating of FIG. 1, which works with the low index contrast waveguides of FIGS. 2 and 3. In the present invention, the liner layer thickness is typically a very small fraction of a wavelength, e.g., 5 to 50 nm for an $SiO_2$ layer at a wavelength of 1550 nm. Generally, the cover layer is thicker and again depending on wavelength. The skilled artisan will recognize that a reduced index difference between the grating ridge and the liner material decreases the strength of the grating coupler. However, there are times when the user may not need or desire the maximum grating strength (or enhancement), so the choice of liner material and cover material allows for a range of grating performance. Because an immediate application of this invention is to the area of silicon photonics, the examples below will assume a wavelength of 1550 nm. However the invention is applicable to all wavelengths in the electromagnetic spectrum.

As used herein, the term "contrasting layer" or "contrasting" when referring to the difference between the core layer, grating ridge, liner layer and/or the cover layer describes the use of layers with different indices of refraction. The indices of all layer and the thicknesses of all layers determine the intensity distribution within all layers of the waveguide.

As used herein, the term "mesa" or "mesa waveguide" refers to a structure that provides lateral (two-dimensional) waveguide confinement in the direction perpendicular to the direction of light propagation in the waveguide. The term mesa waveguide is a broad term and as used herein includes any type of lateral optical confinement such as provided by a ridge-waveguide, a slab-waveguide, a buried-hetero-structure waveguide or a waveguide formed by disordering.

For high index core waveguides (such as III-V waveguides) amorphous and/or crystalline silicon can be used as the high index cover layer, and provides the advantage of being generally compatible with silicon processing. Generally, silicon only has low losses at wavelengths greater than about 1.1 microns, which is useful for silicon photonic applications. As taught hereinbelow, numerous compounds can be used at shorter wavelengths and longer wavelengths, e.g., when using semiconductor lasers that emit from about 0.4 to tens of microns. The present invention can also be used in common applications for gratings at wavelengths in the 0.6 to 1.1 micron (and greater) range. One material for use at wavelengths in the 0.5 to 1.1 micron range is GaP, which can be deposited, e.g., using standard sputtering systems. One advantage of GaP is that it has very low losses for wavelengths greater than 0.5 microns. Sputtering is a very common process and relatively inexpensive compared to molecular beam epitaxy (MBE) or metalorganic vapour phase epitaxy (MOVPE), which can also be used with the present invention. Commonly, crystalline and amorphous silicon are used in silicon photonics applications, which makes them useful as a cover layer for wavelengths greater than about 1.1 microns. In one example, GaP can be used as a cover layer for wavelengths greater than about 0.5 microns.

The present invention is different from a high index contrast $Si/SiO_2$ waveguide. In this case, the Si core has a high index (about 3.5), but both cladding layers are low index (about 1.5). A standard grating in such a Si photonics waveguide can be very efficient. However a grating in such a Si photonics waveguide can be made even more efficient using the present invention of applying a low index $SiO_2$ liner layer with a high index amorphous Si layer as shown in column 7 of Table 1.

As used herein, the term "Enhanced Coupling Strength" (ECS) Grating is used to describe ECS gratings that can be first order (in plane reflection only), $2^{nd}$ order (outcoupling and sometimes in plane reflection), or higher order (multiple outcoupling angles and in plane reflections). While certain embodiments of the present invention show calculations near the $2^{nd}$ order Bragg conditions, the "enhancement" works equally well for all grating orders.

For example, another class of optical waveguides of the present invention can be formed in low index glasses or polymers, such as those used to make optical fibers. The core layer(s) have a low index of refraction (1 to about 2) with cladding layers of slightly lower (difference in index of 0.001 to 0.5, 0.01 to about 0.4, 0.1 to about 1.0, 0.001 to 0.3, 0.1, 0.2, 0.3, 0.4, 1.0, or so) index.

The skilled artisan will recognize that during processing the index of refraction for a particular material at a particular location may vary slightly from calculated value, the present invention includes such variability. In this case variations in the indices of the liner and cover layers still result in an enhanced grating.

In one example, the present invention includes the development of, e.g., an InP based semiconductor laser (emitting at a wavelength ~1550 nm) integrated with an ECS grating coupler with a near-field spot size diameter of approximately 10 to 15 microns (in the direction along the waveguide). Such a grating coupler is needed because it matches the grating couplers fabricated in high index contrast silicon/silicon dioxide optical waveguides which can radiate 80 to 100% of the light propagating in the waveguide in such short distances—about 10 to 20 microns. However, previous to this invention, optical waveguides formed in compound semiconductor materials including GaAs and InP alloys require a grating that is hundreds or even thousands of microns long to radiate the same amount of light.

Silicon/silicon dioxide optical waveguides are fundamental to the developing field of Silicon Photonics. However, generating light on a silicon wafer is problematic. There are numerous other semiconductors, often alloys of elements in columns III and V (III-V compounds—which include GaAs and InP alloys) and columns II and VI (II-VI compounds) of the periodic table that commonly generate light and from which semiconductor light-emitting diodes (LEDs) and semiconductor lasers are fabricated. The various devices of the present invention are able to couple light out from the surface of a short section of a waveguide formed in a compound semiconductor optical waveguide. The resulting ECS grating has several advantages including: (1) optimum coupling to single- and multi-mode optical fibers; (2) optimum coupling to silicon photonic waveguides; and (3) economic gains by reducing the real estate used by the grating coupler.

Optical Waveguides with Gratings. FIG. 1 shows a high index contrast silicon/silicon dioxide photonic waveguide in which the thickness of the core layer $W_{core}$ may be on the order of 0.1 to 2 microns, the depth $W_g$ of the grating may be on the order of 10 to 80% of the total thickness of the combined core and grating layer, and the free-space wavelength $\lambda_o$ of radiation propagating in the waveguide may be about 1550 nm. The core layer may be crystalline silicon (n=3.476 at 1550 nm) with cladding layers of silicon dioxide (n=1.46 at 1550 nm) above and below the core. Solely for simplicity, various embodiment of the present invention disclosed herein as regards the index of refraction is shown to one decimal place. The skilled artisan will recognize that much higher specificity can be used as will be defined by the skilled artisan when implementing the present invention. In the example provided of an actual laser (Table 3) and grating (Table 4) structure, for example, the indices of refraction are given to 5 decimal places, which is the output of the software that calculates the indices.

There are two general types of gratings in semiconductor laser waveguides. Type 1 is where the layer over the grating has a relatively high index of refraction and would typically include an alloy of a III-V or II-VI compound. A device that commonly has this grating configuration is a distributed feedback laser. For convenience, this type of grating is described herein as a "distributed feedback" or DFB grating. The second type of grating found in semiconductor laser waveguides has a relatively low index of refraction over the grating layer. A device that commonly has this grating configuration is a distributed Bragg reflector (DBR) laser. For convenience, this type of grating is described herein as a DBR grating. FIGS. 2 and 3 illustrate a DFB grating and DBR grating configuration.

Practical semiconductor laser structures would have several layers in the central "core" region and have additional layers for electrical contacts. Nevertheless, FIGS. 2 and 3 illustrate the key concepts of DFB and DBR lasers and provide a point of comparison for the present invention. A DFB laser (FIG. 2) has a high index core region and a slightly lower index for both the substrate layer and the superstrate layer (sometimes referred to as cladding layers). A grating for in-plane feedback (of first, second or higher order) is shown fabricated at an interface between the core layer and the superstrate layer in FIG. 2. The difference in indices of refraction between the core layer and the superstrate layer is modest.

A DBR laser (FIG. 3) also has a high index core region, with a slightly lower index on the substrate side, but on the superstrate side of the core, the index of the material (which could be air) is low. In practice, a thin (~0.15 micron) layer of silicon dioxide or silicon nitride is often deposited over the grating (which is etched into the core layers in FIGS. 2 and 3) in a DBR structure.

By observing a formula for the coupling strength $k_{pq}$ between a forward propagating mode (mode p) and backward propagating mode (mode q) of a first-order grating formed in an optical waveguide, [1, 2, 3]:

$$\kappa_{pq} = C_{kn}^{(m)} = \frac{\omega \varepsilon_0}{4} b_m (n_1^2 - n_2^2) \cdot \int_{-a}^{0} E_p^*(x) E_q(x) dx \quad \text{Equation 1}$$

where the strength of the grating increases as the difference between the index of refraction of the core region ($n_1$) and the index of refraction of the layer directly above the grating ($n_2$) increases. This term, ($n_1^2 - n_2^2$), is the relative permittivity difference term (since the relative permittivity is equal to the square of the index of refraction: $\varepsilon_{rel} = n^2$). In addition, the effectiveness of the grating also increases as the intensity of the light residing in the grating layer increases, which is given by the integral term in Equation 1. This integral term is called herein the "grating confinement factor." The angular frequency of the radiation is $\omega$, and the permittivity of free space is $\varepsilon_0$, and $b_m$ is the Fourier coefficient corresponding to the first-order grating period of the grating profile.

Although Equation 1 applies to in-plane coupling and not directly to radiation coupled out of or into optical waveguides, increasing the relative permittivity difference (or index contrast) and grating confinement factor is equally important for gratings of all orders. The importance of high index contrast gratings has been recognized in numerous patents [See, e.g., U.S. Pat. Nos. 7,006,732 B2, and 7,068,887], and publications [references 4, 5, 6, 7, 8, 9, 10, 11, 12, 13, 14, 15, 16, 17].

Another way to view the importance of the relative permittivity difference and the magnitude of the electric field at the grating interface is seen in FIG. 4, which shows that a periodic sinusoidal boundary between two materials is equivalent to a straight boundary with a periodic surface current J(z) given by [18]:

$$J(z) = -i\varepsilon_o \omega \eta W(\varepsilon_1 - \varepsilon_2) \cos(Kz) E(W,z) \quad \text{Equation 2}$$

where i is the square root of −1, $\varepsilon_o$ is the permittivity of free space, $\omega$ is the radian frequency of the electromagnetic (optical) field, $\eta W$ is the amplitude of the periodic boundary, $\varepsilon_1$ is the relative permittivity of the material on the lower side of the grating, $\varepsilon_2$ is the relative permittivity of the material on the upper side of the grating, K ($K=2\pi/\Lambda$ where $\Lambda$ is the grating period) is the grating wavevector, z is the spatial coordinate aligned with the axis of the waveguide and is the direction of propagation of the electromagnetic (optical) mode, and E(W,z) is the value of the electric field at x−W (x is the spatial coordinate perpendicular to the z axis) for any value of z.

Figures 4A, 4B:
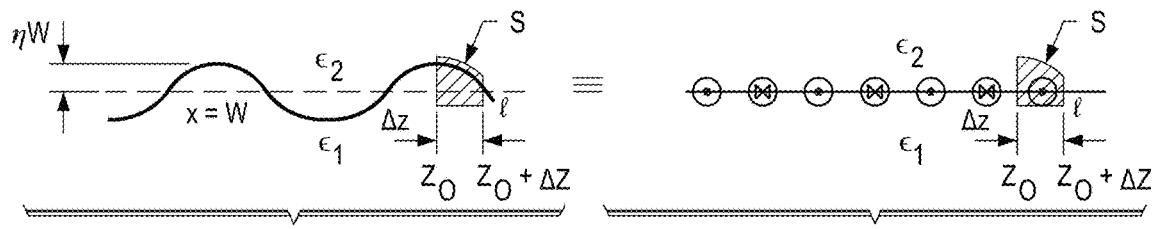
FIGS. 4A and 4B shows a periodic boundary (4A) is equivalent to a straight boundary (4B) with a periodic surface current $J(z)=-i\varepsilon_o\omega\eta W(\varepsilon_1-\varepsilon_2)\cos(Kz)E(W,z)$.

FIGS. 4A and 4B show a periodic boundary (FIG. 4A) is equivalent to a straight boundary (FIG. 4B) with a periodic surface current $J(z)=-i\varepsilon_o \omega \eta W(\varepsilon_1-\varepsilon_2)\cos(Kz)E(W,z)$. In the case of an optical waveguide, we can view the periodic surface current as being generated by a mode propagating in the positive z direction with a longitudinal propagation constant of $\beta_p$, being strongly phase-matched or coupled to another propagating or radiation mode (with a propagation constant $\beta_q$) of the waveguide by the grating vector K[18].

From Equations 1 and 2, we see that the conditions for a strong grating are: 1) a large relative permittivity difference between the materials on either side of the grating interface; and 2) a large grating confinement factor (or a large magnitude of the electric field at the grating interface). Grating confinement factors can be calculated by approximating the grating layer with an average relative permittivity [19,20, 21].

Such analysis shows that a silicon photonics waveguide has a very large index difference term and a very strong grating confinement term. A conventional DFB waveguide also has a very strong grating confinement term, but the relative permittivity difference term of a DFB waveguide is small—about an order of magnitude smaller than in a silicon photonics waveguide. A conventional DBR waveguide has a very large index difference term, but has a very small grating confinement factor term—almost an order of magnitude smaller than a silicon photonics waveguide. Typical values of the terms related to grating strength for a silicon waveguide, DFB waveguide and DBR waveguide are shown in the first three columns of Table 1. The 0.5 number in the first row of Table 1 indicates that the period of the grating is approximately equal to the wavelength (measured in the waveguide) of the light propagating in the waveguide. The second row indicates the thickness of the cover layer for the ESCG gratings. The third row indicates the difference between ($n_1-n_2$). The fourth row is the value of the relative permittivity difference ($\varepsilon_1-\varepsilon_2$) or ($n_1^2-n_2^2$). The fifth row is the grating confinement factor as a percentage of the power contained in the grating region to the total power in the waveguide. The sixth row is the value of the intensity of the light propagating in the waveguide at the interface between the core layer and the bottom of the grating layer. This value corresponds to x=W in FIG. 4. The seventh row in the table is the product of the two terms discussed above, the relative permittivity difference and the grating confinement factor that contribute to the grating strength. This product is defined as an approximate, first-order Figure of Merit (FOM) of the grating.

TABLE 1

Properties of different types of optical waveguides with grating couplers. The results from using the present invention are in the 4 right columns labeled ECSG (Enhanced Coupling Strength Grating), ECSG, ECSG and ECSG-Si.

|  | Si WG | DFB | DBR | ECSG | ECSG | ECSG | ECSG-SI |
|---|---|---|---|---|---|---|---|
| $\Lambda$ (um) | — | — | — | 0.5 | 0.5 | 0.5 | 0.5 |
| Cover layer (nm) | — | — | — | 25 | 10 | 5 | 5 |
| $\Delta n_{sub}$ | 2 | 0.3 | 0.3 | 0.3 | 0.3 | 0.3 | 2 |
| $n_1^2 - n_2^2$ | 10 | 2.01 | 10 | 10 | 10 | 10 | 10 |
| $\Gamma_{grating}$ | 15.3% | 15.8% | 2.5% | 11.1% | 17.1% | 19.3% | 30.1% |
| Max $\varepsilon|_b$ | 4.5 | 2 | 0.7 | 1.5 | 2.1 | 2.4 | 3.1 |
| FOM | 1.53 | 0.32 | 0.25 | 1.11 | 1.71 | 1.93 | 3.01 |

Based on Equation 1, increasing the coupling strength of a grating coupler requires both a large value of the relative permittivity difference $(n_1^2-n_2^2)$ and a large value of the grating confinement factor, which is the case with a silicon/silicon dioxide grating outcoupler. A DBR grating has a large value of the relative permittivity difference but a low value for the grating confinement factor, which is the opposite of a DFB grating outcoupler.

Figure 5:
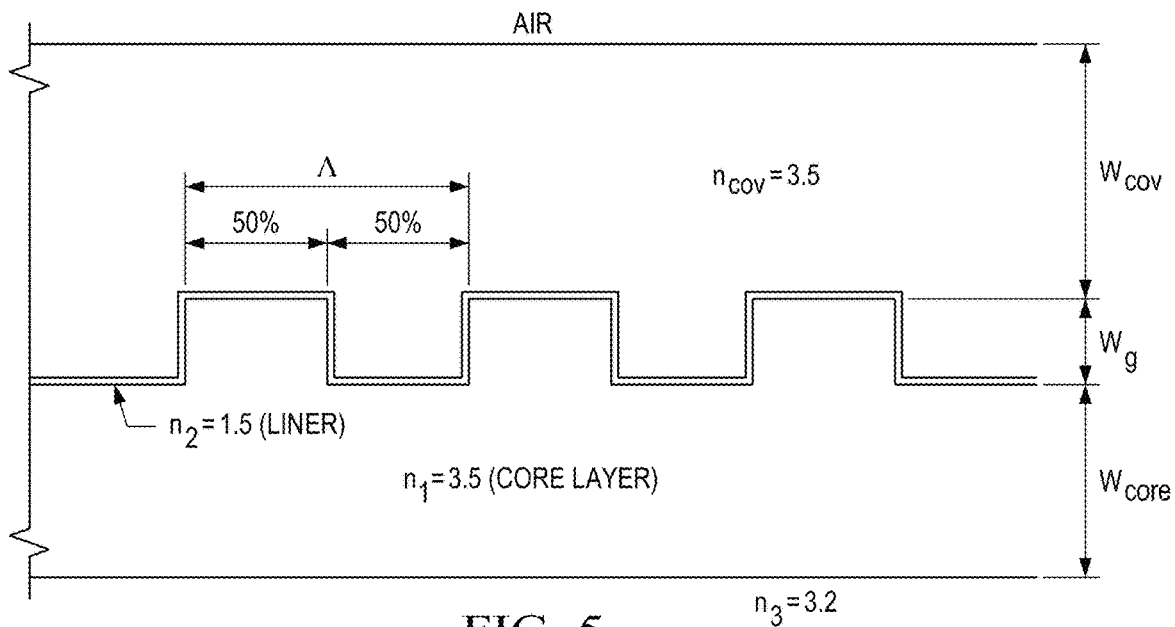
FIG. 5 shows a sketch of a waveguide that includes an Enhanced Coupling Strength grating with a thin, low-index liner and high index cover of the present invention.

A way to have a DFB or DBR grating in a compound semiconductor waveguide (such as shown in FIGS. 2 and 3) with both a high index difference and a high grating confinement factor is to insert a thin, low index "liner" layer over the high index ridges and grooves of the grating, followed by a thicker high index "cover layer" as shown in FIG. 5. Such a configuration is defined herein as an Enhanced Coupling Strength (ECS) grating.

The low index "liner" layer in this ECS grating example provides a large value for the $(n_1^2-n_2^2)$ term, while the high index "cover" layer results in a large grating confinement factor by increasing the intensity of the light in the grating layer. The low index "liner" layer material could be made from, e.g., silicon dioxide or silicon nitride, and the thickness could be in the range of a few nanometers to many tens or hundreds of nanometers. Typically the thickness of the low index liner layer will be a small fraction of the wavelength of the radiation propagating in the waveguide. Low index dielectric materials for a liner layer include, but are not limited to, SiO, $SiO_2$, $MgF_2$, $Al_2O_3$, $HfO_2$, $Ta_2O_{4-5}$, $Sc_2O_3$, $ZrO_2$, $TiO_2$, $CaF_2$, $ThF_4$, ZnS, ZnSe, silicon nitride, polymers such as siloxane polymers or others known to one knowledgeable in the art.

The high index cover layer in this ECS grating example need not be crystalline, but could be an amorphous layer of silicon (a-Si), or an amorphous III-V or II-VI layer.

Enhancement of Grating Coupling Strength in High Index Core Waveguides. As discussed above, the simple DFB and DBR gratings shown in FIGS. 2 and 3 can have both a high index difference and a high grating confinement factor if they are modified by inserting a thin, low index liner layer over the high index ridges and grooves of the grating, followed by a thicker high index cover layer as shown in FIG. 5. The low index "liner" layer provides a large value for the $(n_1^2-n_2^2)$ term, while the high index "cover layer" results in a large grating confinement factor by increasing the intensity of the light in the grating layer. The low index "liner" layer material could consist of silicon dioxide or silicon nitride and the thickness could be in the range of a few nanometers to many tens or hundreds of nanometers. Typically the thickness of the low index liner layer will be a small fraction of the wavelength of the radiation propagating in the waveguide. The high index cover layer need not be crystalline, but could be an amorphous layer of silicon (a-Si), or an amorphous III-V or II-VI layer, or any other material with a suitably high index and preferably, low or moderate optical losses. In addition, the liner layer or layers may be selected to provide an optical gain. The index of the cover layer can be somewhat lower, equal or somewhat higher than the index of the core layer, and is taken as 3.5 in FIG. 5 just to minimize the number of variables in the example. In general, for the DFB and DBR cases discussed so far, the index of the cover layer should be chosen to be higher than the "effective index" [1,2,3] of the waveguide, which insures that the solution to the wave equation in the cover layer has an oscillatory solution (and not a damped exponential solution) and will therefore increase the grating confinement factor.

For convenience, such a grating structure is described herein to have "liner" and "cover" layers and is called an Enhanced Coupling Strength grating, or ECS grating or "enhanced grating". Columns four (25 nm liner layer), five (10 nm liner layer) and six (5 nm liner layer) in Table 1 show that ECS gratings on the DBR structure in FIG. 5 can have grating strengths or crude FOMs that equal or exceed that of high index contrast silicon/silicon dioxide waveguides with gratings.

Enhancement of Grating Coupling Strength in Low-Index Core Waveguides. The discussion hereinabove has centered on optical waveguides with a high index core, corresponding to a core material made of a material such as a semiconductor. However, many optical waveguides, including both planar and circular fiber glass and polymer waveguides, have a low index core of about 1.5, surrounded by a slightly lower index cladding layer(s) (or substrate and superstrate layers) of about 1.4 or 1.48.

Equations 1 and 2 provided motivation for using a low-index liner layer between two high-index layers at a grating interface (see FIG. 5). The same concept applies to a high-index liner layer between two low-index layers at a grating interface (see FIG. 6).

Figure 6:
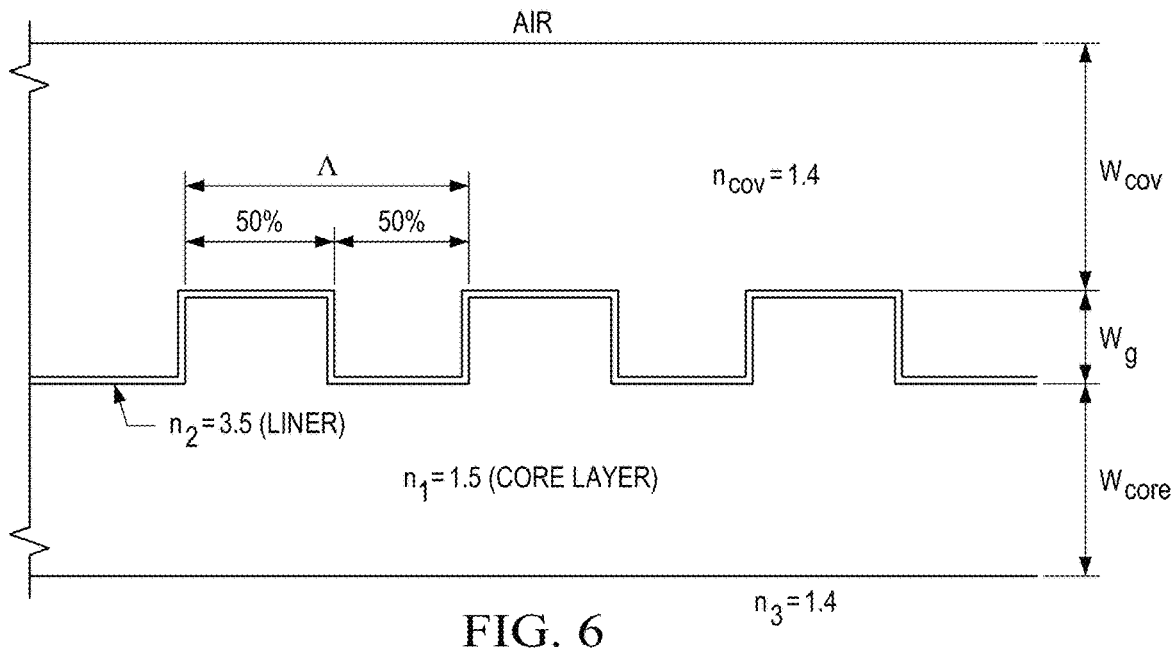
FIG. 6 shows a sketch of a waveguide that includes an Enhanced Coupling Strength grating with a fiber-like planar glass index waveguide, the liner layer index is large compared to the index of the core and cover layer indices.

FIG. 6 shows a low index core waveguide with a high index (n=3.5) liner and a low index cover layer. For this low index core waveguide, the index of the liner layer should generally be greater than the effective index of the waveguide structure (to insure an oscillatory solution to the wave equation in the liner layer), to provide both a large relative permittivity difference and an increased grating confinement factor.

The improvement in the grating strength of the present invention for such a low-index core waveguide is demonstrated by, e.g., the crude Figure of Merit (FOM) by using a high index liner in FIG. 6 (as summarized in Table 2), in which a lining thickness of 5 nm and 25 nm for a core thickness of 0.2 microns and a grating depth of 0.1 microns was analyzed. In this case, the approximate FOM increases with increasing liner thickness, in contrast to the cases summarized in Table 2.

TABLE 2

Properties of a glass optical waveguide (FIG. 6) with a high index liner layer.

|  | Glass WG (no layer) | Glass WG (5 nm layer) | Glass WG (25 nm layer) |
|---|---|---|---|
| $\Lambda$ (um) | — | 1 | 1 |
| $\Delta n_{sub}$ | 0.1 | 0.1 | 0.1 |
| $|n_1^2 - n_2^2|$ | 0.29 | 10 | 10 |
| $\Gamma_{grating}$ | 4.92% | 0.66% | 21.1% |
| FOM | 0.014 | 0.066 | 2.11 |

Figure 7:
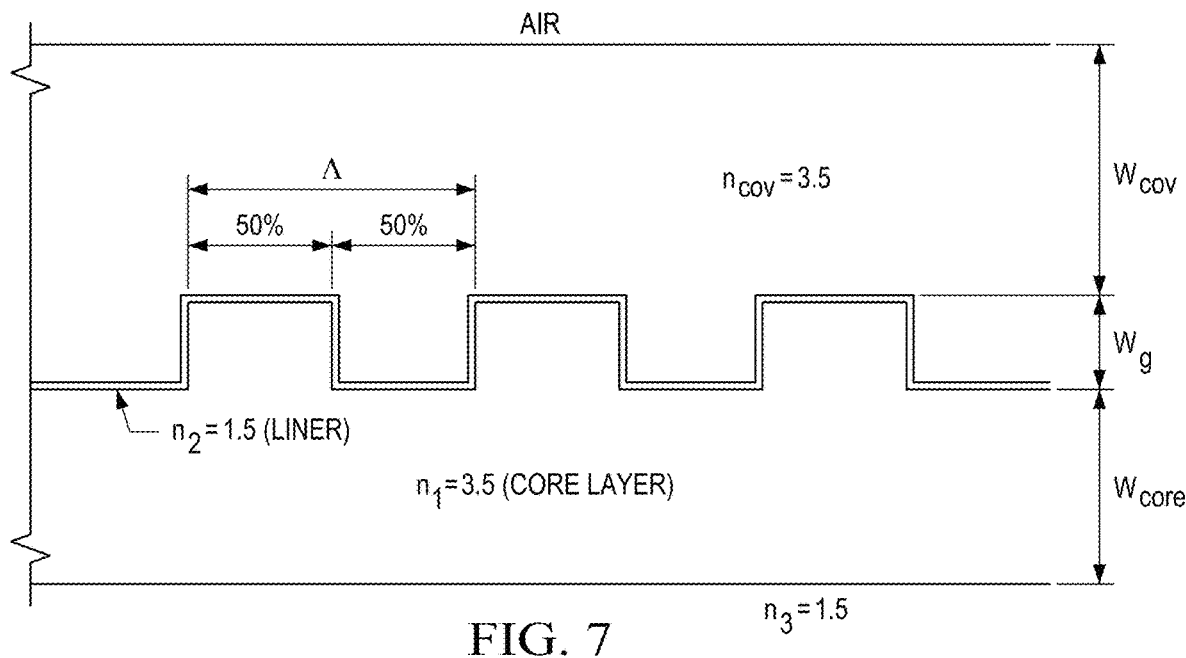
FIG. 7 shows an $Si/SiO_2$ waveguide with a liner layer and a cover layer of the present invention.

Enhancement of Grating Coupling Strength in High Index Contrast Waveguides. Although $Si/SiO_2$ waveguides inherently have strong gratings, the use of a liner layer and cover layer with such waveguides (see FIG. 7) can increase their effectiveness. The seventh column in Table 1 shows that the use of a 5 nm low-index (1.5) liner covered by a 0.15 micron high index (3.5) cover layer such as amorphous Si can increase the Figure of Merit of such a waveguide by a factor of 2. In this case, the high index cover layer generally should have an index of refraction greater than the effective index of the waveguide for the same reasons covered in the discussion of the ECS grating on high index core waveguides.

Liner and Cover Layer Considerations. To obtain the approximate Figure of Merit terms used in Tables 1 and 2, the inventors solved for the field distributions of a planar waveguide by assuming average relative permattivities for regions I, II and III in the grating region shown in FIG. 8. The average relative permattivity of a grating region is calculated by taking the square root of the weighted (by duty cycle) average relative permittivities for a region [19,20,21]. For the example in FIG. 8, assuming a liner thickness of 5 nm and a grating period of 0.5 microns, the average index index of refraction (which is the square root of the average permativity) of region I is 2.693 (sqrt(50%*$3.5^2$+50%*$1.5^2$)) Similarly, the average index of region II is 3.471 (sqrt(50%*$3.5^2$+2%*$1.5^2$+48%*$3.5^2$)). Finally, the average index of region III is 2.655 (sqrt(52%*$1.5^2$+48%*$3.5^2$)).

Figure 8:
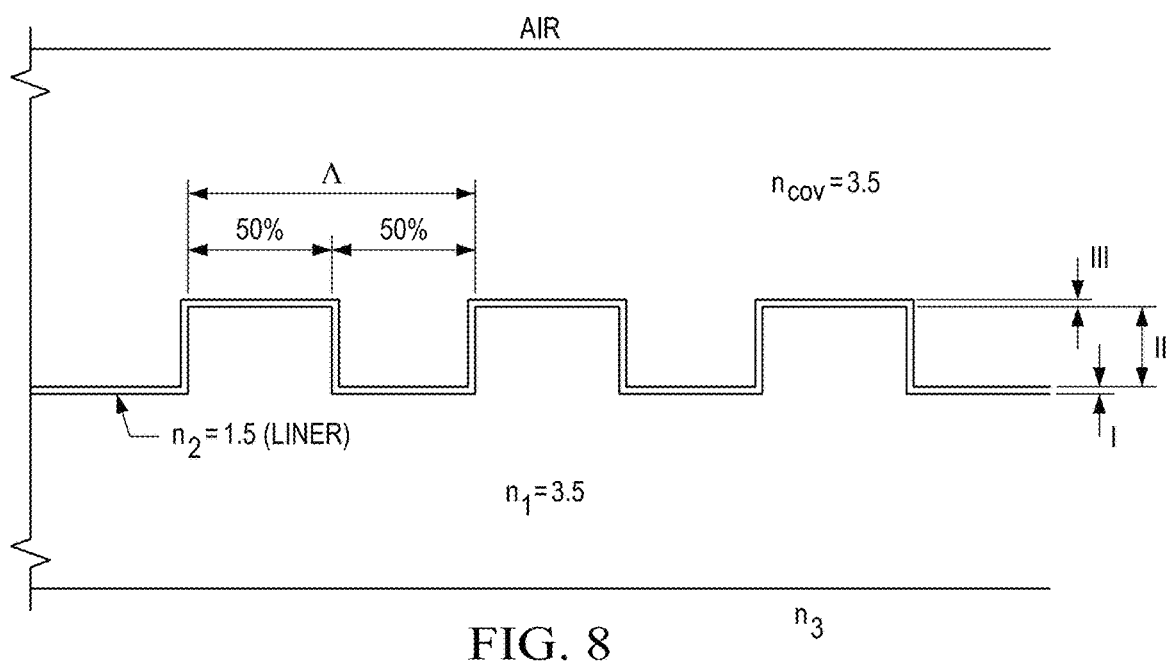
FIG. 8 shows a sketch of regions I, II and III of a grating with a liner layer and a cover layer for use with the present invention.

FIG. 8 is a sketch showing regions I, II and III of a grating with a liner layer. The resulting index profiles and field distributions for liner thicknesses of 5, 10 and 25 nm are shown in FIGS. 9A and 9B, using a constant total grating depth of 0.1 microns, a waveguide core thickness of 0.2 microns, and a high-index cover layer of 0.15 microns.

Figure 9A:
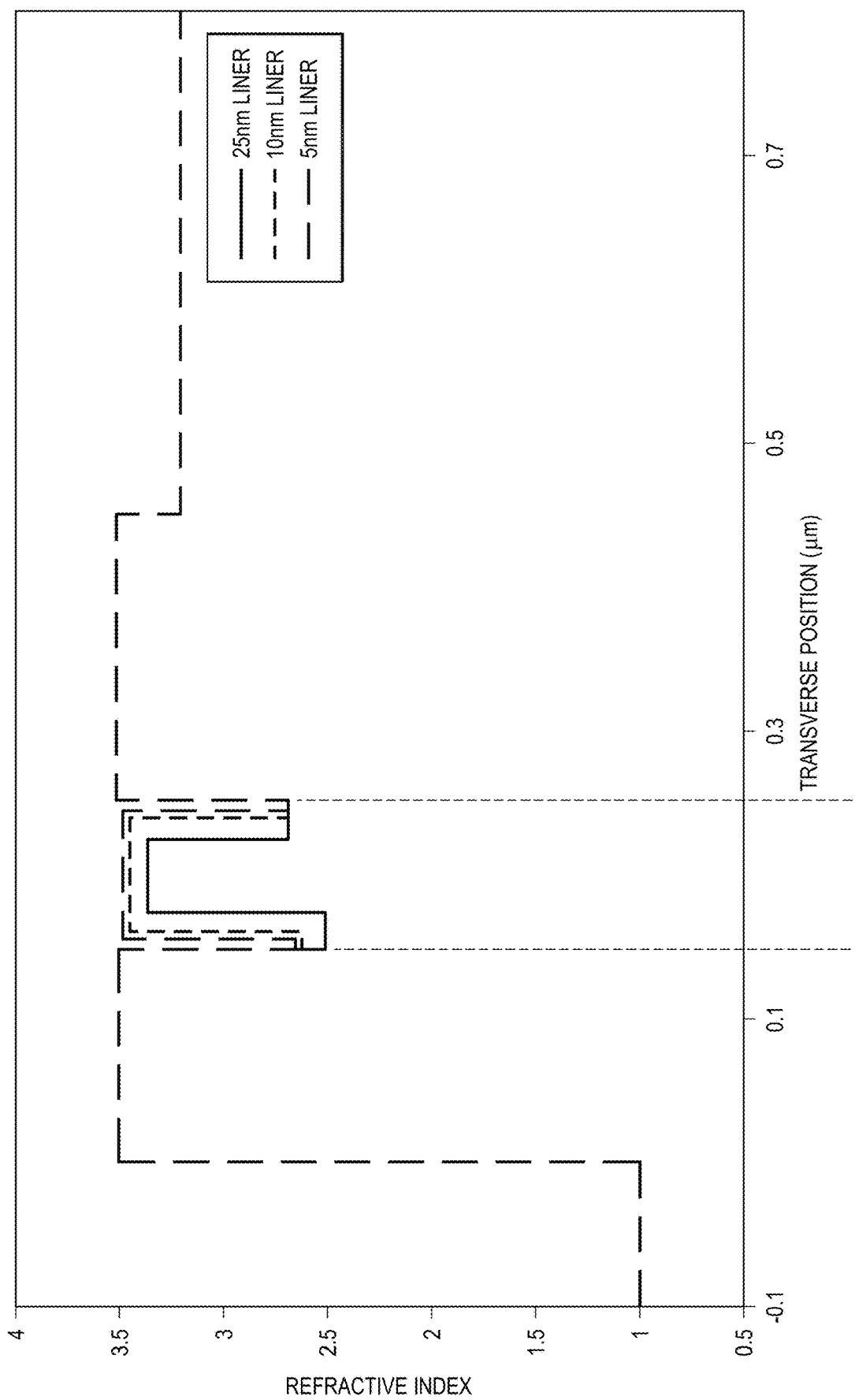
FIG. 9A shows the index profile for the waveguide structure shown in FIG. 5 for a liner layer having a thickness of 5, 10 and 25 nm as shown in the figure legend with the grating layer replaced by the square root of the average relative permittivities in grating regions I, II and III.
Figure 9B:
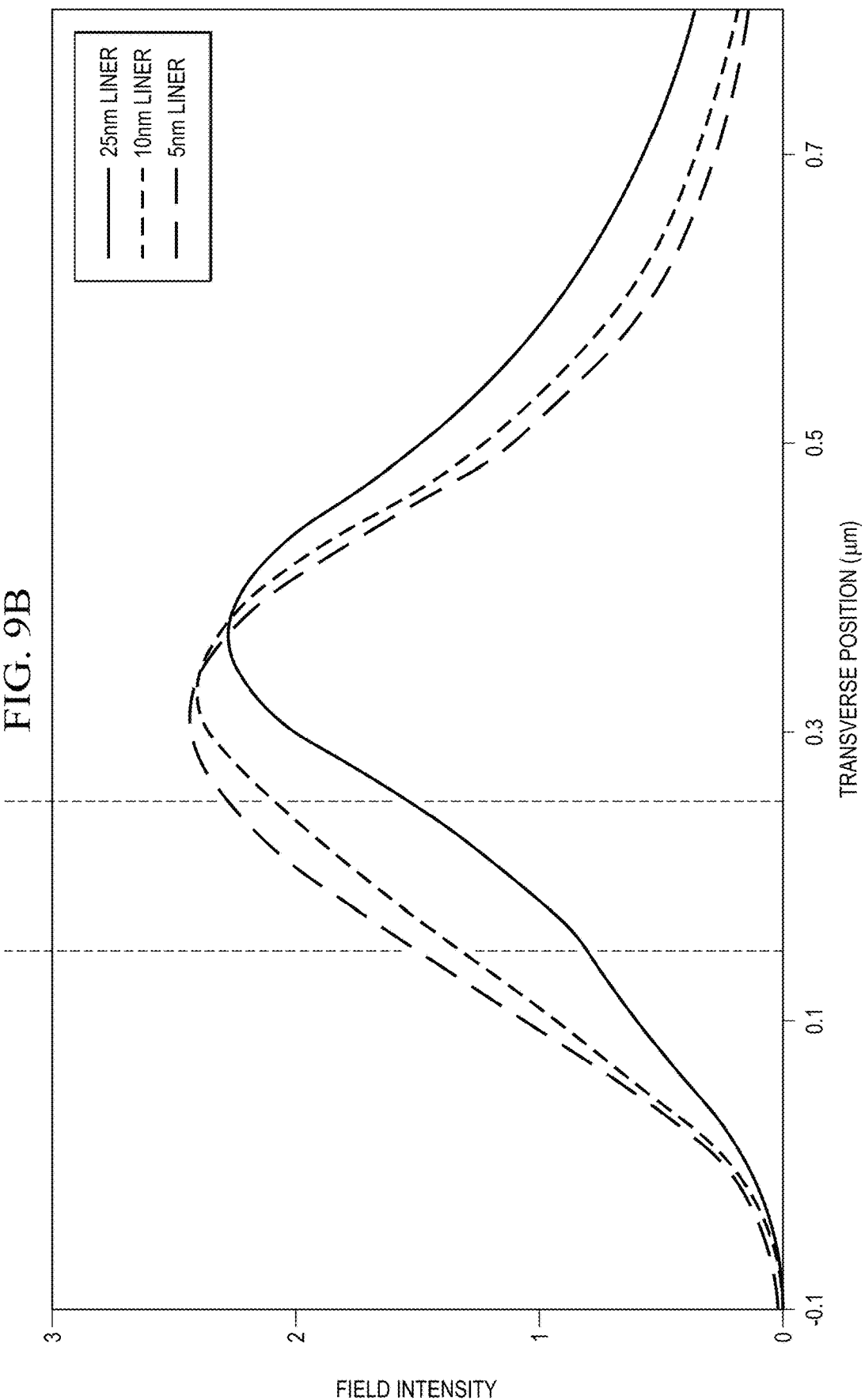
FIG. 9B shows the resulting intensity profiles for the fundamental mode for the index profiles in FIG. 9A for a liner layer having a thickness of 5, 10 and 25 nm as shown in the figure legend.

FIGS. 9A and 9B are graphs of index profiles and field intensity plots. FIG. 9A shows the index profile for the waveguide structure shown in FIG. 5 for a liner thickness of 5, 10 and 25 nm with the grating layer replaced by the average relative permittivities in grating regions I, II and III. FIG. 9B shows the resulting intensity profiles for the fundamental mode for the index profiles in FIG. 9A. The basic waveguide index profile shown in FIG. 9A can be used to vary the thicknesses and indices of the layers of the structure to estimate initial optimizations of the approximate Figure of Merit for an ECS grating. Examples of such layer variation plots are shown in FIGS. 10 through 14.

Figure 10A:
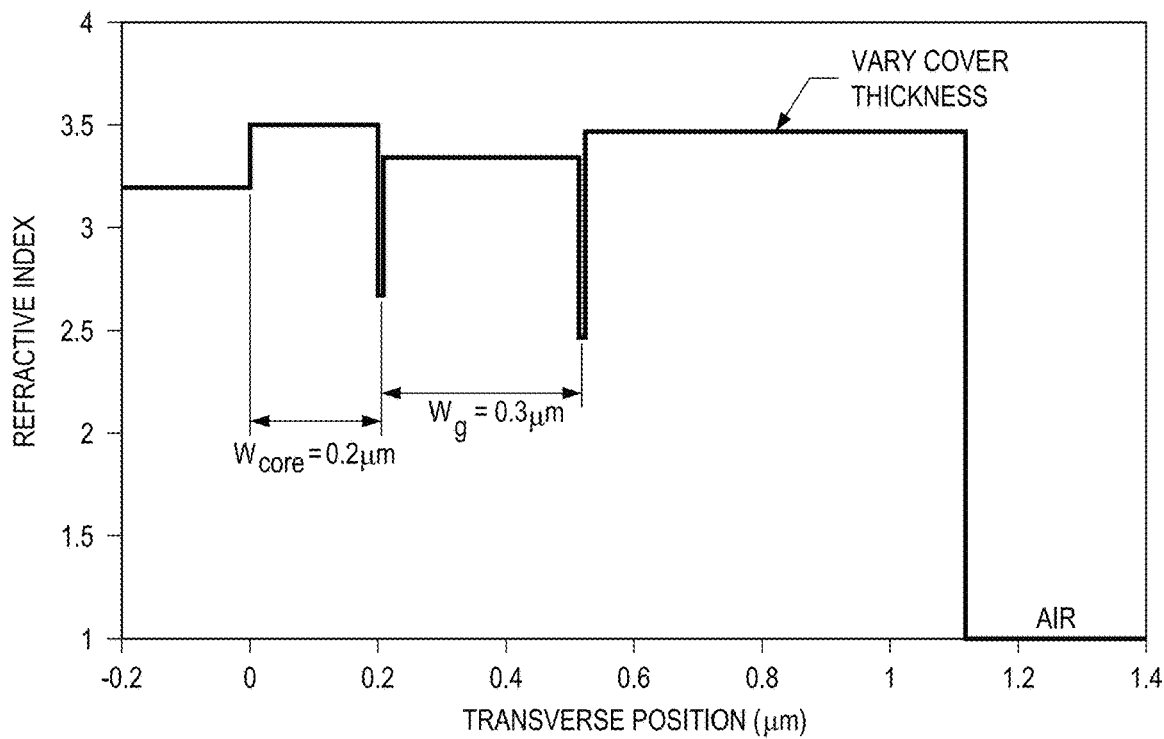
FIG. 10A shows an index profile of the ECS grating coupler waveguide (FIG. 5) with a fixed core thickness of 0.2 microns, a grating thickness of 0.3 microns and a variable thickness for the high index cover layer.
Figure 10B:
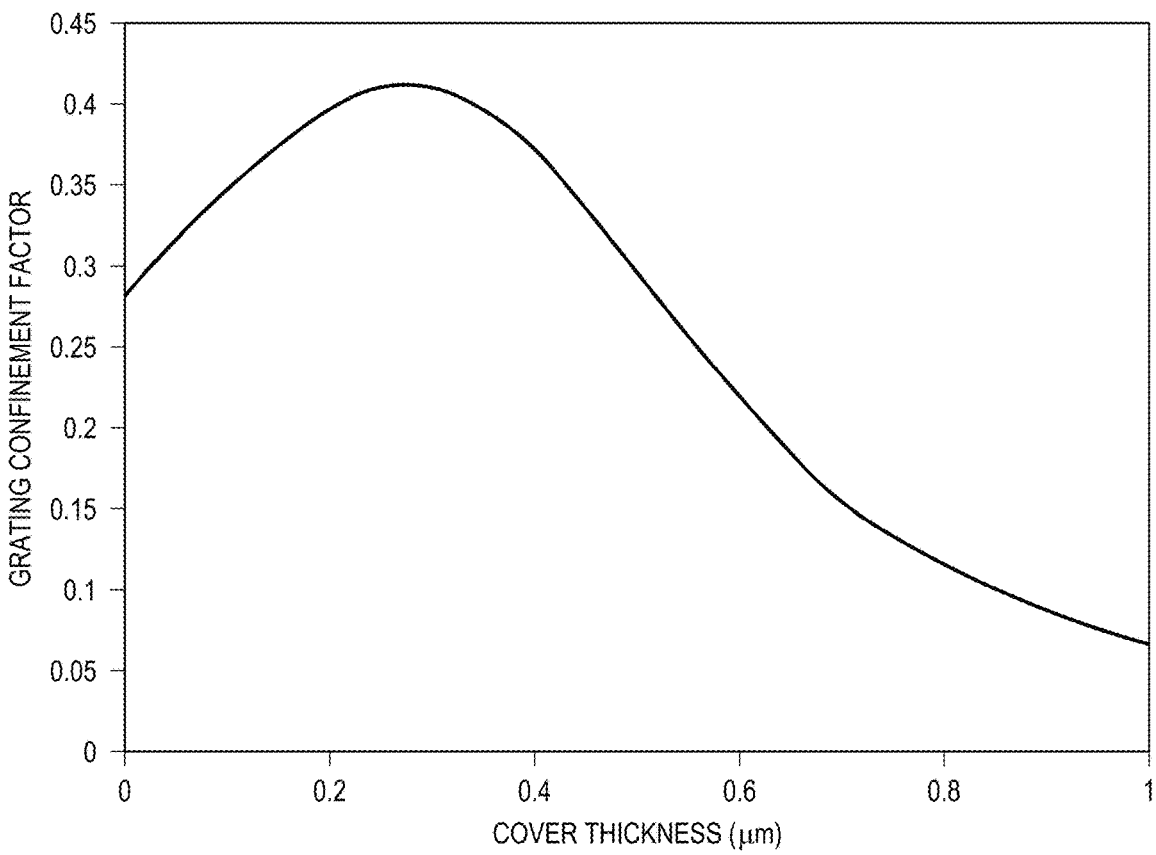
FIG. 10B shows the grating confinement factor as a function of the thickness of the high index cover layer.

FIGS. 10A and 10B are graphs that show the index profile and grating confinement as a function of the thickness of the cover layer. In this non-limiting example, the grating period was 0.2 um and the liner thickness 10 nm. FIG. 10A shows the index profile of the ECS grating waveguide (shown in FIG. 5) with a fixed core thickness of 0.2 microns, a grating thickness of 0.3 microns, a liner thickness of 10 nm and a variable thickness for the high index cover layer. FIG. 10B shows the grating confinement factor as a function of the thickness of the high index cover layer. In FIGS. 10A and 10B, all of the thicknesses of the layers are fixed except the high index cover layer. For this particular choice of layer thicknesses, indices and grating period, the optimum thickness for the cover layer is about 0.3 microns.

Figure 11A:
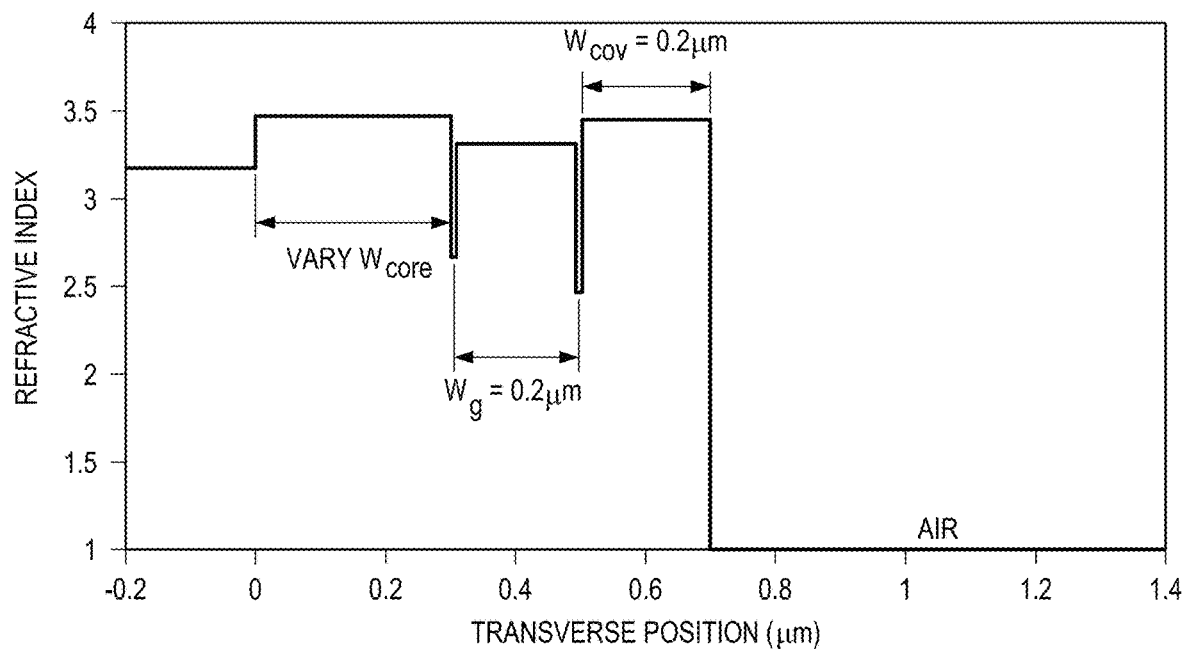
FIG. 11A shows an index profile of the ECS grating coupler waveguide (FIG. 5) with a variable core thickness, a grating thickness of 0.2 microns and a thickness for the high index cover layer of 0.2 microns.
Figure 11B:
FIG. 11B shows the grating confinement factor as a function of the core thickness.
Figure 11C:
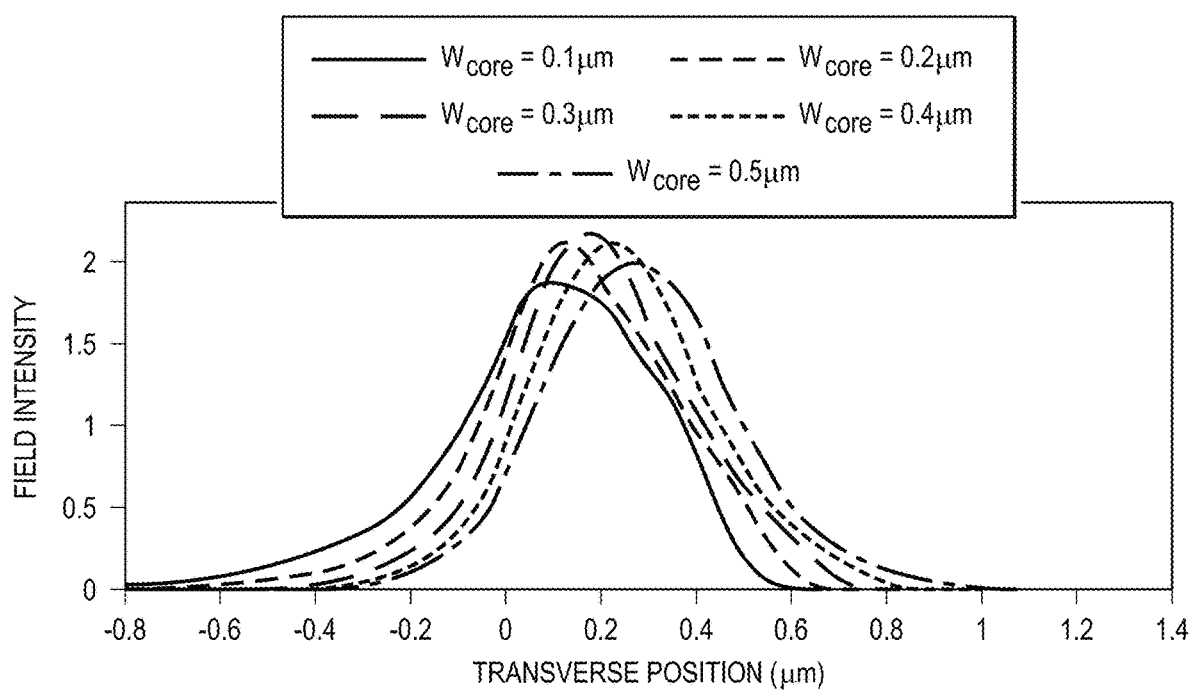
FIG. 11C shows the field intensity plots for core thicknesses ranging from 0.1 to 0.5 microns as shown in the figure legend.

FIGS. 11A to 11C show the index profile, grating confinement factor and field intensity plots as a function of core thickness. In this non-limiting example, the grating period was 0.2 um and the liner thickness 10 nm. In FIG. 11A an index profile of the ECS grating waveguide (FIG. 5) with a variable core thickness, a grating thickness of 0.2 microns, and a thickness for the high index cover layer of 0.2 microns is shown. FIG. 11B shows the grating confinement factor as a function of the thickness of the core thickness. FIG. 11C shows a field intensity plots for core thicknesses ranging from 0.1 to 0.5 microns. In FIG. 11, all of the thicknesses of the layers are fixed except that of the core layer. For this particular choice of fixed parameters, the optimum thickness of the core layer is just under 0.1 micron.

Figure 12A:
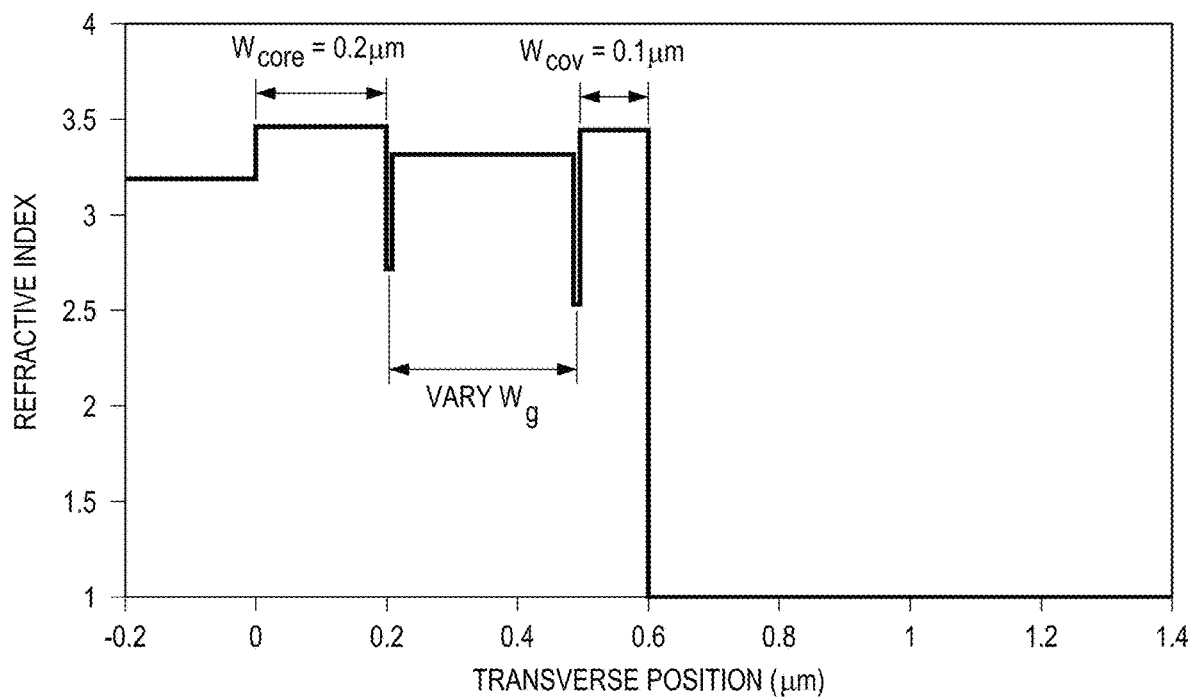
FIGS. 12A to 12C shows.
Figure 12B:
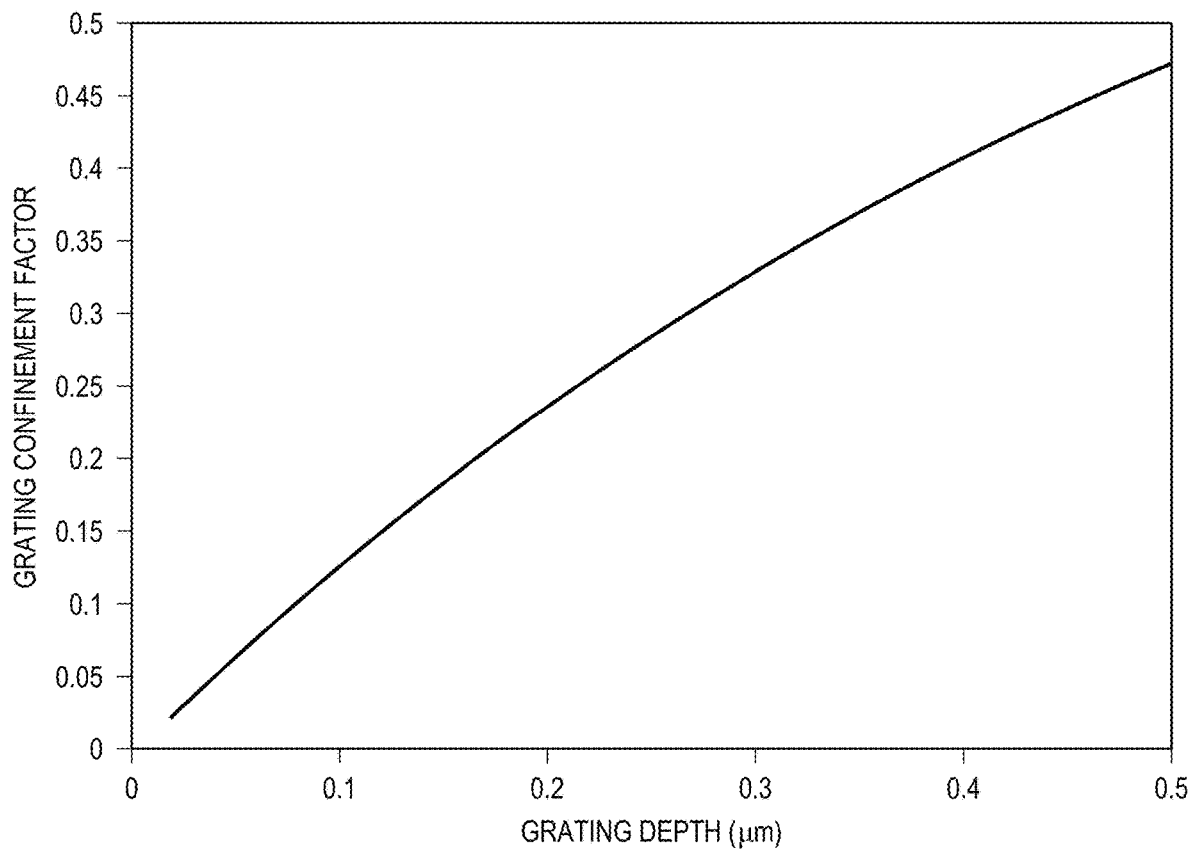
Figure 12C:
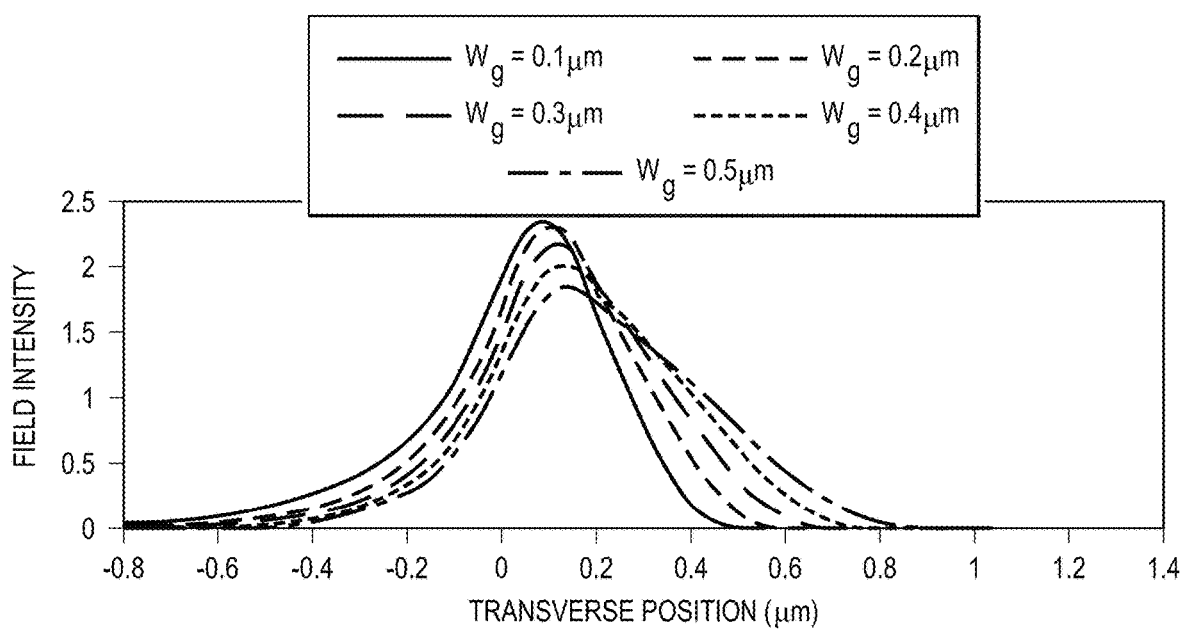

FIGS. 12A to 12C show the index profile, grating confinement factor and field intensity plots as a function of the thickness of the grating layer. In this non-limiting example, the grating period was 0.2 um and the liner thickness 10 nm. FIG. 12A shows the index profile of the ECS grating waveguide (FIG. 5) with a fixed core thickness of 0.2 microns, a variable grating thickness and a 0.1 micron thickness for the high index cover layer. FIG. 12B shows the grating confinement factor as a function of the thickness of the grating layer. FIG. 12C shows the field intensity plots for grating thicknesses ranging from 0.1 to 0.5 microns. In FIGS. 12A to 12C, all of the thicknesses of the layers are fixed except the thickness of the grating layer. For this particular choice of layer thicknesses, indices and grating period, the grating confinement factor approaches 0.5 for a grating thickness of about 0.5 microns. The resulting field intensities are plotted as a function of grating depth.

Figure 13A:
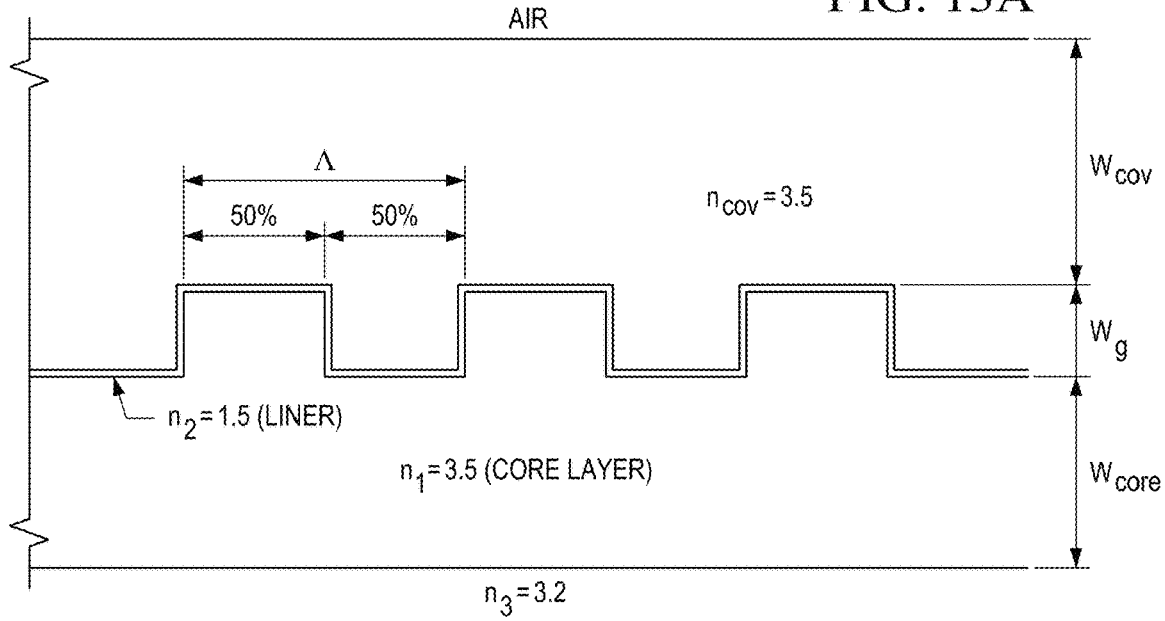
FIGS. 13A to 13C show.
Figure 13B:
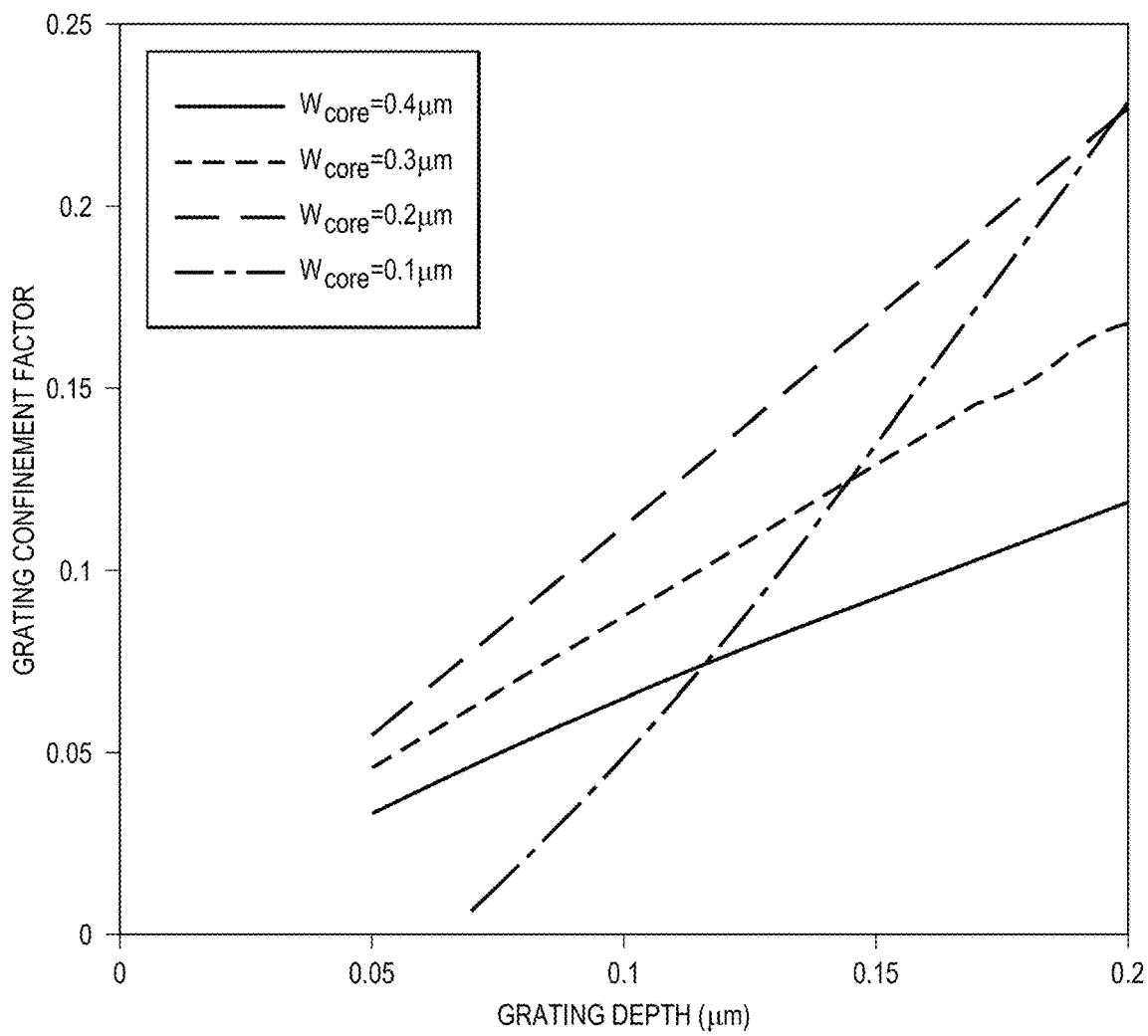
Figure 13C:
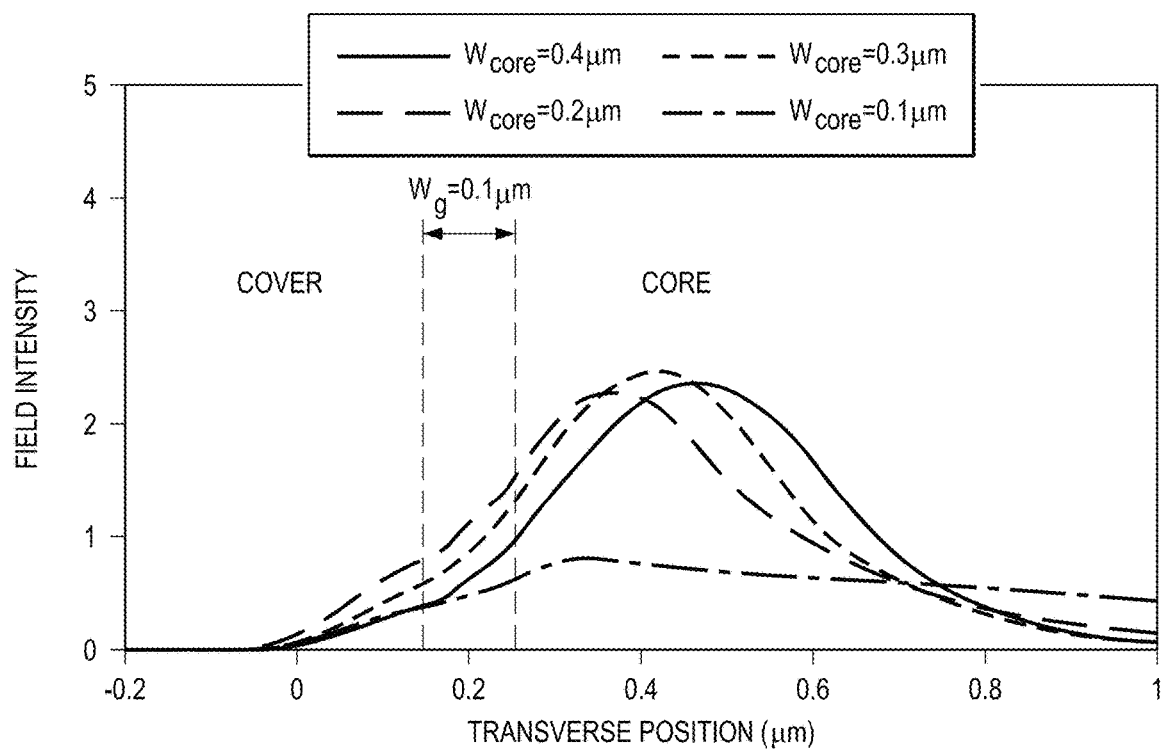

FIG. 13A shows a sketch of a grating with liner layer and cover layers. In this non-limiting example, the grating period was 0.5 um and the liner thickness 25 nm. FIG. 13B shows the grating confinement factor as a function of grating depth for core thicknesses varying from 0.1 to 0.4 microns. FIG. 13C shows the field intensity plots for a fixed grating depth of 0.1 microns for core thicknesses varying from 0.1 to 0.4 microns.

Figure 14A:
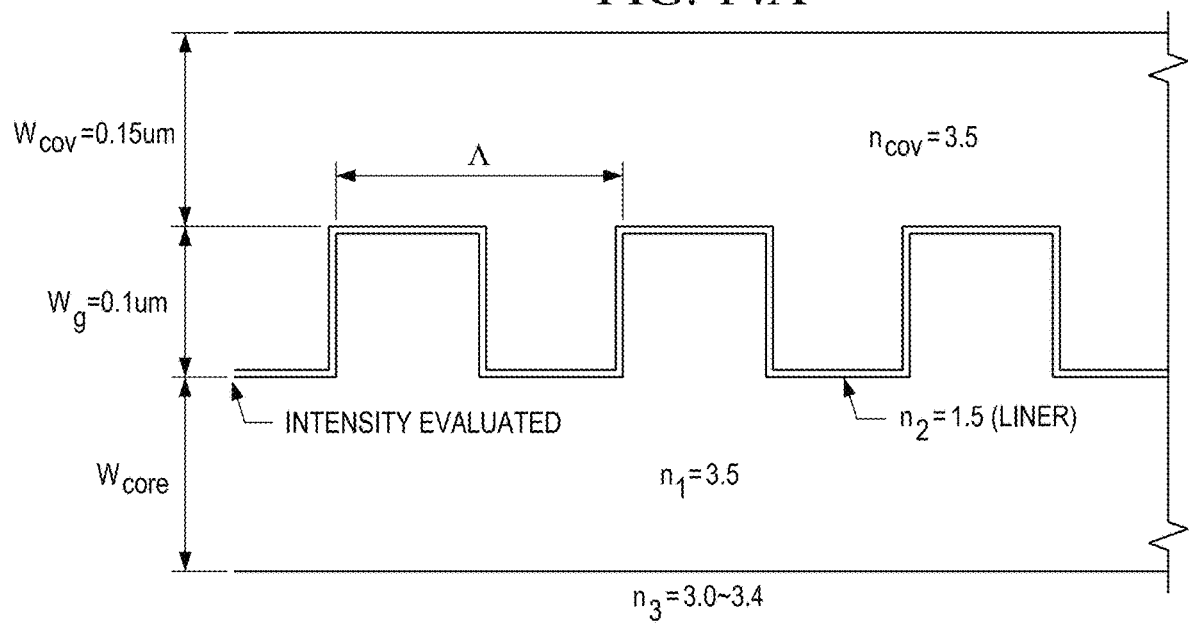
FIG. 14A shows a sketch of a waveguide that includes a grating with liner and cover layers.
Figure 14B:
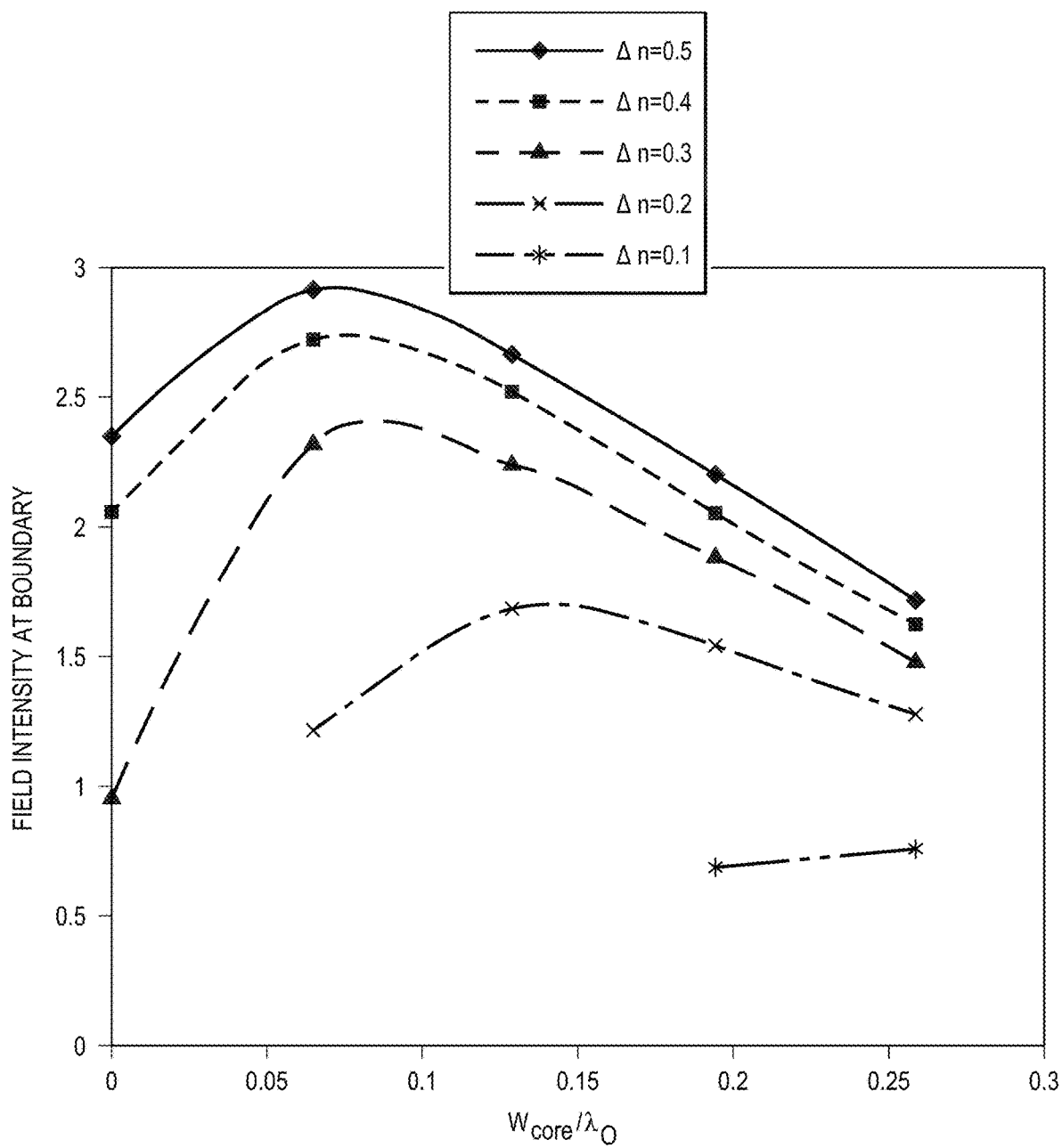
FIG. 14B shows plots of the magnitude of the field intensity at the lower boundary of the grating for a normalized core thickness of WA for index differences between the core and the substrate ranging from 0.1 to 0.5 as shown in the figure legend.

FIG. 14A shows a sketch of the structure and FIG. 14B shows a plot of the magnitude of the field intensities at the lower boundary of the grating for a normalized core thickness of $W/\lambda$ for index differences between the core and the substrate ranging from 0.1 to 0.5. In this non-limiting example, the grating period was 0.5 um and the liner thickness 5 nm.

The discussion hereinabove serves only to show general trends and dependences of the grating confinement factor and the FOM of various optical waveguides with ECS gratings, and is not an attempt to optimize any particular ECS grating waveguide. The above analysis is only a first-order analysis and approximates the grating by several layers, each with an average relative permittivity. There are also additional constraints on the configuration of optical waveguides with ECS gratings. For example, the minimum thickness of the core of a high index contrast silicon waveguide may be constrained by electronic devices that are fabricated in other regions of the die. Or a III-V waveguide design may be constrained by a laser structure or other photonic devices that share common waveguide layers with the ECS grating waveguide region. As such, the skilled artisan will recognize that using the design parameters provided herein, there are various designs that could provide an "optimum" ECS waveguide design for a specific application.

Figure 15:
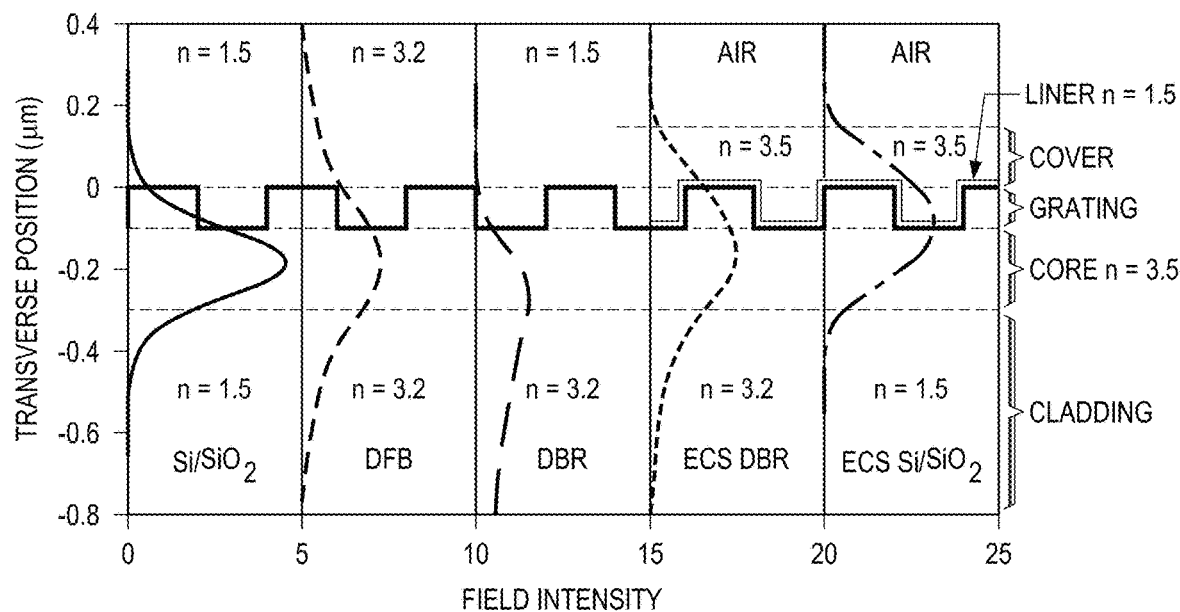
FIG. 15 contains multiple plots of the field intensities for the waveguides shown in FIGS. 1, 2, 3, 5, and 7.

A comparison of the field intensities for the waveguides shown in FIGS. 1, 2, 3, 5 and 7 is shown in FIG. 15 for a waveguide thickness of 0.2 microns, a grating period of 0.5 um, and a grating depth of 0.1 microns. The first intensity profile on the left is for the silicon/silicon dioxide waveguide of FIG. 1; the second intensity profile is for the DFB waveguide of FIG. 2 with core and cladding indices of 3.5 and 3.2; the third intensity profile is for the DBR waveguide of FIG. 3 with a core index of 3.5, a substrate index of 3.2 and a superstrate index of 1.5; the fourth intensity profile is for the ECS grating waveguide of FIG. 5 with a core index of 3.5, a substrate index of 3.2, a 5 nm SiO$_2$ liner, and an amorphous silicon layer of 0.15 microns; and the fifth intensity profile is of an ECS Si/SiO$_2$ grating waveguide shown in FIG. 7 with a 5 nm SiO$_2$ liner, and an amorphous silicon layer of 0.15 microns. The grating confinement factor is the area under the intensity profile in the grating region. The enhancement of the low grating confinement factor of the DBR waveguide (FIG. 3) is apparent when compared to the ECS waveguide (FIG. 5), which is the DBR waveguide with the addition of a 5 nm silicon dioxide liner layer and a 0.15 micron amorphous silicon layer. Although the DFB waveguide (FIG. 2) has a large confinement factor, about the same as the silicon/silicon dioxide waveguide (FIG. 1), the small relative permittivity difference between the materials on either side of the gating limits the strength of the DFB grating. Comparing the fifth intensity profile with the first intensity profile, we see that the addition of the liner and a cover layer increases the grating confinement factor and also shifts the peak of the propagating mode from the core layer to the grating layer. By varying the thickness of either or both of the liner layer and/or cover layer, the overlap between the intensity distribution in the smooth (no grating) region of the waveguide and the grating region of the waveguide can be increased while simultaneously increasing the efficiency of the grating.

Calculation of Grating Coupling Length. All of the figures above are analyzed using a simple planar layer waveguide analysis that does not account for the interaction of the waveguide mode with the exact grating boundaries. As a result, the calculated Figure of Merit (FOM) is an approximate number that is mainly useful for initial exploration of the parameter space of an optical waveguide with an ECS grating, which can be optimized for specific applications as taught herein. A more complete analysis of such structures, such as a numerically exact Floquet-Bloch approach [19,20], finite element [22], boundary element [23] or finite difference time domain [24] approach that matches the electro-magnetic field at every interface contained in the grating region (and at every interface in the optical waveguide) is required to obtain a detailed and accurate solution of the grating strength and distance over which a large fraction of the waveguide light is radiated by the grating. In the Floquet-Bloch approach, the electric field is written as:

$$E_y(x,z) = \sum_{n=-\infty}^{\infty} f_n(x) \cdot \exp(-jk_{zn}z) \qquad \text{Equation 3}$$

where $f_n(x)$ is the transverse variation of each space harmonic and the longitudinal propagation constant $k_{zn}$ of each space harmonic is given by:

$$k_{zn} = \beta_m + j\alpha = (\beta_0 + nK) + j\alpha, \; \alpha < 0, \; K = \frac{2\pi}{\Lambda} \qquad \text{Equation 4}$$

where $\beta_o$ is equal to $2\pi/\lambda_g$ ($\lambda_g$ is the wavelength of the field variation along the z axis of the waveguide) and $\alpha$ is the electric field attenuation constant ($2\alpha$ is the power attenuation constant), which is proportional to the amount of light radiated from the waveguide.

Figure 16:
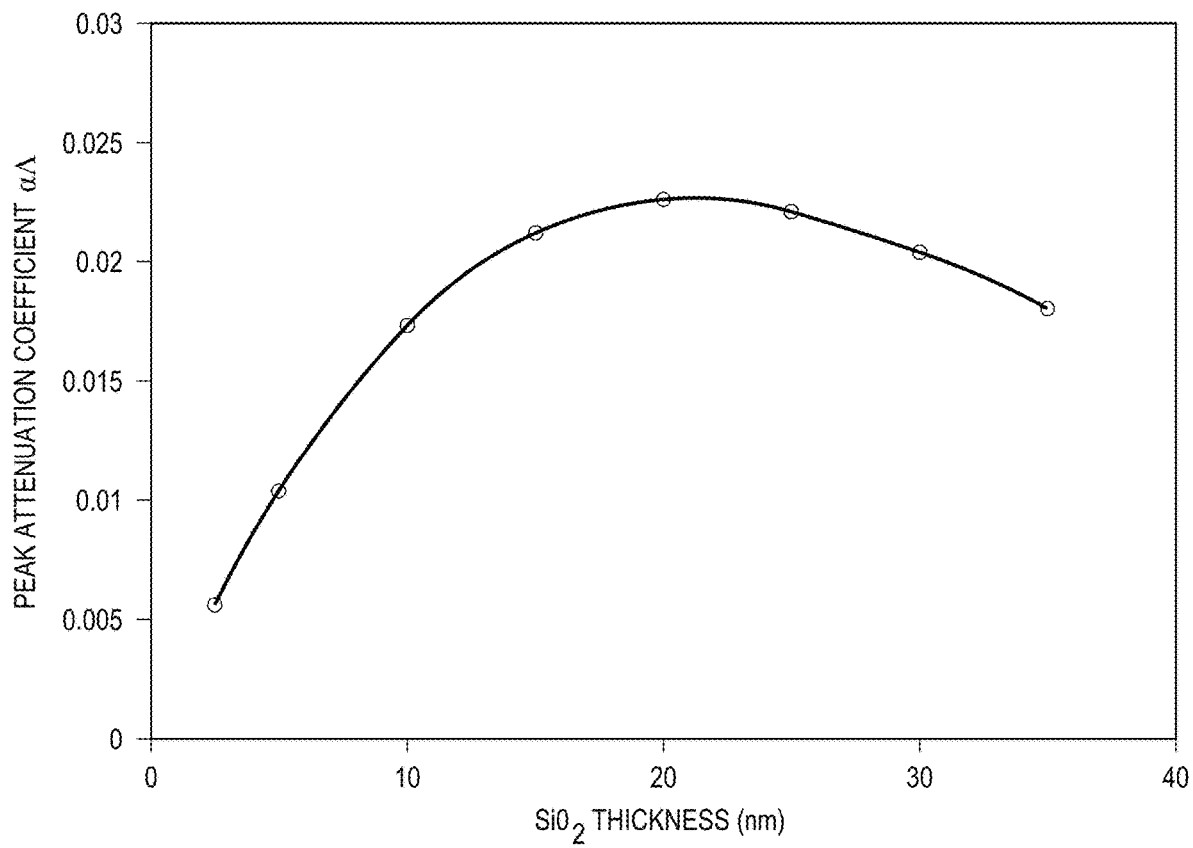
FIG. 16 is a plot of the normalized peak attenuation as a function of liner thickness for the ECS grating coupler waveguide shown in FIG. 5 with a core thickness of 0.2 microns, a grating depth of 0.1 microns, a grating period of ~0.47 microns and a cover thickness of 0.15 microns.

Since the power attenuation is proportional to $\exp(-2\alpha z)$, the intensity of the light in the waveguide will be reduced to 1/e in a distance $z=L=N\Lambda=1/(2\alpha)$, where N is the number of grating periods. Therefore the light intensity in the waveguide is reduced to 1/e in $N=1/(2\alpha\Lambda)$ grating periods. A Floquet-Bloch approach was used to find the attenuation coefficient for the structure shown in FIG. 5 as a function of liner layer thickness assuming a core thickness of 0.2 microns, a grating thickness of 0.1 microns, a grating period of ~0.4765 microns, a high index cover layer thickness of 0.15 microns and a free space wavelength of 1550 nm. FIG. 16 is a plot of the normalized attenuation constant (the product of the peak attenuation coefficient and the second-order grating period) as function of liner layer thickness and indicates that the optimum choice for the liner layer thickness is about 20 nm for the specific structure in FIG. 5. For this case, the light remaining in the waveguide is reduced by 1/e in N~22 grating periods or about 11 microns for $\alpha\Lambda=0.023$.

For other waveguides with ECS grating couplers, the optimum liner layer thickness will vary. The lower limit on liner layer thickness will be dictated by deposition, fabrication and processing considerations such as the minimum thickness required to insure complete coverage of the liner layer over the grating or over desired portions of the grating.

All of the waveguide calculations described herein assume a free space wavelength of 1550 nm, however the skilled artisan will know how to vary this space. The field plots apply to other free space wavelengths $\lambda_o$ if the dimensions of the layers making up the waveguides are multiplied by $\lambda_o/1550$ (for $\lambda_o$ in units of nm). The thickness of the liner layer in an ECS grating waveguide will generally be a small fraction of the free space wavelength in the case of a continuous low index liner (FIG. 23) between a high index core and a high index cover layer. The reason for this, but in no way a limitation of the present invention, is that the field distribution in the (low index) liner layer has an exponentially decaying profile, so the liner has to be thin enough that there is a substantial value of the electric field at the liner/cover interface. As an example, the optimum liner thickness of 20 nm for the example based on FIG. 5 and described above is only 1.3% of the free space wavelength.

However, the waveguide in FIG. 6 has a low index core, a high index liner and a low index cover layer. In this case the field distribution in the liner layer has an oscillatory solution and the crude Figure of Merit increases with increasing liner thickness (Table 2). In this case, increasing the liner thickness sufficiently can shift the peak and narrow the field distribution.

For simplicity, the analysis in all of the above sections assumes ECS gratings with a constant 50% duty cycle, constant period and a uniform depth. The intensity profiles along such gratings have an exponentially decaying profile. To obtain other intensity profiles along a grating coupler, such as a Gaussian, the duty cycle, grating depth and/or grating period may be varied. The application of liner and cover layers to such gratings to enhance their coupling strength are covered by the claims in this patent. The grating profiles used in all of the illustrations are rectangular, although the application of liner and cover layers can be applied to any grating profile to enhance the coupling strength and are covered by the claims of this patent.

Reduction of Optical Losses at Waveguide Discontinuities. Another concern with gratings in waveguides is the interface between the waveguide region without a grating and the waveguide region with a grating. For example, in the manufacture of DBR lasers it is common to etch away the top contact (cap) layer and a significant portion of the p-clad layer before the grating is formed [25].

Figure 17:
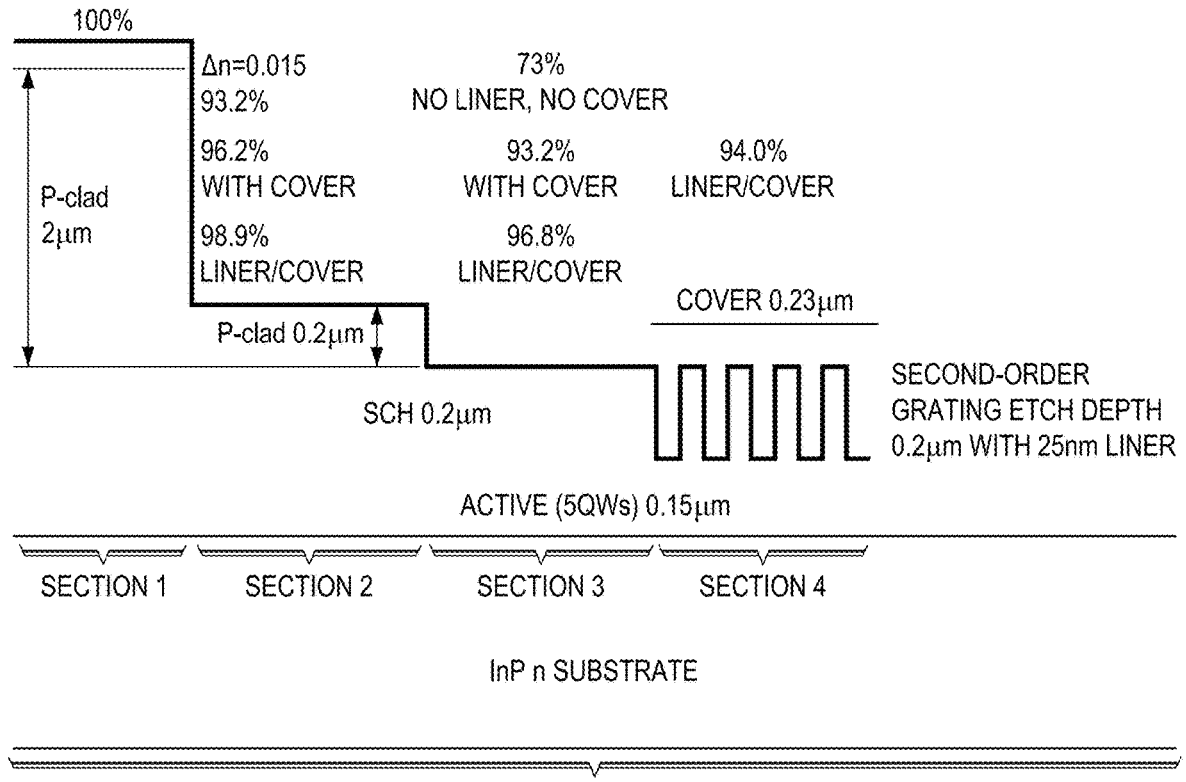
FIG. 17 is a cross section of the laser waveguide region (Section 1, shown in Table 3), a first transition region (Section 2), a second transition region (Section 3), and the grating outcoupler region (Section 4, shown in Table 4). The results of the overlap integral in the laser waveguide region of the field intensity in Section 2 (98.9%, 96.2%) and Section 3 (96.8%, 93.2%) with the field intensities in Section 2 and 3 are also indicated, with and without a liner. The overlap integral of the field intensity in the laser waveguide region with the field intensity of Section 4 (94%) is shown only for the case of a liner and an amorphous Si layer.

FIG. 17 is a sketch that shows the layers in the laser region (Section 1) and in intermediate regions (Section 2 and 3), and the ECS grating region (Section 4) for the laser and grating layers shown in Tables 3 and 4. FIG. 17 shows stepped cross sections of the transition regions from a laser waveguide section (Table 3) to the ECS grating outcoupler region formed in the laser structure (Table 4). Since the index profiles differ in the laser, transition and grating regions, there are radiation losses (and reflections) at each interface. Table 3 lists epitaxial layer thicknesses and indices (assuming an emission wavelength of 1550 nm) for the laser structure shown in FIG. 17, and Table 4 lists layer thicknesses and indices for an ECS grating waveguide formed from the laser structure.

In this example, a 0.2 micron thick grating is etched into the InGaAsP separate confinement heterostructure (SCH) layer (FIG. 17). Etching other InGaAsP/InP laser structures may result in a grating etched into both an InP clad layer and an InGaAsP Separate Confinement Heterostructure layer which requires adding a fourth "average relative permittivity" layer as illustrated in FIG. 18B. FIGS. 18B and 18D shows that a grating ridge can contain layers with multiple indices if etching of the grating continues through the superstrate and into the core layer.

A good approximation of the radiation loss and reflectivity at a step discontinuity in an optical waveguide is given by $1-\kappa_x$, where $\kappa_x$ is an overlap integral $\kappa_x$ [21]:

$$\kappa_x |\int_{-\infty}^{\infty} E_g(x) E_w^*(x) dx|^2 / (\int_{-\infty}^{\infty} E_g(x) E_g^*(x) dx \int_{-\infty}^{\infty} E_w(x) E_w^*(x) dx),$$ Equation 5

$\kappa_x$ is the normalized intensity overlap integral of the fields on either side of the discontinuity, $E_w$ is the electric field distribution on one side of the discontinuity and $E_g$ is the field intensity distribution on the other side of the discontinuity.

Figure 18A:
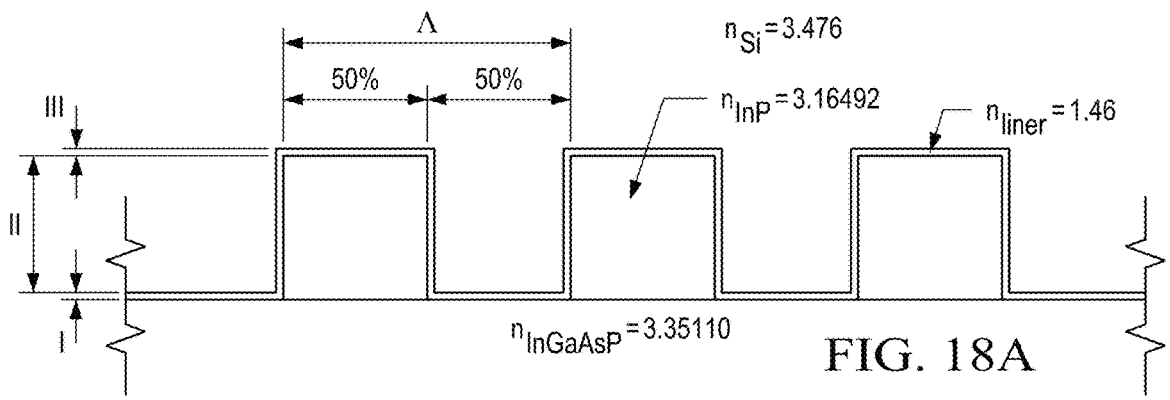
FIGS. 18A and 18B show the details of the grating after etching and deposition of the liner and cover layers for structures that may have the top portion of the grating in InP and the bottom portion of the grating in InGaAsP, corresponding to grating fabrication in a waveguide that corresponds to the cross-section shown in section 2 of FIG. 17.
Figure 18B:
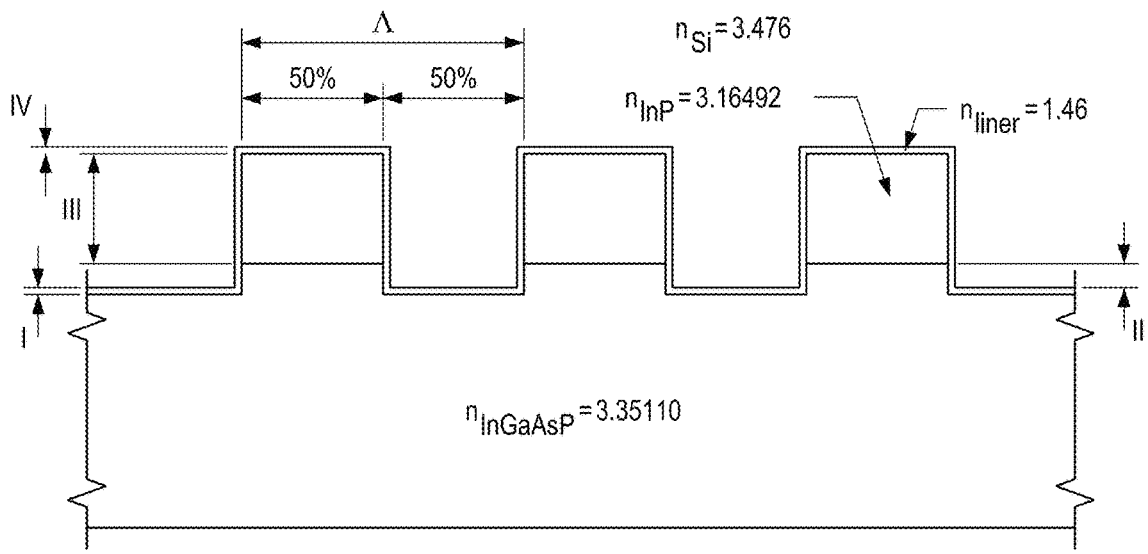
Figure 18C:
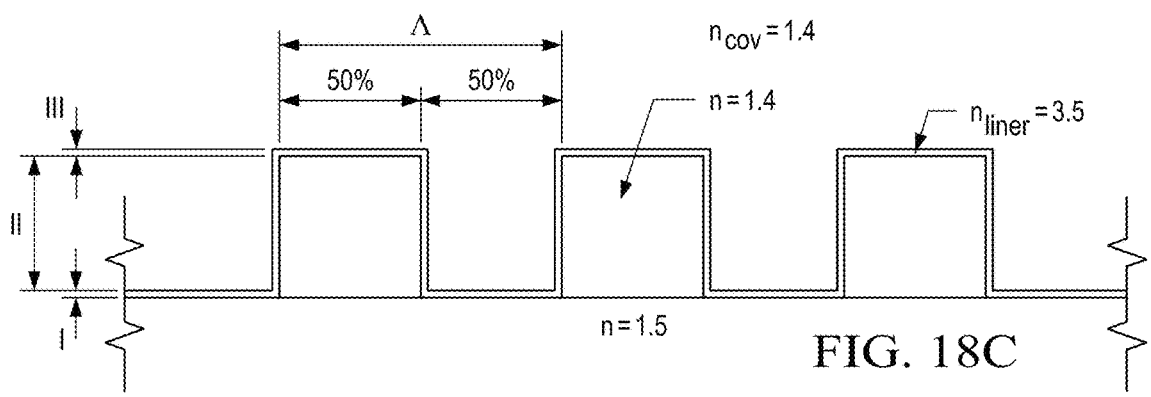
FIG. 18C shows grating ridges consisting of n=1.4 material over a core material with index n=1.5.
Figure 18D:
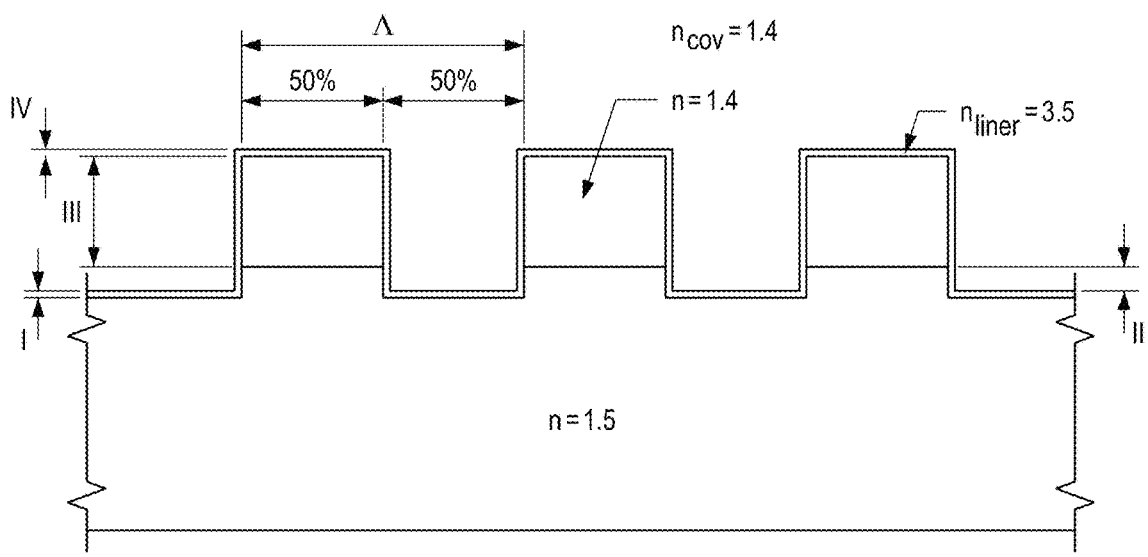
FIG. 18D shows etching the grating further into the core layer requires adding a fourth "average" relative permittivity layer.

FIGS. 18A to 18D show various details of the gratings after etching and deposition of the liner layer and cover layers. In FIG. 18A, for the structure shown in FIG. 15, the grating ridges contain InP (index=3.16492), the layer below the grating is InGaAsP (index=3.35110), the liner layer is silicon dioxide (index=1.46) and the cover layer is amorphous silicon (index=3.476). In FIG. 18B, etching a grating through both an InP layer and an InGaAsP layer requires adding a fourth "average relative permittivity" layer. In FIG. 18C, for the glass waveguide structure shown in FIG. 6, the grating ridges contain only material with an index of refraction=1.4. In FIG. 18D, for the same structure of FIG. 6, the grating ridges or teeth could contain material with an index of refraction of 1.4 and 1.5 if the grating is etched past the cladding layer into the core layer.

Figure 19A:
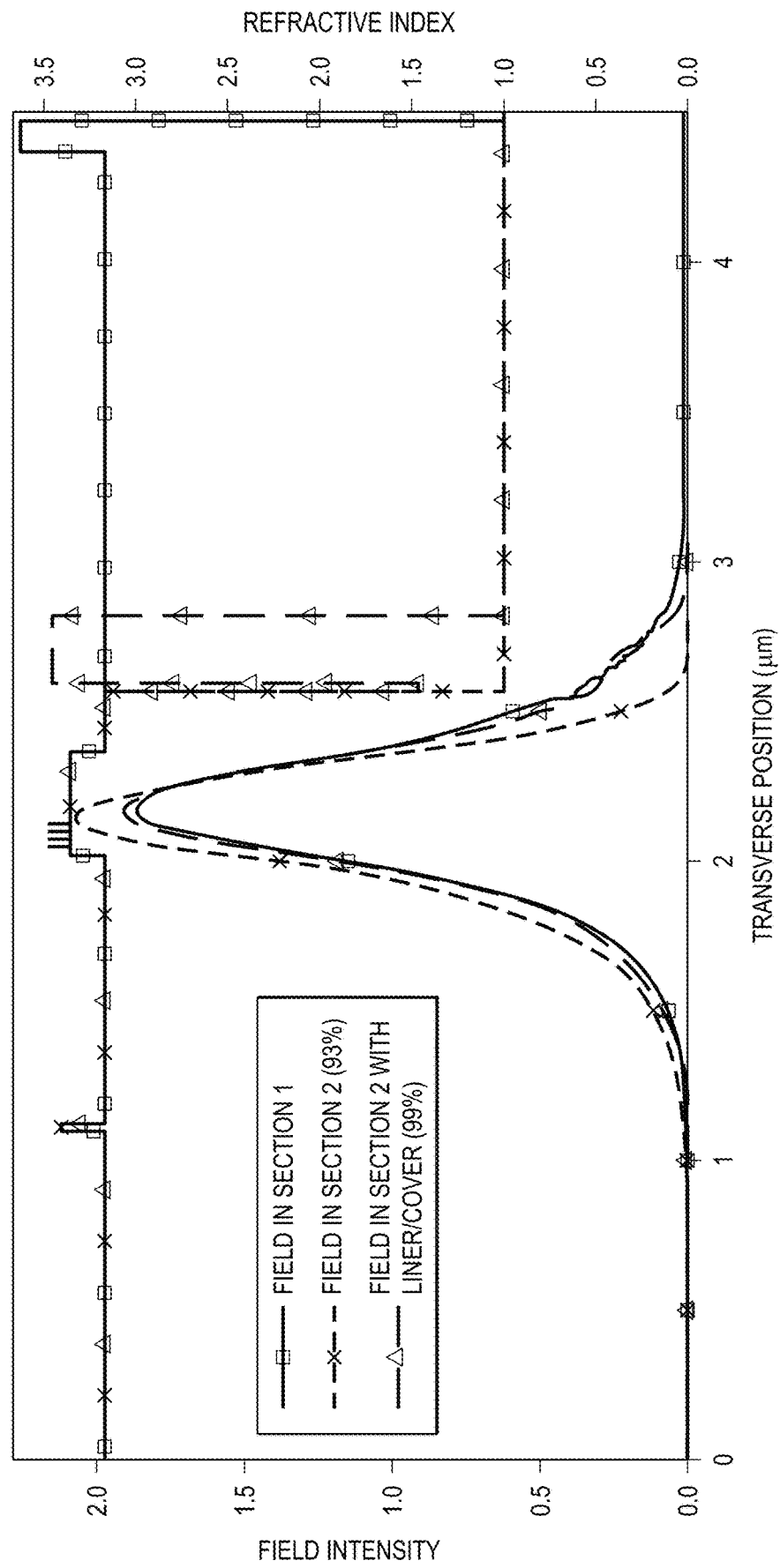
FIGS. 19A to 19C show the following.
Figure 19B:
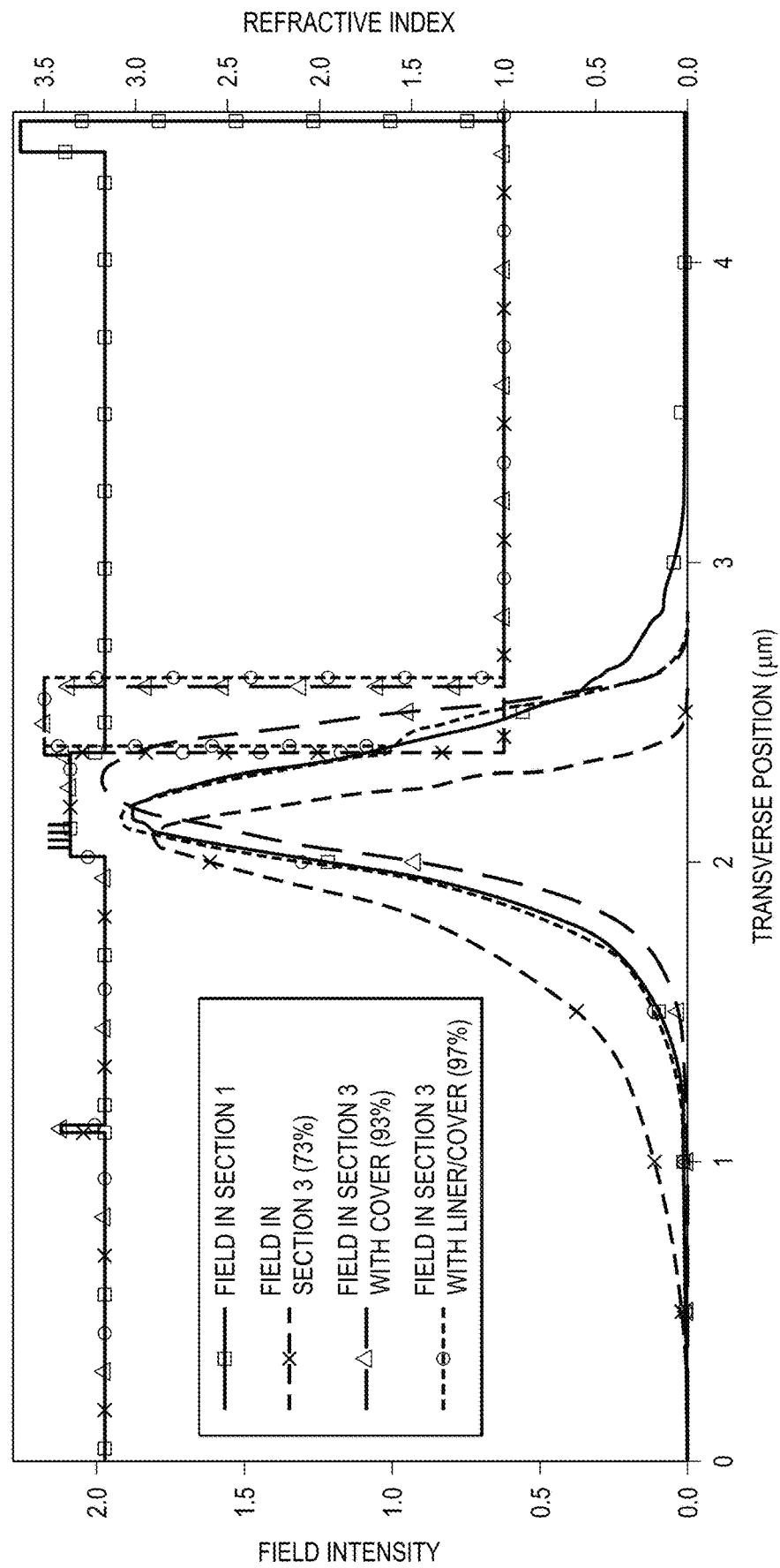
Figure 19C:
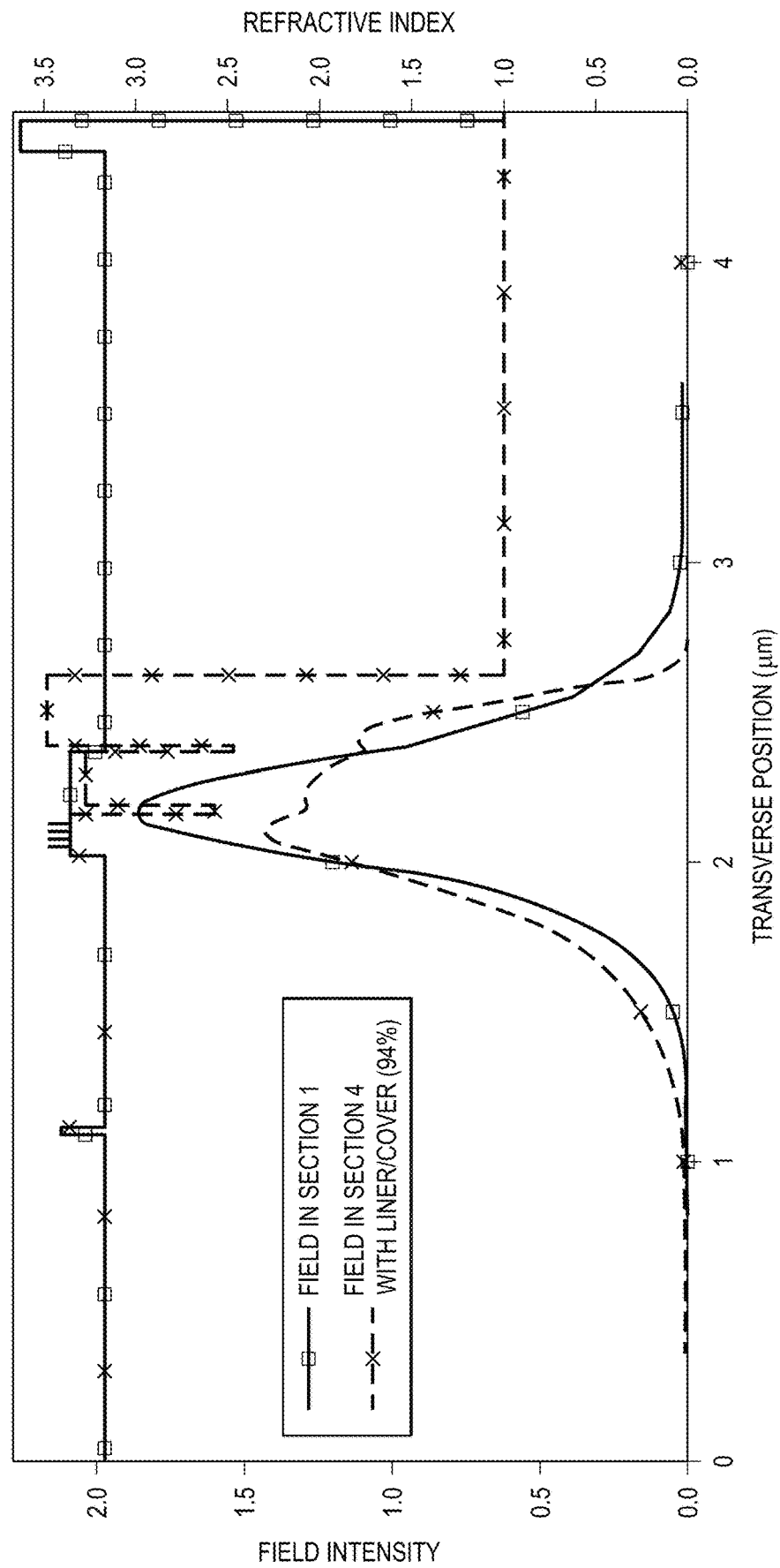

FIGS. 19A to 19C show index profiles and field intensities for the complete laser structure and for three other sections of the combination laser-ECS grating structure. FIG. 19A shows plots of the field intensities and index profiles in the laser waveguide region (section 1 of FIG. 17, square index profile and square field plot); in section 2 of FIG. 17 with no liner or cover layer ("x" index profile and "x" field plot, 93% overlap); and in section 2 of FIG. 17 with a liner layer and an amorphous Si cover layer (triangle index profile and triangle field plot, 99% overlap). FIG. 19B shows plots of the field intensities and index profiles in the laser waveguide region (section 1 of FIG. 17, square index profile and square field plot); in section 3 of FIG. 17 with no liner or cover layer ("x" index profile and "x" field plot, 73% overlap); and in section 3 of FIG. 17 with only an amorphous Si cover layer (triangle index profile and triangle field plot, 93% overlap); and in section 3 of FIG. 17 with a liner and amorphous Si cover layer (circle index and field plot, 97% overlap). FIG. 19C shows plots of the field intensities and index profiles in the laser waveguide region (section 1 of FIG. 17, square index profile and square field plot); and in section 4 of FIG. 17 with a liner and cover layer ("x" index profile and "x" field plot, 94% overlap).

This example shows how the application of a liner and cover layer can decrease radiation losses at waveguide discontinuities.

TABLE 3

Epitaxial layers of the 5 QW laser Structure

| Layer | Composition | Thickness (um) | Material Index |
|---|---|---|---|
| Air | — | | 1 |
| Cap | InGaAs | 0.100 | 3.62525 |
| P-clad | InP | 2 | 3.16492 |
| SCH | $In_{0.74}Ga_{0.26}As_{0.5}P_{0.5}$ | 0.244** | 3.35110 |
| 4x barriers | $In_{0.74}Ga_{0.26}As_{0.5}P_{0.5}$ | 0.008 | 3.35110 |
| 5x QWs | $In_{0.74}Ga_{0.26}As_{0.81}P_{0.19}$ | 0.006 | 3.50636 |
| SCH | $In_{0.74}Ga_{0.26}As_{0.5}P_{0.5}$ | 0.044* | 3.35110 |
| N substrate | InP | — | 3.16492 |

*Sum of thickness of the SCH, barriers, and QWs is 0.15 micron.
**The grating with 0.2 micron etched depth will be InGaAsP SCH layer.

TABLE 4

Layers in the Grating Section of the 5 QW Laser Structure

| Layer | Composition | Thickness (um) | Material Index |
|---|---|---|---|
| Air | — | | 1 |
| A-Si | Amorphous Silicon | 0.230 | 3.476 |
| Grating 3 | 60% $SiO_2$ + 40% Si | 0.025 | 2.47224* |
| Grating 2 | 50% InGaAsP + 10% $SiO_2$ + 40% Si | 0.175** | 3.26514* |

TABLE 4-continued

Layers in the Grating Section of the 5 QW Laser Structure

| Layer | Composition | Thickness (um) | Material Index |
|---|---|---|---|
| Grating 1 | 50% InGaAsP + 50% SiO$_2$ | 0.025 | 2.58471* |
| SCH | In$_{0.74}$Ga$_{0.26}$As$_{0.5}$P$_{0.5}$ | 0.044*** | 3.35110 |
| 4x barriers | In$_{0.74}$Ga$_{0.26}$As$_{0.5}$P$_{0.5}$ | 0.008 | 3.35110 |
| 5x QWs | In$_{0.74}$Ga$_{0.26}$As$_{0.81}$P$_{0.19}$ | 0.006 | 3.50636 |
| SCH | In$_{0.74}$Ga$_{0.26}$As$_{0.5}$P$_{0.5}$ | 0.044*** | 3.35110 |
| N substrate | InP | — | 3.16492 |

*Grating indicates calculation referenced in FIG. 19.
**Total thickness of grating 1-3 is 0.225 micron.
***Sum of the total thickness of the SCH, barriers, and QWs is 0.15 micron.

Figure 20:
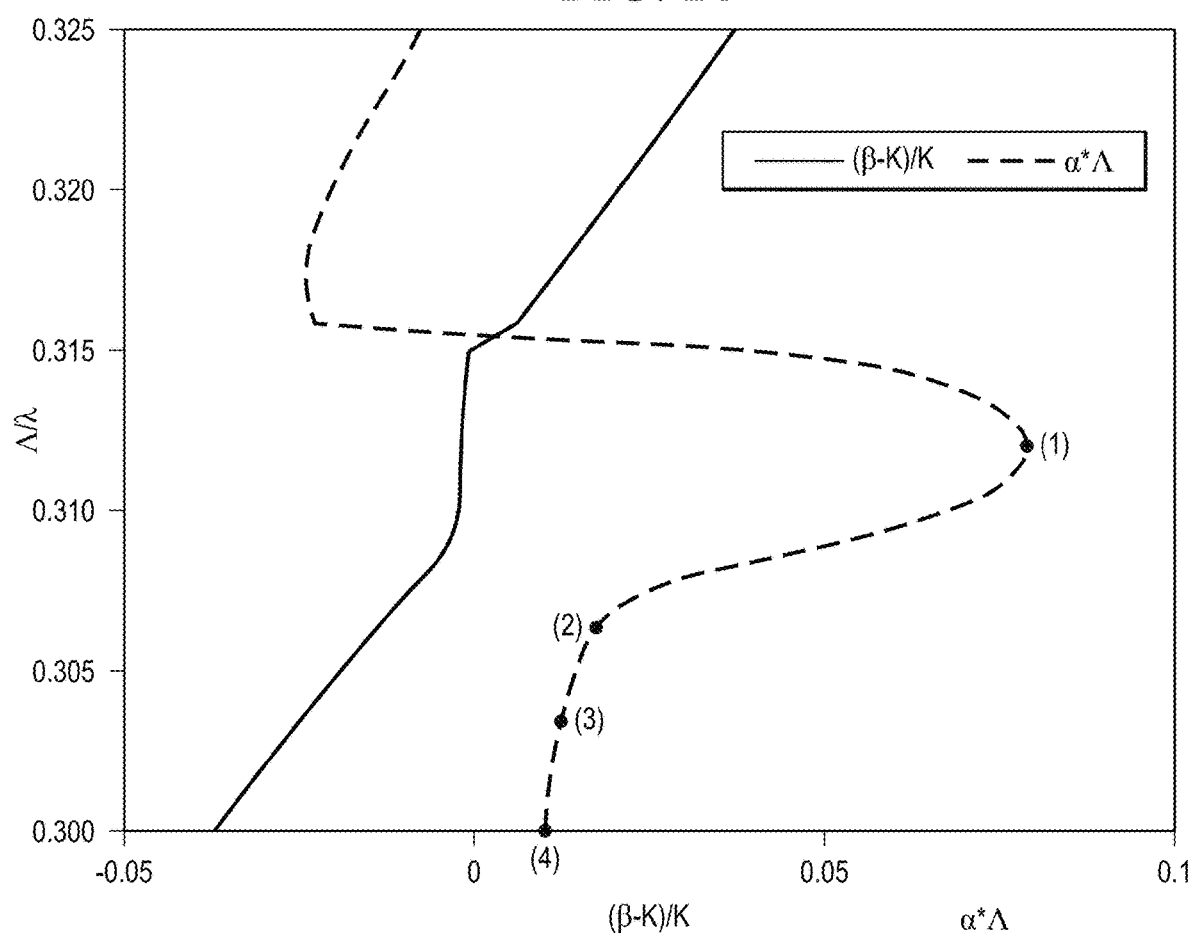
FIG. 20 shows the normalized reciprocal wavelength (Λ/λ) as a function of normalized longitudinal propagation constant (β/K) and normalized attenuation (αΛ) calculated using the Floquet Bloch approach for the ECS grating coupler shown in FIG. 19C and Table 4, assuming a 25 nm liner thickness. The points (1), (2), (3) and (4) correspond to a range of wavelengths (see FIG. 21) if the grating period is assumed to be constant. (Conversely, the points (1), (2), (3) and (4) correspond to a range of grating periods if the wavelength is assumed to be constant.)

FIG. 20 shows the calculated normalized complex propagation constants of the ECS grating coupler shown in FIG. 19C. The plot in FIG. 20 shows a plot of normalized reciprocal wavelength ($\Lambda/\lambda_o$) as a function of normalized real part of the longitudinal propagation constant ($\beta/K$) and normalized imaginary part of the longitudinal propagation constant (or attenuation) ($\alpha\Lambda$) calculated using the Floquet-Bloch approach for the ECS grating coupler shown in FIG. 19C and Table 4. For this structure, the light remaining in the grating waveguide is reduced by 1/e in N~13 grating periods or about 6.5 microns (since $\alpha\Lambda$~0.08) for a wavelength of 1550 nm and a grating period of 0.4882 microns.

FIG. 21 shows the fraction of incident power radiated down (◇), fraction of incident power radiated up (*), fraction of incident power reflected backwards (•), fraction of incident power transmitted forward (■); fraction of incident power radiated both upwards and downwards (▲) and the sum of the fractions of incident power reflected, transmitted and radiated (♦) as a function of wavelength (assuming a fixed grating with a 50% duty cycle) for the waveguide shown in FIG. 19C and Table 4. The deviation of the total power plot (♦) from unity indicates that the maximum error of the Floquet Bloch analysis is about 10% at a wavelength of 1550 nm and drops to less than 3% for wavelengths greater than 1560 nm. The points (1), (2), (3) and (4) in FIG. 21 correspond to the same four points shown in FIG. 20. These calculations assumed a grating length of 19.5 microns and a grating period of 0.4882 microns.

Figure 22A:
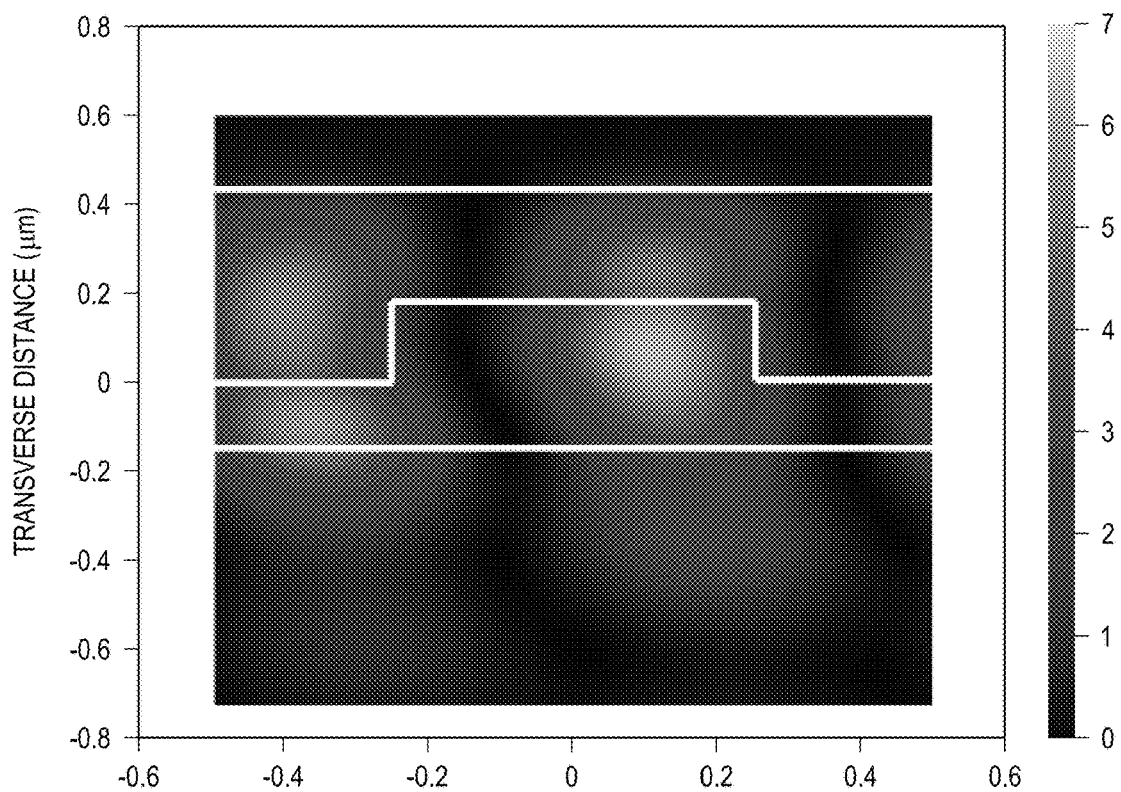
FIGS. 22A to 22D show.
Figure 22B:
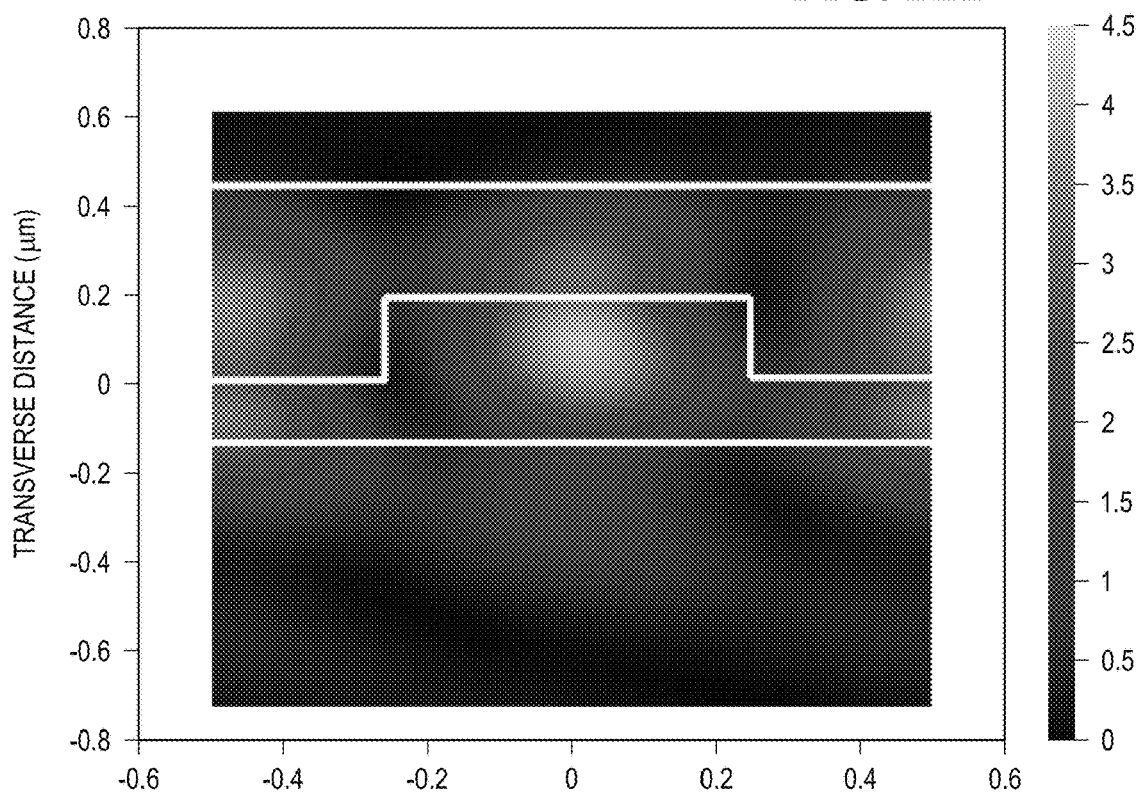
Figure 22C:
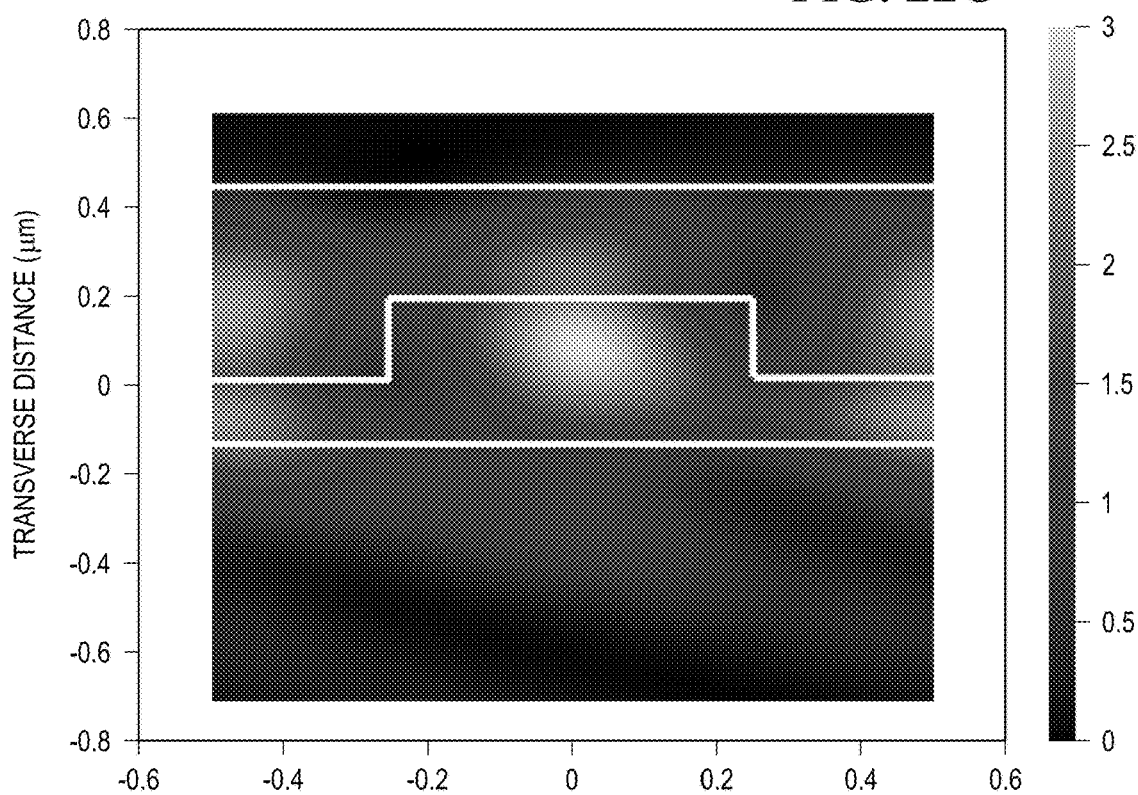
Figure 22D:
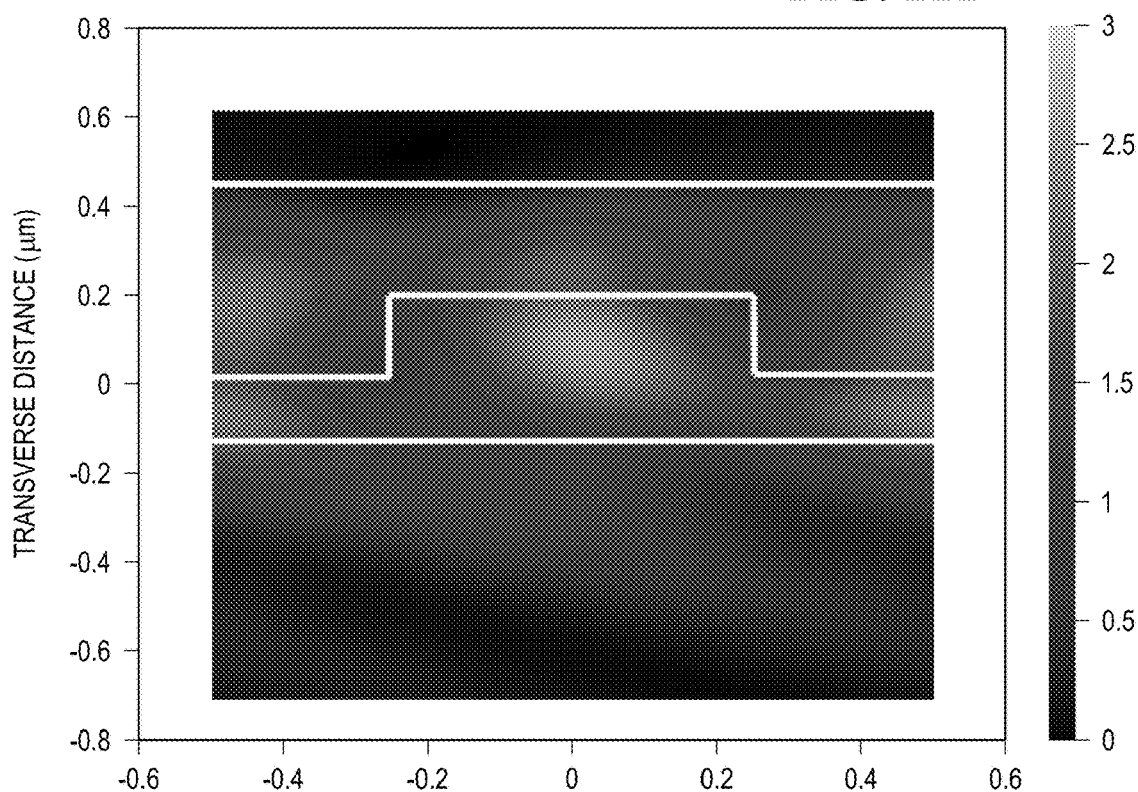
Figure 23A:
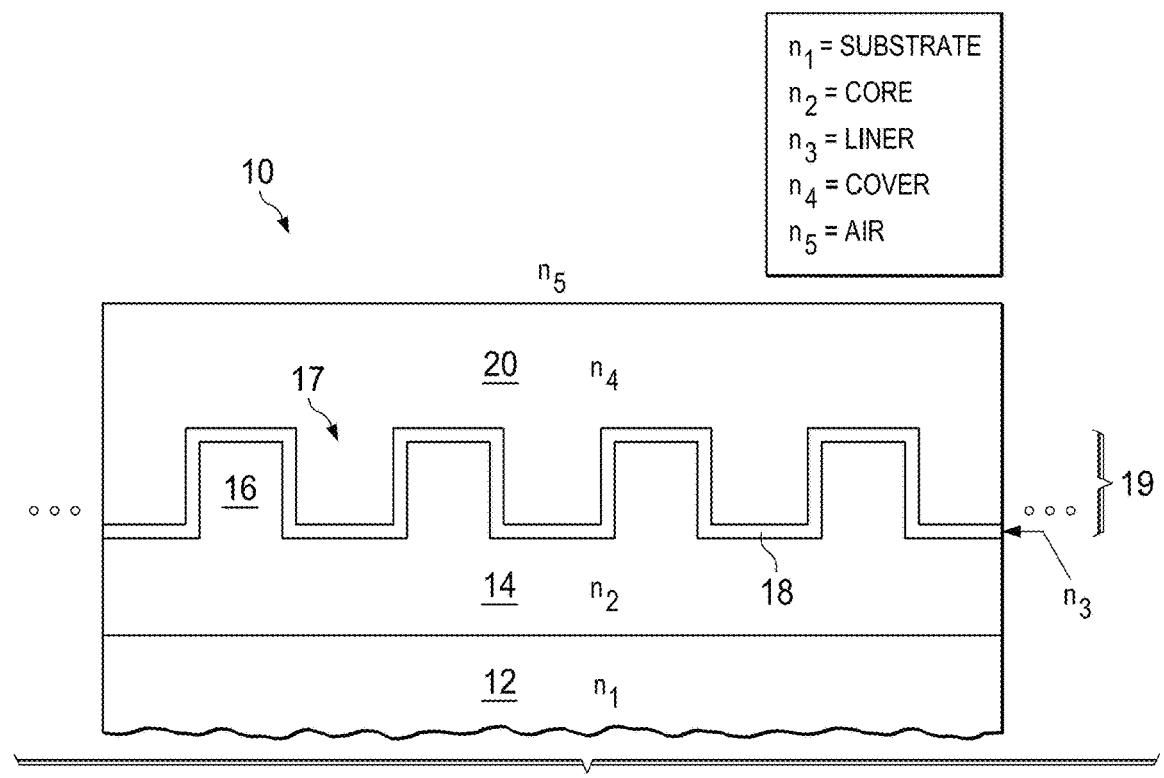
FIGS. 23A to 23H shows various embodiments of ECS gratings with a continuous liner layer of the present invention. The grating profile can be rectangular (FIG. 23A), sinusoidal (FIG. 23B), sawtooth (FIG. 23C), sawtooth with a flat region in the groove (FIG. 23D), blazed sawtooth (FIG. 23E), blazed sawtooth with a flat region in the groove (FIG. 23F), trapezoidal (FIG. 23G), and dovetail (FIG. 23H).
Figure 23B:
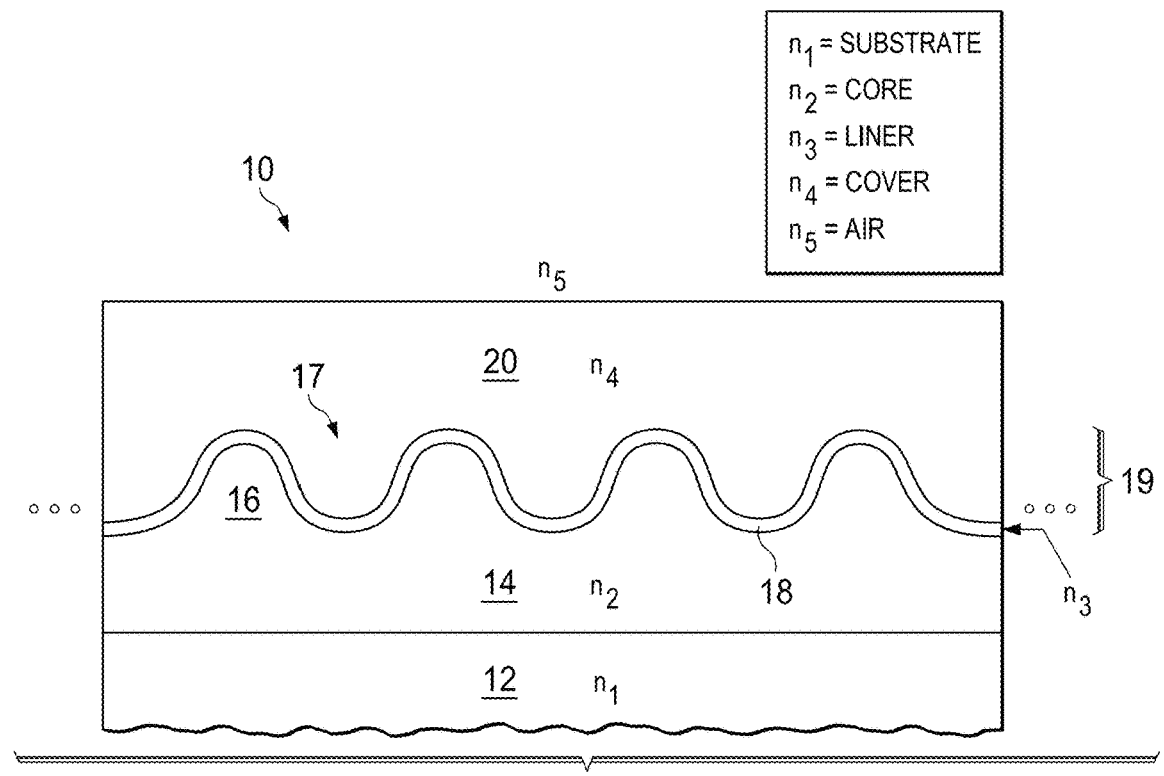
Figure 23C:
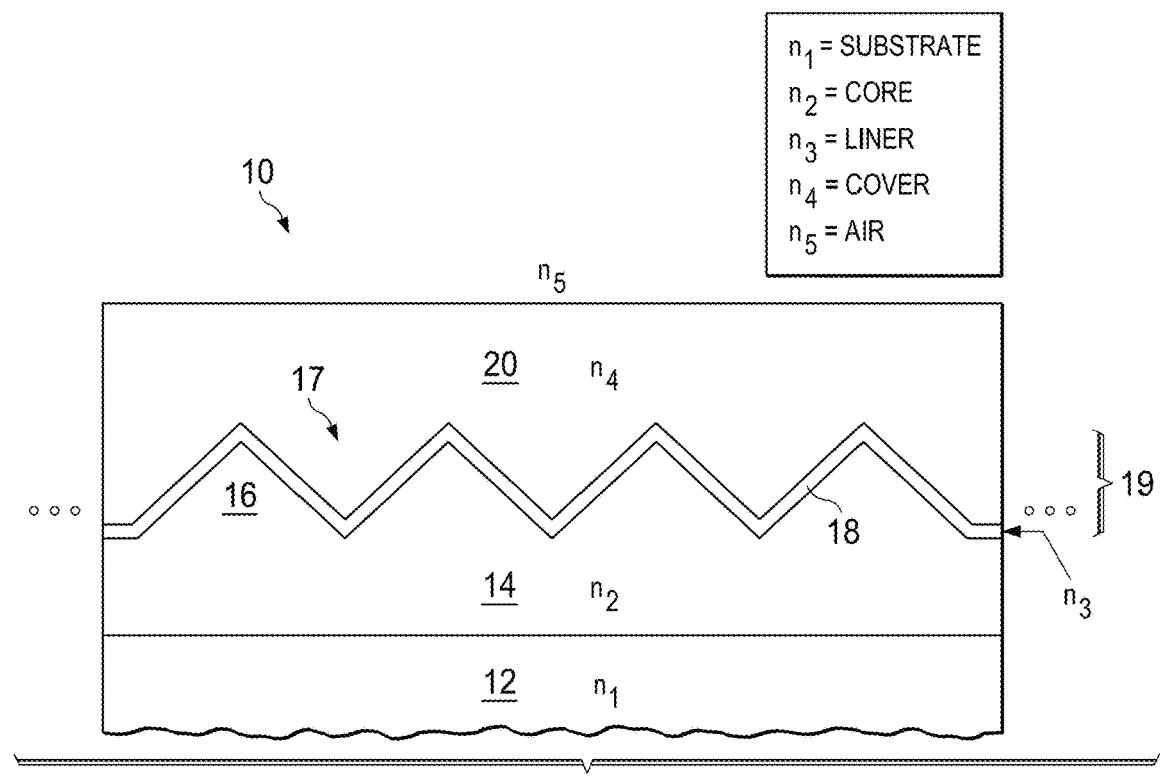
Figure 23D:
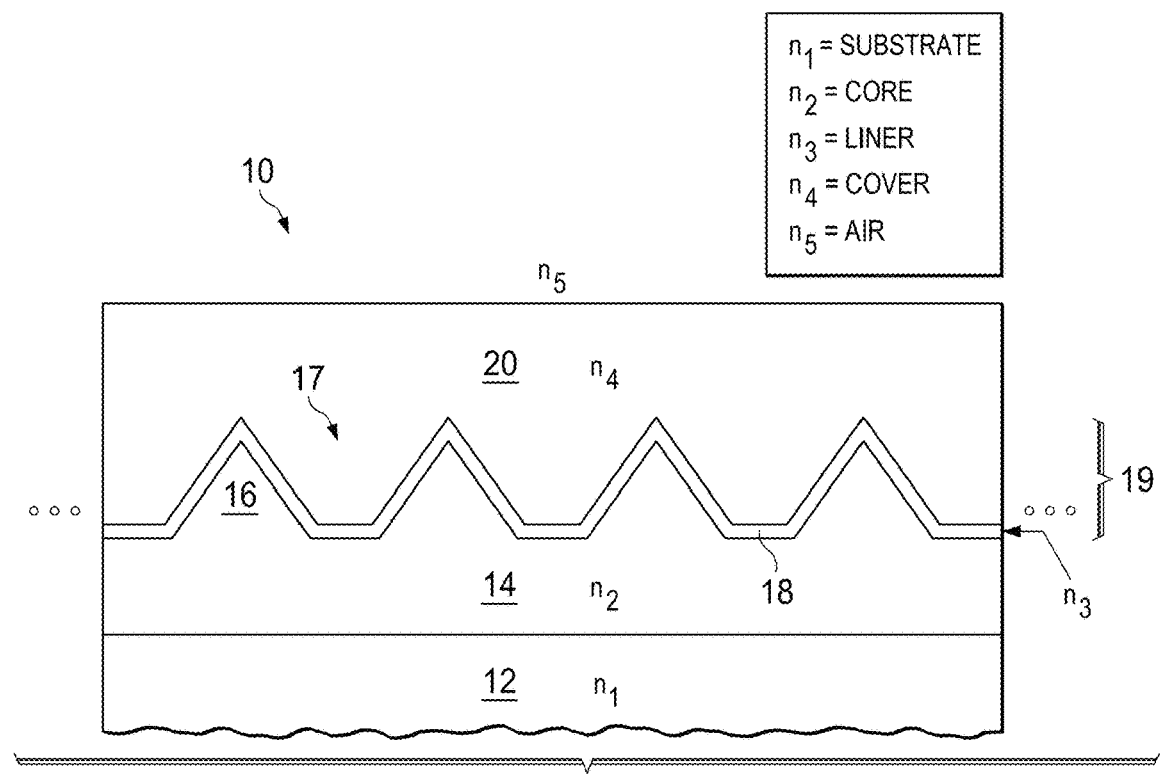
Figure 23E:
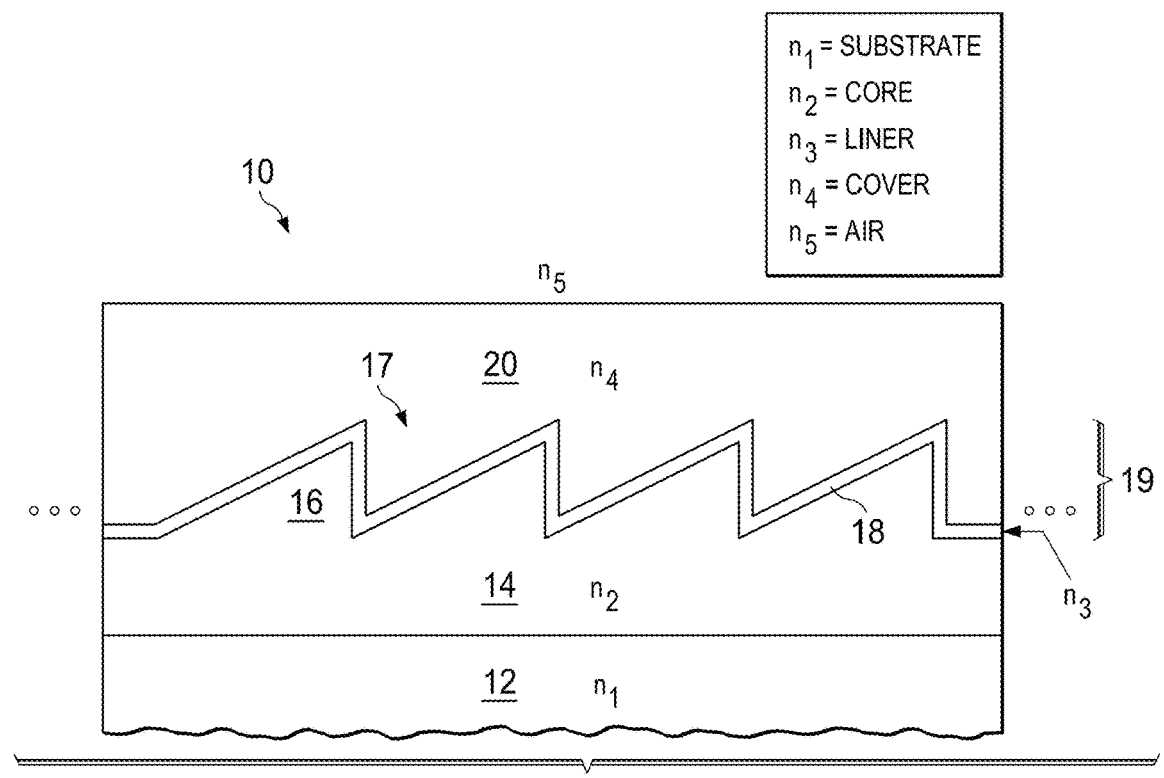
Figure 23F:
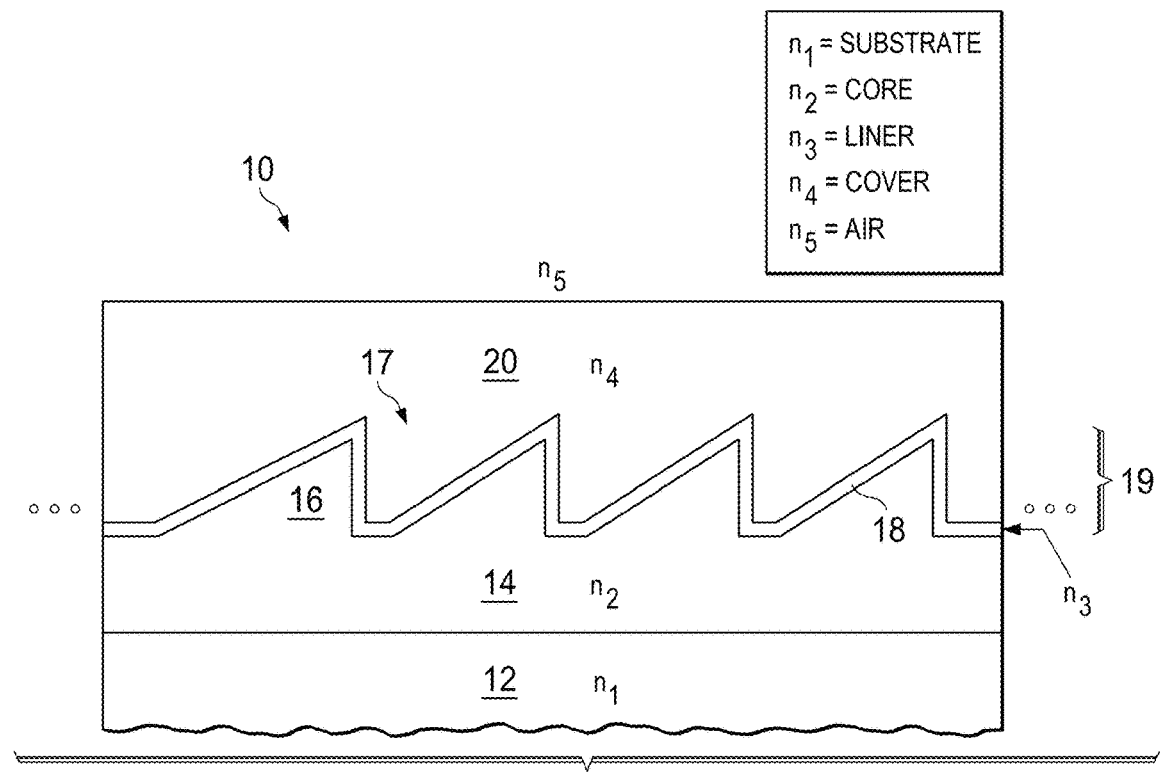
Figure 23G:
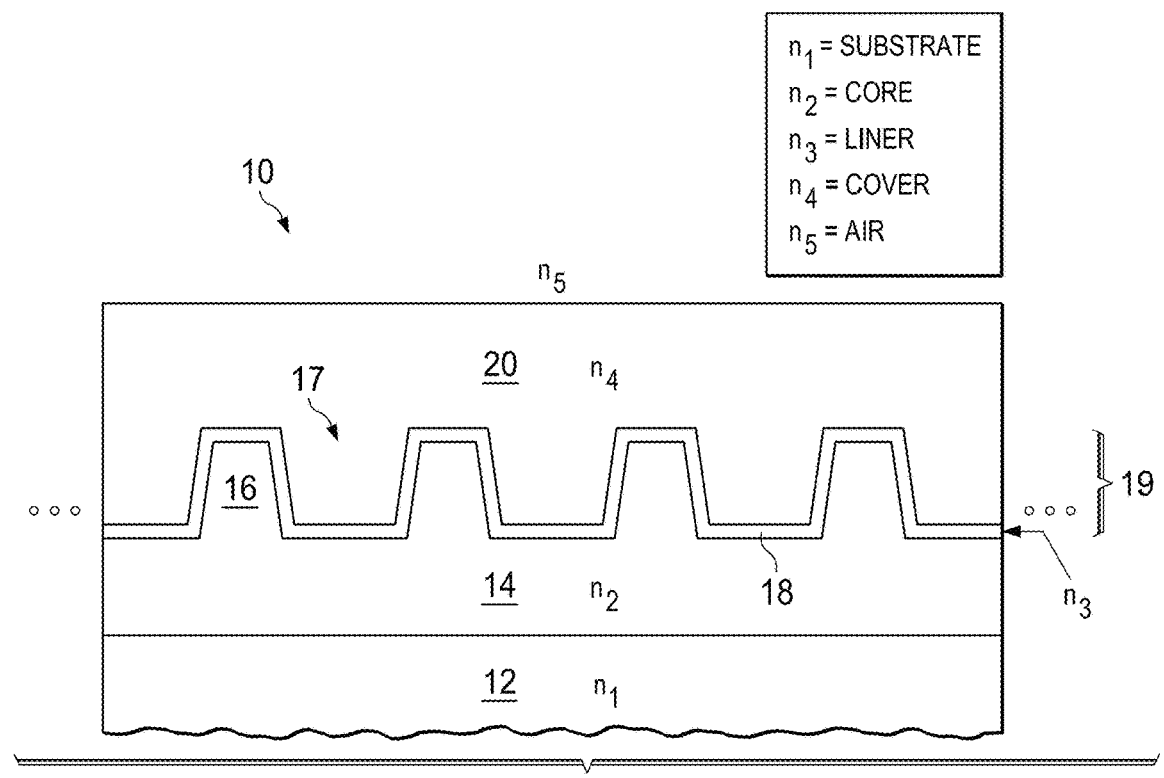
Figure 23H:
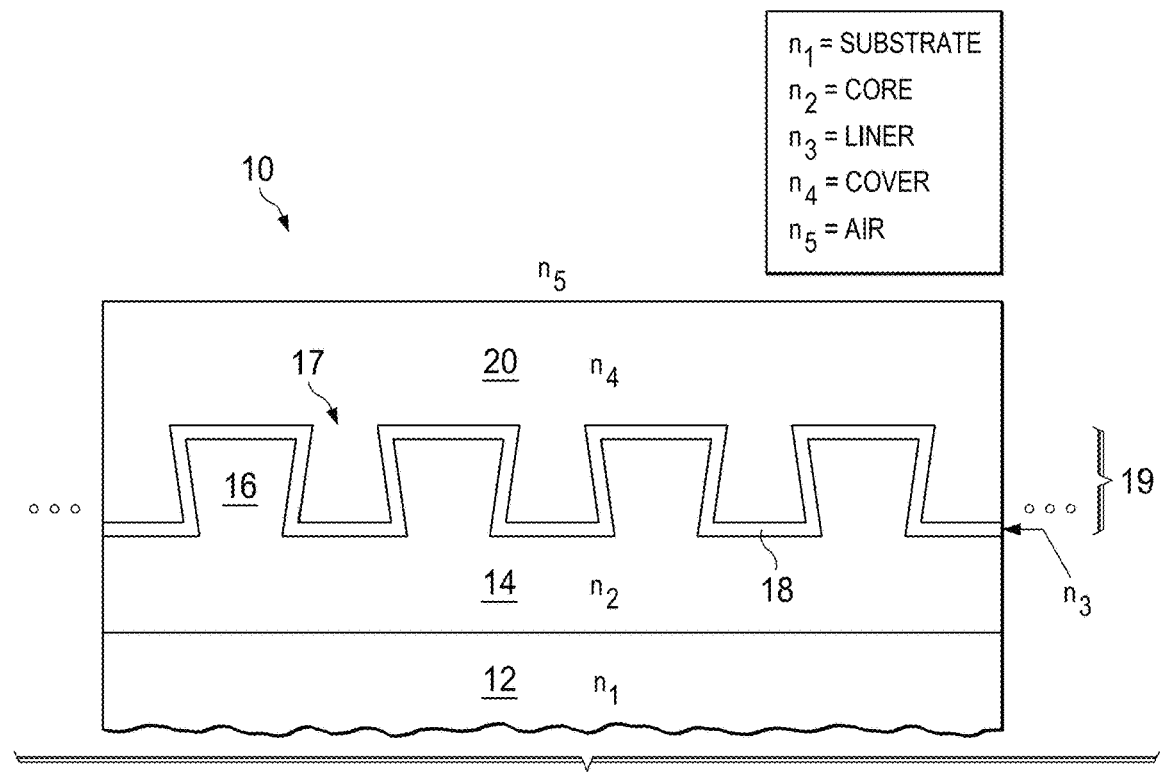

FIGS. 22A to 22D show: FIG. 22A shows the intensity distribution in the 5 QW grating waveguide region shown in FIG. 19C and Table 4 at point (1) in FIGS. 20 and 21, which is the peak of the attenuation curve and occurs at a wavelength of 1565 nm. At point (1) the total radiated power is ~20% and the total reflected power is ~80%, which illustrates that the wavelength of maximum attenuation is not the desired wavelength for maximum outcoupled radiation. FIG. 22B shows the intensity distribution in the 5 QW grating waveguide region shown in FIG. 19C and Table 4 at point (2) in FIGS. 20 and 21, which corresponds to the wavelength (1592 nm) at which the maximum total power is radiated (74%) and the reflected power is ~10%. FIG. 22C shows the intensity distribution in the 5 QW grating waveguide region shown in FIG. 19C and Table 4 at point (3) in FIGS. 20 and 21, which corresponds to the wavelength (1610 nm) at which the total power radiated is ~67% and the power reflected is low (~5%). FIG. 22D shows the intensity distribution in the 5 QW grating waveguide region shown in FIG. 19C and Table 4 at point (4) in FIGS. 20 and 21, which corresponds to the wavelength (1630 nm) at which the total power radiated is ~60% and the power reflected is very low (less than 1%). The white lines within the frame of the colored plots outline the ridges and grooves of the grating.

For wavelengths sufficiently far away from a Bragg resonance, the intensity distribution within a grating cycle remains constant along the direction of propagation.

FIGS. 23A to 23H shows a simple ECS grating waveguide 10 that includes a substrate 12 onto which a core 14 is grown or deposited that includes features or gratings 19 consisting of ridges 16 separated by grooves 17 with a continuous liner layer 18, shown in this embodiment to cover the ridges 16 and grooves 17, which together form a grating 19. The skilled artisan will recognize that FIGS. 23 to 30 are side views of the gratings structure in which the one or more gratings 19 appear as ridges 16, with grooves 17 therebetween. Disposed on the grating 10, is the liner layer 18 that is deposited or formed on the grating 19, Finally, a cover layer 20, is deposited on the liner layer 18. In certain examples, the gratings 19 can be designed to have a period that is equal to about the wavelength of the light propagating in the optical waveguide to produce an outcoupling in about 10 to 50 grating cycles. In this case, the grating is referred to as a second-order grating.

In another example, the gratings 19 can be defined as having a period that is equal to about half the wavelength of the light propagating in the optical waveguide, to produce in-plane reflection without outcoupling. The period and order of the grating $\Lambda$ is defined further by the Bragg condition as $\Lambda=n\lambda_m/2$ where n is an integer corresponding to the Bragg order, $\lambda_m$ is the wavelength of light in the waveguide ($\lambda_m=\lambda_o/n_{eff}$) and $n_{eff}$ is the effective index of the mode propagating in the waveguide. For a typical III-V waveguide at a free space wavelength of about 1550 nm, the effective index is about 3.3 and the first order grating period is close to ¼ micron and the second order grating period is close to ½ micron. The concept of this invention applies to waveguide gratings of any Bragg order. FIGS. 23A to 23H show examples of different, non-limiting, grating profiles that can be used with the present invention.

Figure 24:
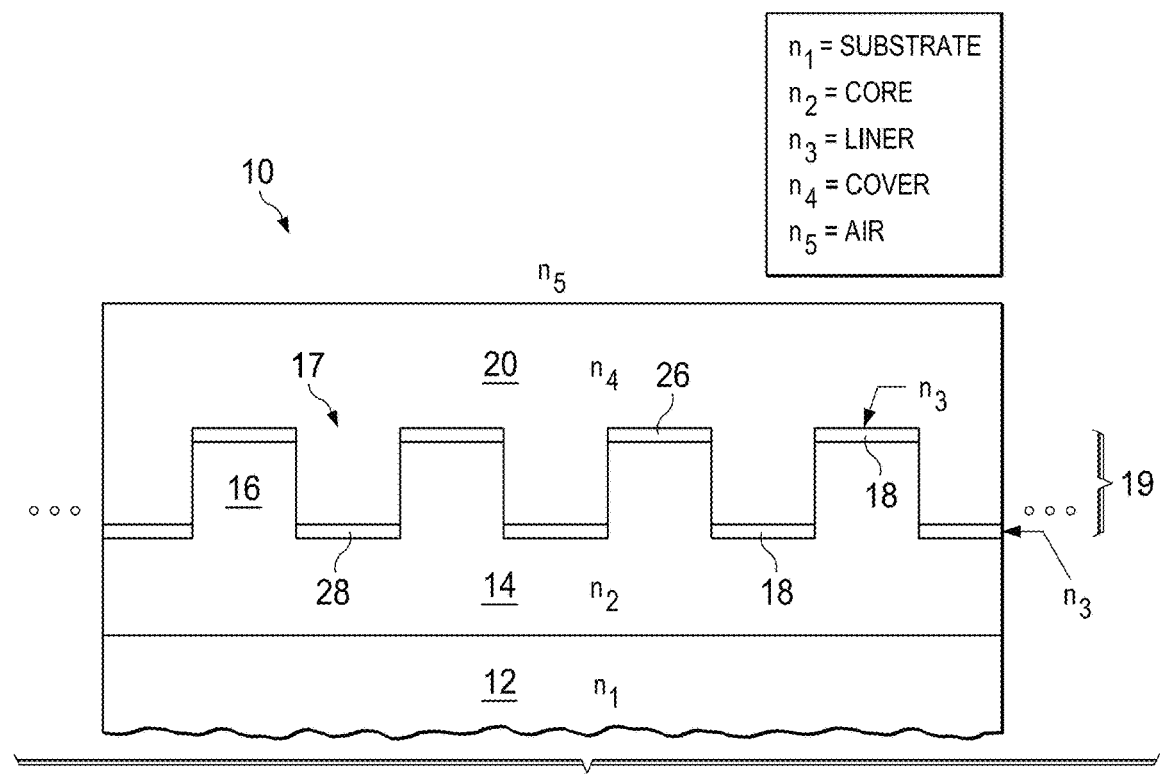
FIG. 24 shows an ECS grating with a segmented liner layer only on the bottoms and tops of the grating of the present invention.

FIG. 24 shows an alternative embodiment of the ECS grating waveguide 10 with a segmented cover layer only in the bottom of the groove 17 and the tops of the ridge 16, which are on a core 14 and substrate 12. As such, the liner layer 18 does not have to be continuous and can take many forms, as shown in FIGS. 24 through 30. Briefly, FIG. 24 shows the substrate 12, core 14 and ridges 16 separated by grooves 17. The cover layer 20 is deposited (after the liner layer is formed) on the exposed surfaces of the grating 19 and liner layer 18. The liner layer 18 can be made with a variable thickness to provide at least one of the following: variable strength of the coupling, an effective variable duty cycle, an effective variable grating depth, a Gaussian profile of the radiated field profile along the outcoupler grating, or a near-Gaussian profile of the radiated field profile along the outcoupler grating. In this embodiment, a liner layer 18 is not continuous and is shown as a top liner 26, which is on top of the ridges 16 and bottom liner 28, which is in the bottom of the groove 17.

Figure 25:
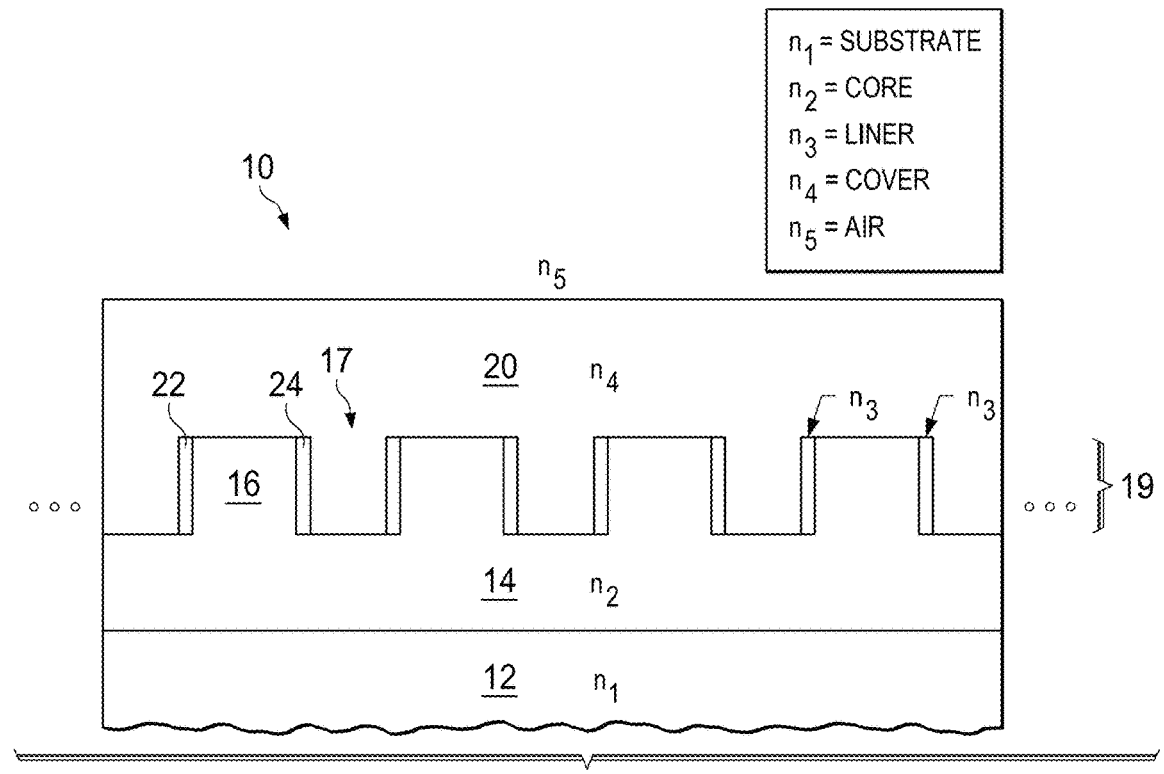
FIG. 25 shows an ECS grating with a segmented liner layer only on the sidewalls of the grating of the present invention.

FIG. 25 shows another embodiment of the ECS grating waveguide 10 with the core 14 and substrate 12, and in which a segmented liner layer formed only on the ridge 16 sidewall 22 and ridge sidewall layer 24. A cover layer 20 is deposited after the liner layer is formed.

Figure 26A:
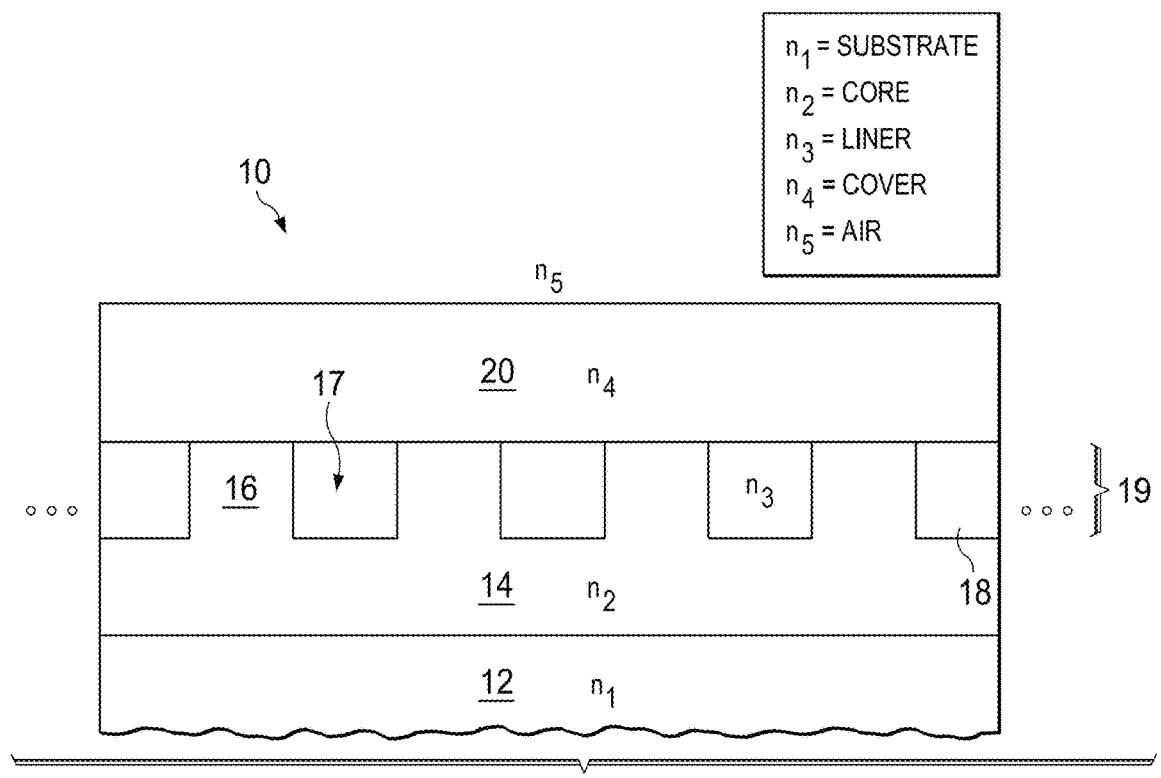
FIG. 26A shows an ECS grating with the grooves of the grating filled with liner material of the present invention.
Figure 26B:
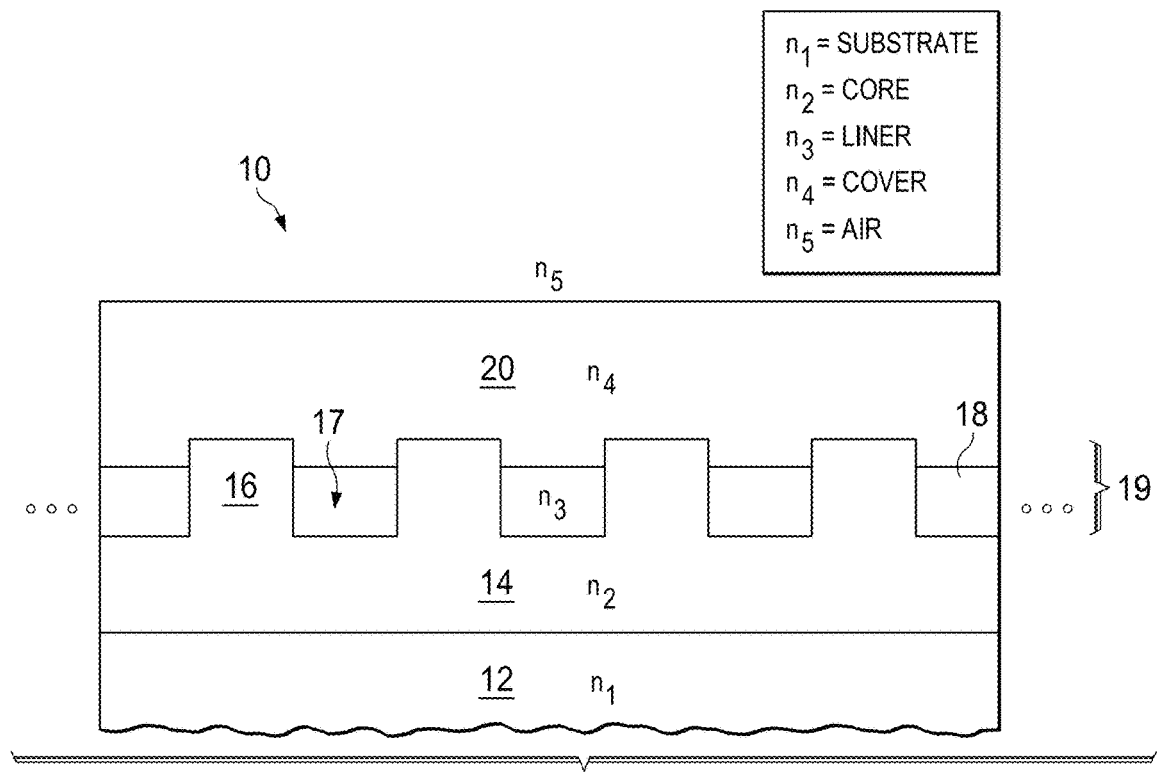
FIG. 26B shows an ECS grating with the grooves of the grating partially filled with liner material of the present invention.
Figure 26C:
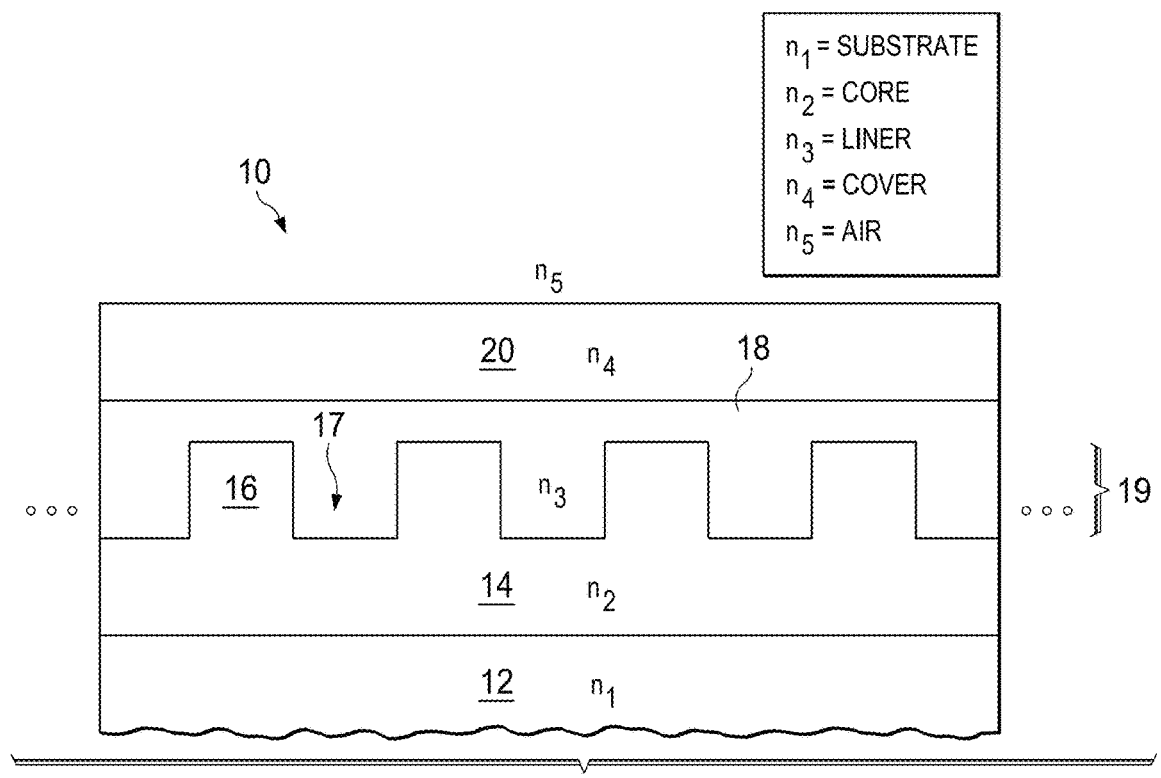
FIG. 26C shows an ECS grating with the grooves of the grating overfilled with liner material of the present invention.

FIG. 26A to 26C show three embodiments of the FCS grating waveguide 10, which include the core 14 and substrate 12. In FIG. 26A the grooves 17 between ridges 16 are filled with liner material that forms the liner layer 18 in the grooves 17. A cover layer 20 is deposited after the liner layer is formed. In FIG. 26B, the grooves 17 between the ridges 16 are partially filled with a liner material that forms the liner layer 18. A cover layer 20 is deposited after the liner layer is formed. In FIG. 26C, the grooves 17 between the ridges 16 are over filled with a liner material that extends above the ridges and forms the liner layer 18. The cover layer 20 is deposited after the liner layer is formed.

Figure 27:
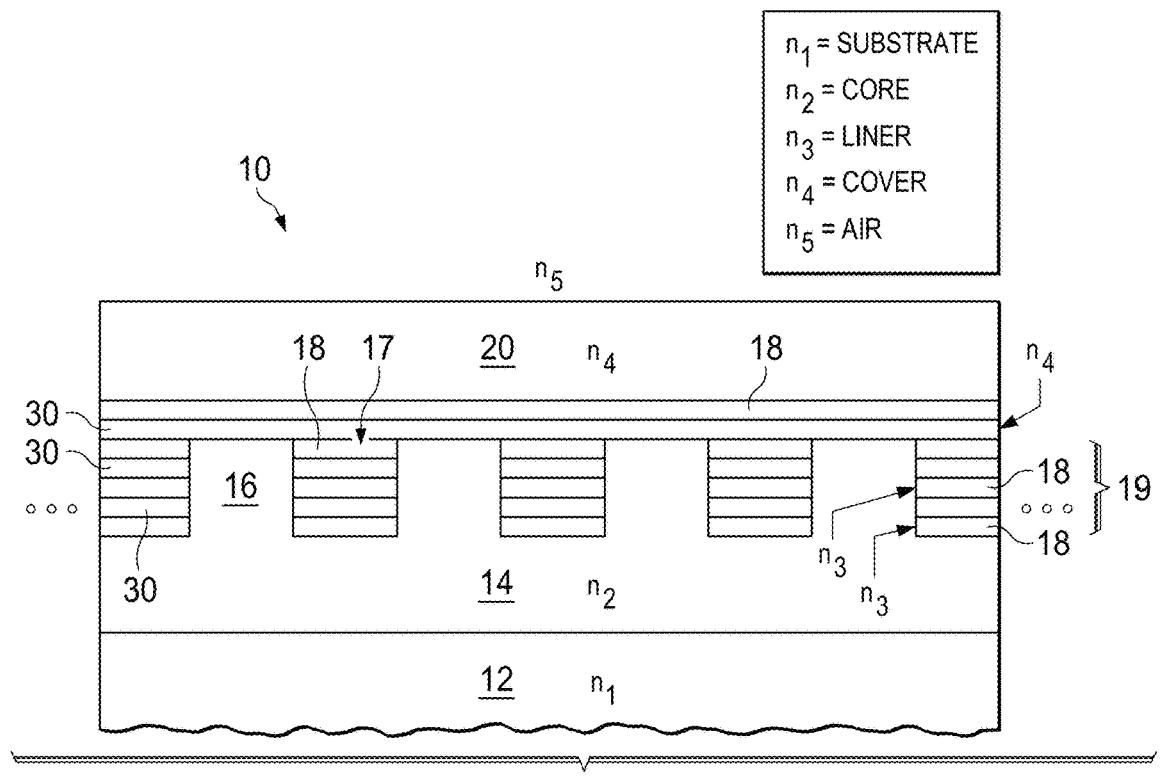
FIG. 27 shows an ECS grating with horizontal multi-layers of liner and cover layers of the present invention. The core of the waveguides can be low index or high index, with a contrasting liner layer and/or cover layer.

FIG. 27 shows another embodiment of the ECS grating waveguide 10 with horizontal multi-layers of multiple liner layers 18 and multiple cover layers layer 20, which are formed vertically within and outside the grooves 17 and over the ridges 16 (of course, they could also end at the top of the ridges 16). Not shown is a similar ECS grating with vertical multi-layers of liners and cover layers.

Figure 28:
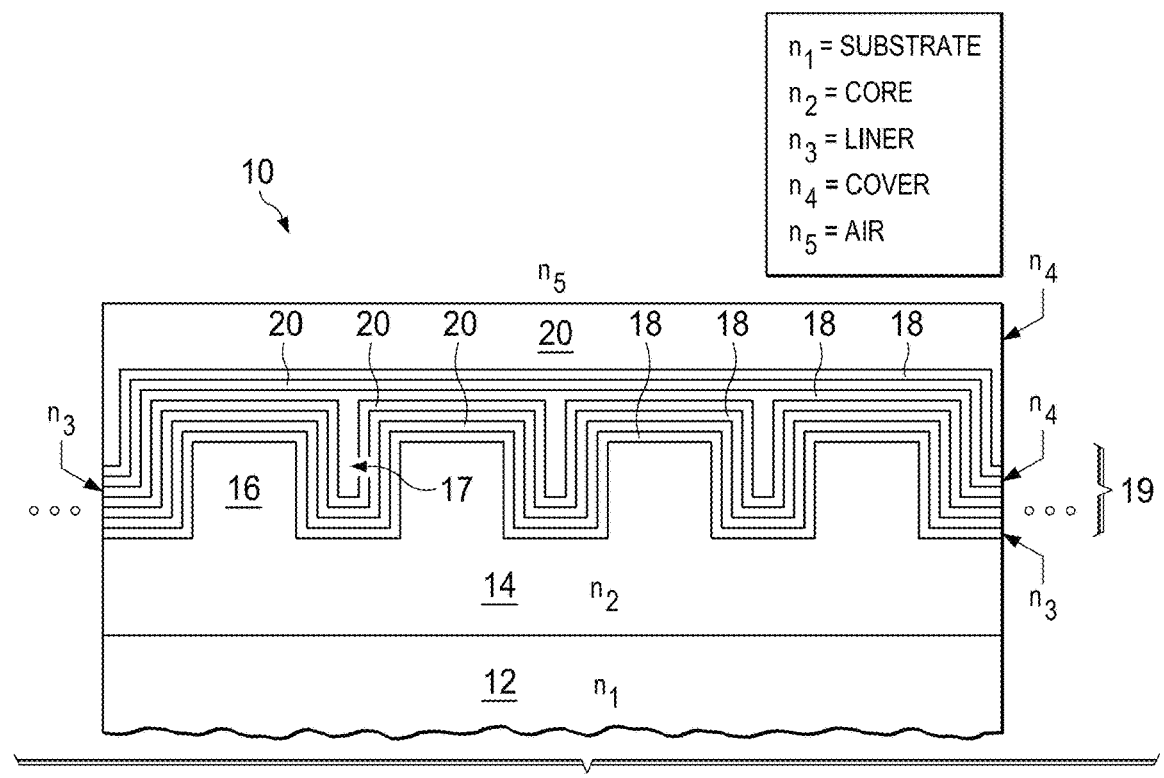
FIG. 28 shows an ECS grating with multi-layers of liners and cover layers on all surfaces of the grating of the present invention.

FIG. 28 shows another embodiment of the ECS grating waveguide 10 with multi-layers of liner layers 18 and cover layers 20 on all surfaces of the ridges 16 and grooves 17, wherein each layer of the liner layer 18 and cover layer 20 are deposited in an alternating manner and that coat or follow the contour of the ridges 16 and the grooves 17.

Figure 29:
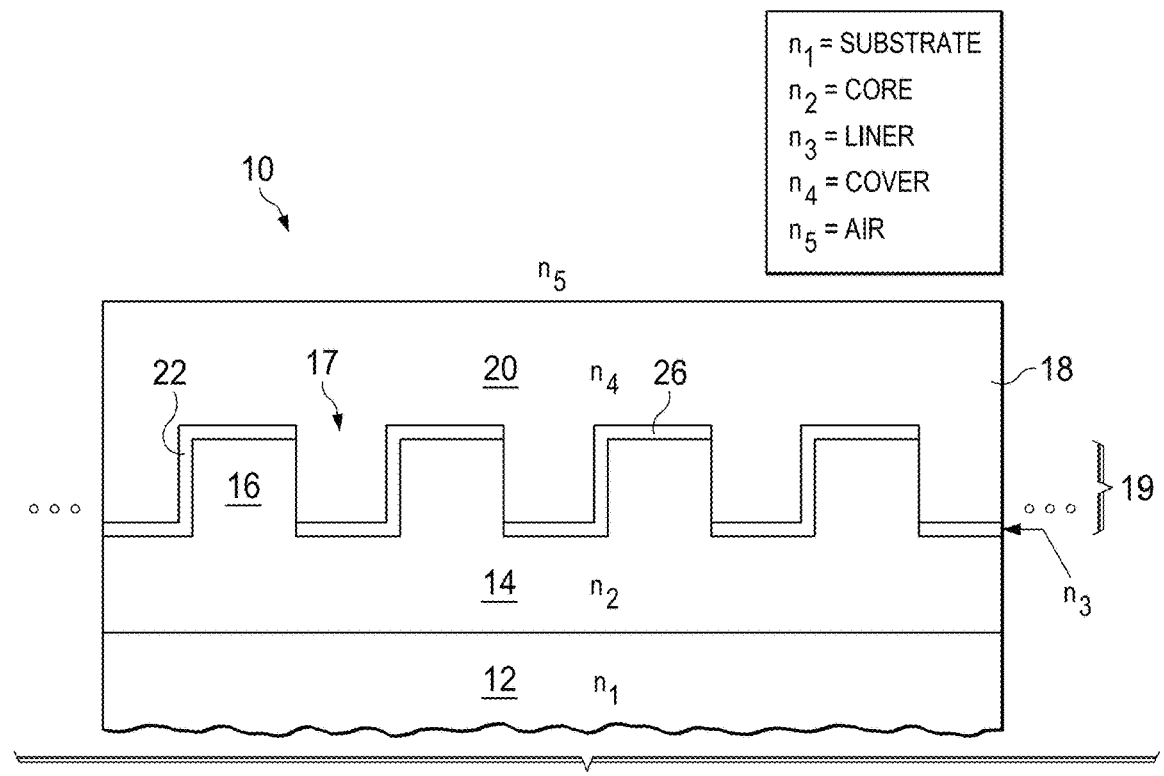
FIG. 29 shows an ECS grating with asymmetric liner layer of the present invention resulting in an effective blazed grating.

FIG. 29 shows another embodiment of the ECS grating waveguide 10, which includes a core 14 on a substrate 12, and in this embodiment includes an asymmetric liner layer 18 that covers the bottom of the groove 17, a sidewall of the ridge 22 and the top of the ridge 16. After the liner layer 18 is formed, the cover layer 20 is deposited.

Figure 30:
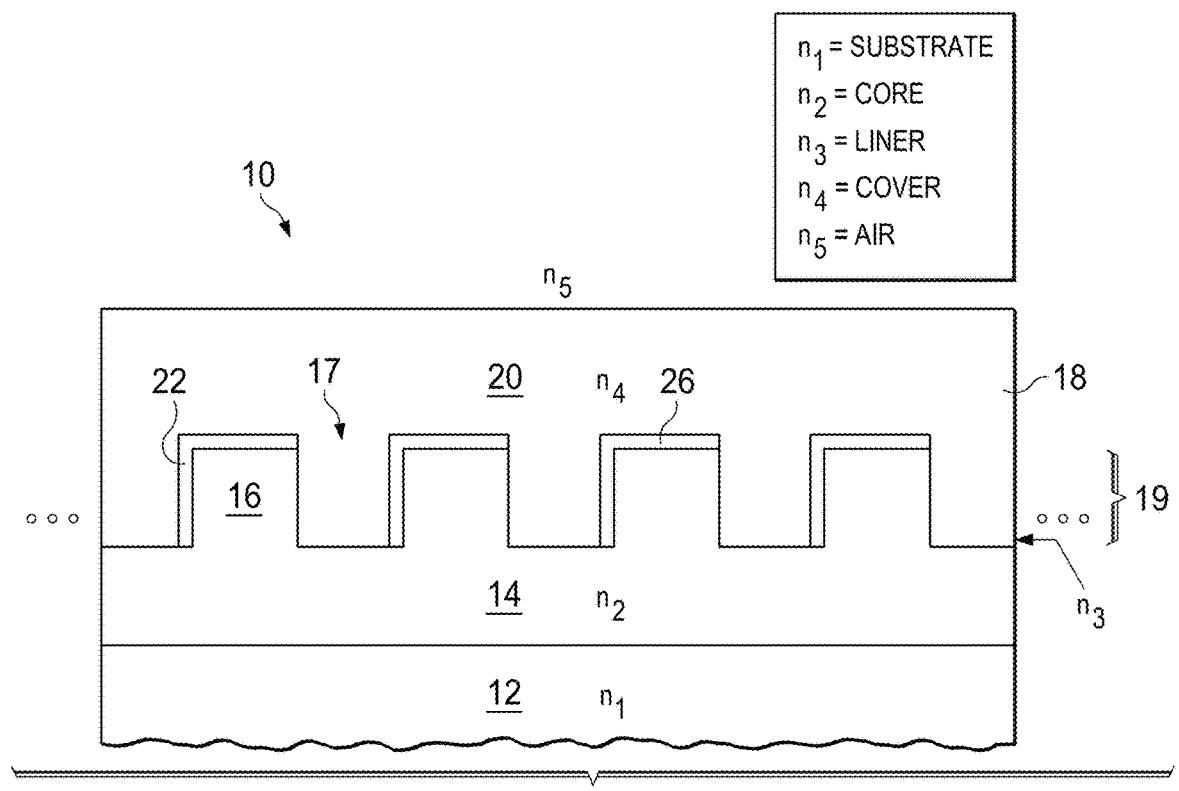
FIG. 30 shows an alternate configuration of an asymmetric liner ECS grating of the present invention.

FIG. 30 shows an alternate configuration of an asymmetric liner layer ECS grating waveguide 10, which includes the core 14 on a substrate 12, and in this embodiment includes an asymmetric liner layer 18 that covers a sidewall layer 22 and the top of the ridge 16. After the liner layer is formed, the cover layer 20 is deposited. The configurations of FIGS. 29 and 30 can be used to form an effective blazed grating.

Figure 31A:
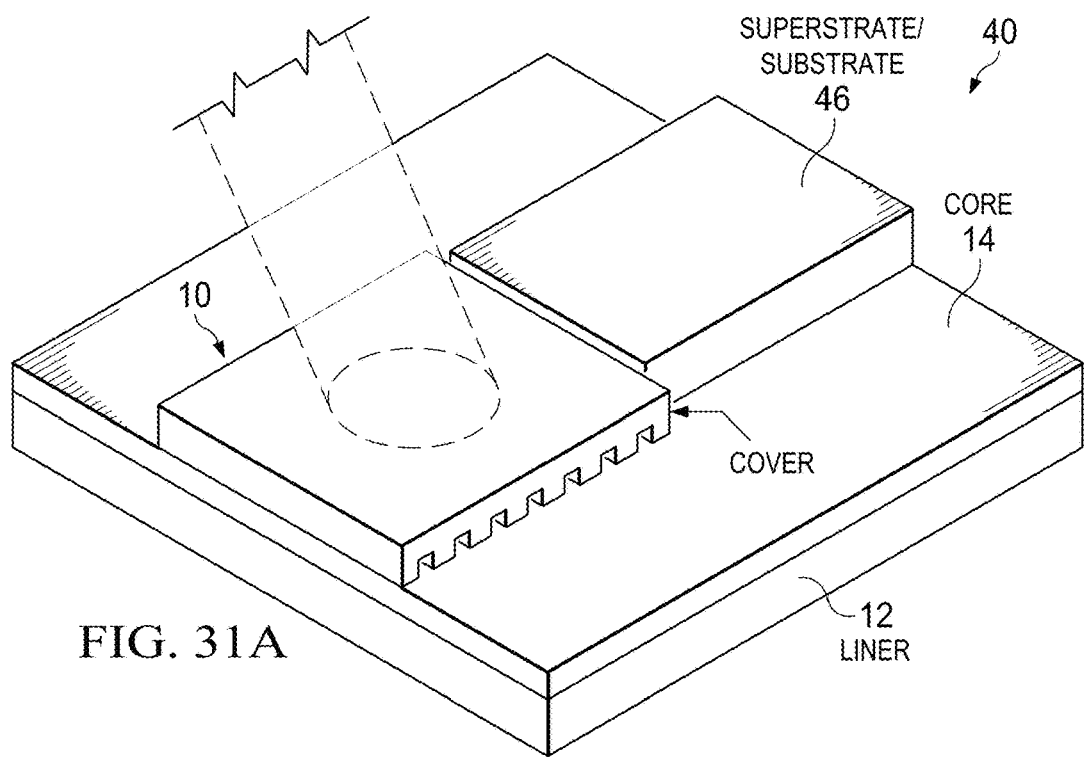
FIG. 31A is a sketch of an ECS grating coupler region on a simple waveguide such as shown in FIG. 5. A gray circular beam is shown indicating light radiated from the ECS grating coupler at an angle to the normal to the surface. In the following figures, the same gray color is used to indicate photoresist.
Figure 31B:
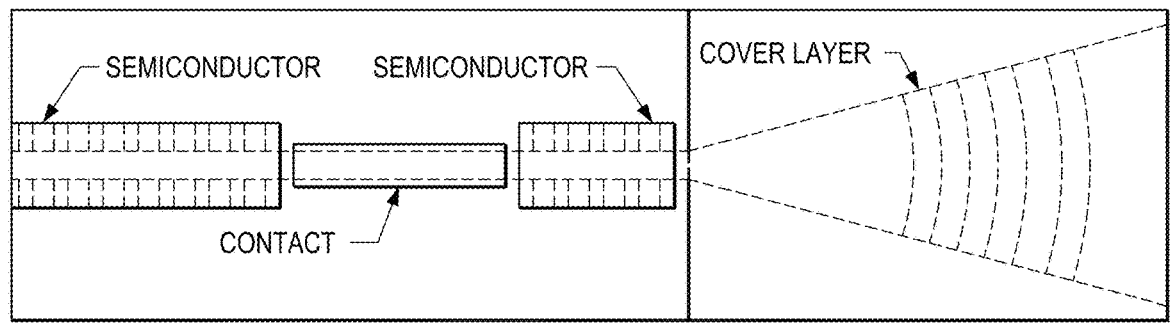
FIG. 31B is a top view of an ECS grating coupler integrated with a DBR laser and shows how a narrow (0.1 to 5 microns) mesa waveguide can be expanded in a very short distance to produce an ECS grating with dimensions of about 10 microns by 10 microns for efficient coupling to fiber optics and/or other grating waveguide couplers.
Figure 31C:
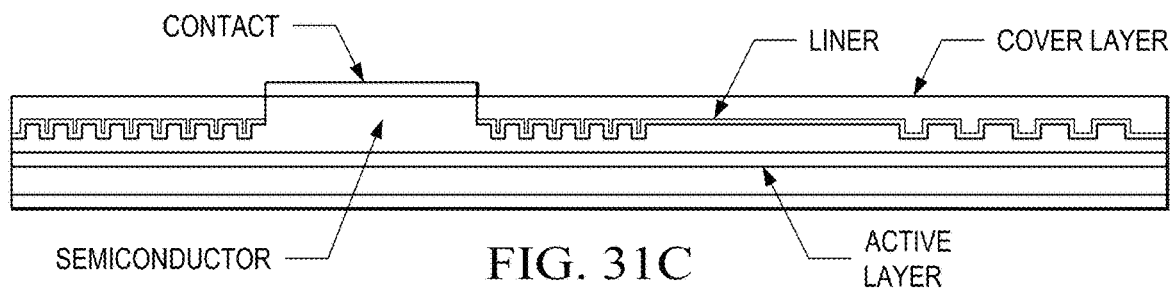
FIG. 31C is a side view of the integrated ECS grating coupler of FIG. 31B. Although
Figure 31D:
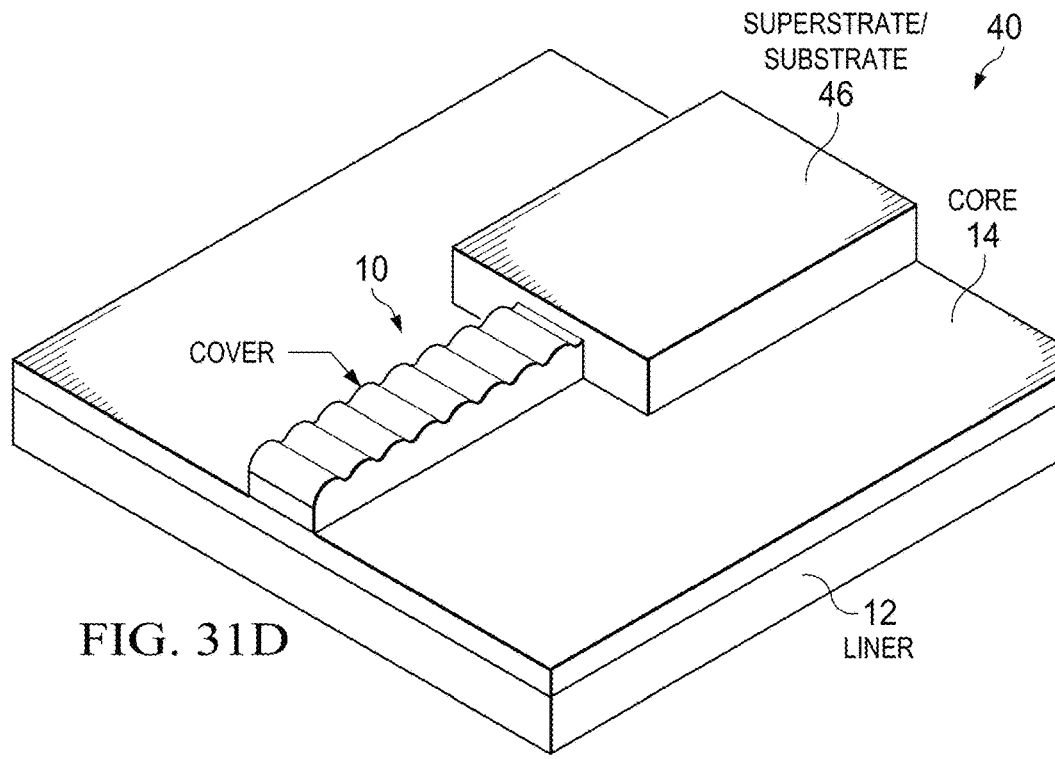
FIG. 31D shows an alternative form of the waveguide mesa in which the gratings are positioned on the top of the mesa.
Figure 31E:
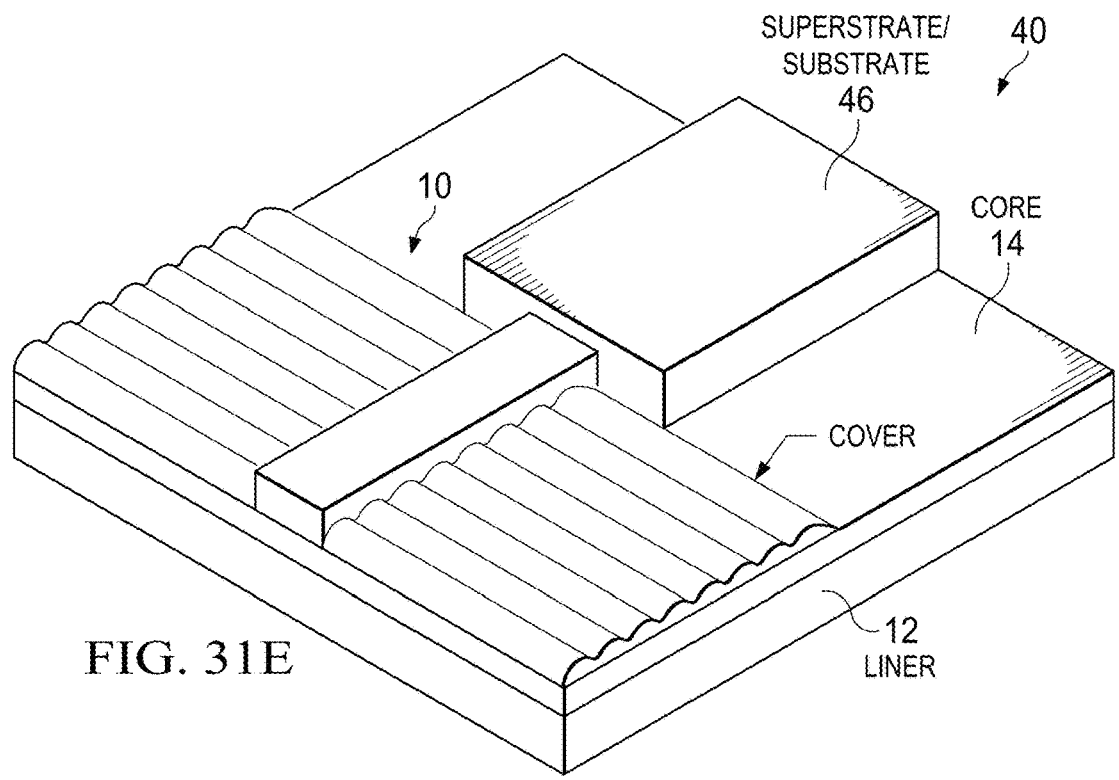
FIG. 31E shows the waveguide on the top surface just outside the mesa, and 31F shows the waveguide positioned along the sides of the mesa.
Figure 31F:
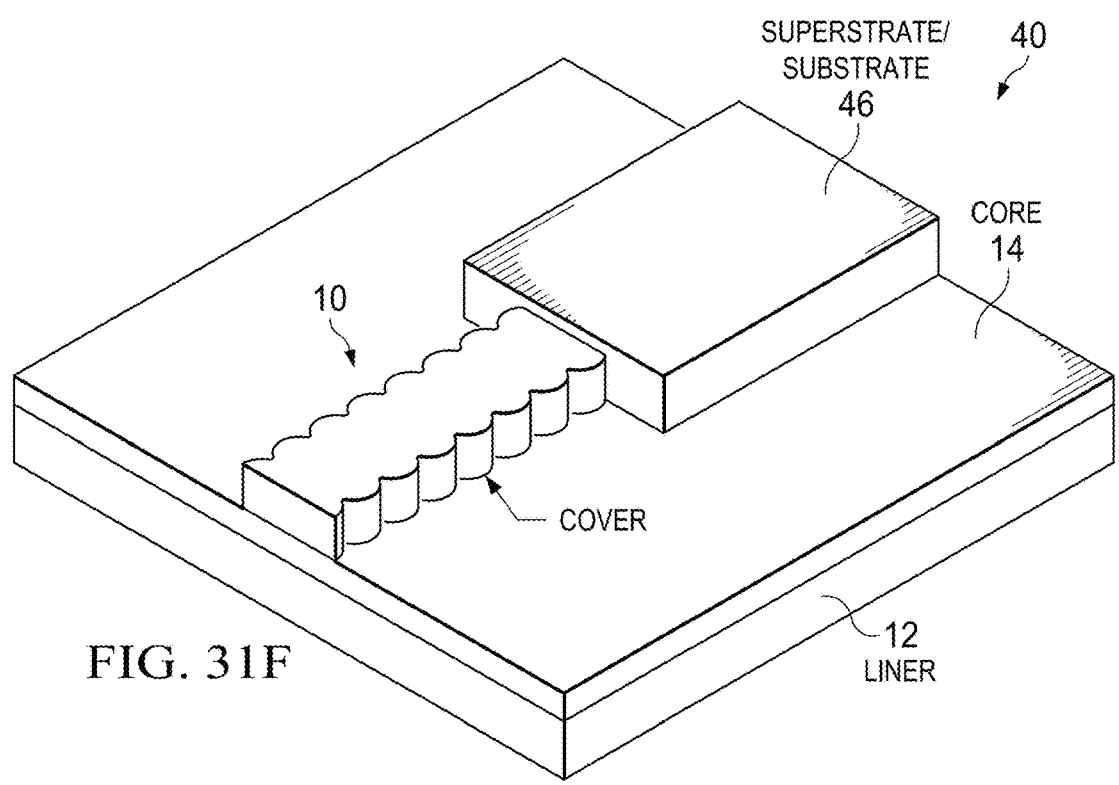
FIG. 31G shows that the gratings can occur on both top surfaces or on both top surfaces and the sides of the mesa.
Figure 31G:
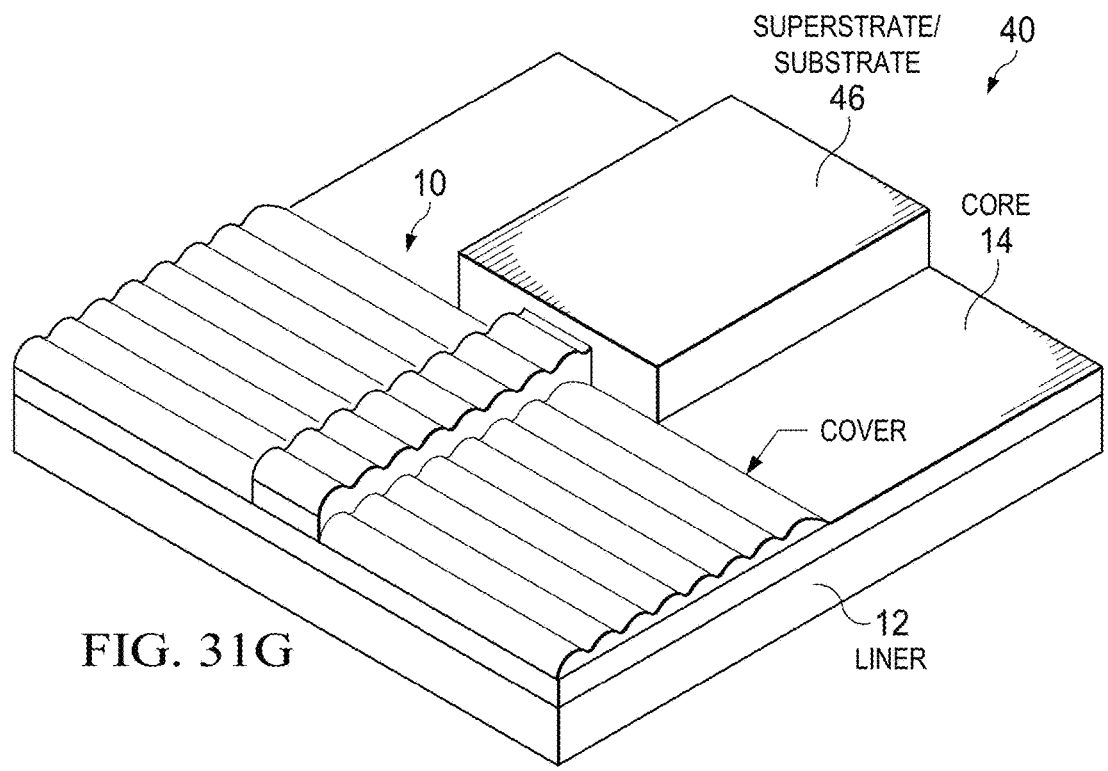

FIG. 31A shows an isometric view of an ECS grating waveguide device 40 on a simple waveguide such as shown in FIGS. 5 and 6. FIGS. 31A to 31F also shows a mesa-waveguide structure to provide lateral confinement. In this figure, light is emitted from the device 10 that is formed on a substrate 12 and core 14 below the mesa waveguide 46. The following figures show one non-limiting example of how an ECS grating 10 that is part of a waveguide 40 may be fabricated in accordance with the present invention and can also be understood with, e.g., FIGS. 23 to 30, which show various non-limiting embodiments of the present invention, which the skilled artisan will be able to construct using standard deposition, etching, photolithographic and other techniques as disclosed herein. FIG. 31B is a top view of an ECS grating coupler integrated with a DBR laser and shows how a narrow (0.1 to 5 microns) mesa-waveguide can be expanded in a very short distance to produce an ECS grating with dimensions of about 10 microns by 10 microns for efficient coupling to fiber optics and/or other grating waveguide couplers. FIG. 31C is a side view of the integrated ECS grating coupler of FIG. 31B. FIG. 31D shows an alternative form of the waveguide mesa in which the gratings are positioned on the top of the mesa, FIG. 31E shows the waveguide on the top surface just outside the mesa, and 31F shows the waveguide positioned along the sides of the mesa. FIG. 31G shows that the gratings that can occur on both top surfaces or on both top surfaces and the sides of the mesa.

Most of the figures herein have been shown with a one-dimensional cross-section in the x direction (x direction being defined as perpendicular to the direction of light propagating in the waveguide in the z direction). However, it is common to etch a continuous mesa aligned along the z direction. Once a mesa is etched to constrain the light in the y direction in addition to the x direction, then there is the choice of: (1) forming the grating over both the top of the mesa and the surface outside the mesa (FIG. 31B); (2) placing the grating just on the top of the mesa (FIG. 31D, or mainly on top of the mesa—there may be remnants of a grating outside the mesa due to fab methods); (3) placing the grating just outside the mesa (FIG. 31E); and (4) wherein the sides of the mesa can be a grating (FIG. 31F).

FIG. 32 shows the initial step in fabricating an ECS grating coupler 40 requires covering the substrate or wafer 12 with layers 14 and 42 used to make the waveguide with photoresist 44 (also shown in this embodiment with a core 14), and a superstrate 42. The left, middle and right view corresponds to the end, side and top view of a section of the wafer 12.

FIG. 33 shows a second step in fabricating an ECS grating coupler 40 that shows the definition in photoresist 44 of a mesa waveguide 46 in which the photoresist 44 is exposed and developed to form a pattern on the superstrate 42. The left, middle and right view corresponds to the end, side and top view of a section of the substrate or wafer 12.

FIG. 34 shows a third step in fabricating an ECS grating coupler 40 that defines the mesa waveguide 46 by etching away a section of the superstrate 42. The left, middle and right view corresponds to the end, side and top view of a section of the substrate or wafer 12. The etch can be, e.g., a wet etch, a plasma etch, an ion beam etch (IBE), a reactive ion etch (RIE), an induction coupled plasma (ICP) etc., or equivalent etch.

FIG. 35 shows a fourth step in fabricating an ECS grating coupler 40 that protects the mesa waveguide 46 with photoresist 44 and defines a grating in photoresist 48. The photoresist grating 48 can be formed by several procedures such as, e.g., holography, e-beam writing, or standard lithography. The left, middle and right view corresponds to the end, side and top view of a section of the wafer.

FIG. 36 shows a fifth step in fabricating an ECS grating coupler 40 is replicating the photoresist grating 48 into the waveguide by any of several etching procedures such as, e.g., wet etching, plasma etching, ion beam etching, reactive ion etching, chemically assisted ion beam etching, or inductively coupled plasma etching. The photoresist 48 will be removed prior to the next processing step. The left, middle and right view corresponds to the end, side and top view of a section of the wafer.

FIG. 37 shows a sixth step in fabricating an ECS grating coupler 40, in which a liner layer 50 (made with a material such as silicon dioxide or silicon nitride) is deposited over a high index superstrate material 42 that was etched in the previous step. The left, middle and right view corresponds to the end, side and top view of a section of the wafer. (Note: If the superstrate material consisted of a low index material, the liner layer would be made from a high index material such as amorphous Si.)

FIG. 38 shows a final step in fabricating an ECS grating coupler 40 in which a high index cover layer 52 (such as amorphous silicon, or a III-V material, such as GaAs, AlGaAs, GaP, InP, InGaAsP, AlGaInAs, or AlGaInAsP) is deposited over the low index liner layer 50. The left, middle and right view corresponds to the end, side and top view of a section of the wafer. The wavelength of light can be varied from visible, ultraviolet, and/or infrared depending on the materials used to make the device.

The discussion so far in this patent has concentrated on gratings used for coupling radiation into or out of an optical waveguide or on gratings used for in-plane reflection for feedback. However this invention applies to all types of gratings, such as multiple periodic gratings [26], distributed Bragg reflectors [27], and grating assisted directional couplers [20].

It will be understood that particular embodiments described herein are shown by way of illustration and not as limitations of the invention. The principal features of this invention can be employed in various embodiments without departing from the scope of the invention. Those skilled in the art will recognize, or be able to ascertain using no more than routine experimentation, numerous equivalents to the specific procedures described herein. Such equivalents are considered to be within the scope of this invention and are covered by the claims.

All publications and patent applications mentioned in the specification are indicative of the level of skill of those skilled in the art to which this invention pertains. All publications and patent applications are herein incorporated by reference to the same extent as if each individual publication or patent application was specifically and individually indicated to be incorporated by reference.

The use of the word "a" or "an" when used in conjunction with the term "comprising" in the claims and/or the specification may mean "one," but it is also consistent with the meaning of "one or more," "at least one," and "one or more than one." The use of the term "or" in the claims is used to mean "and/or" unless explicitly indicated to refer to alternatives only or the alternatives are mutually exclusive, although the disclosure supports a definition that refers to only alternatives and "and/or." Throughout this application, the term "about" is used to indicate that a value includes the inherent variation of error for the device, the method being employed to determine the value, or the variation that exists among the study subjects.

As used in this specification and claim(s), the words "comprising" (and any form of comprising, such as "comprise" and "comprises"), "having" (and any form of having, such as "have" and "has"), "including" (and any form of including, such as "includes" and "include") or "containing" (and any form of containing, such as "contains" and "contain") are inclusive or open-ended and do not exclude additional, unrecited elements or method steps.

The term "or combinations thereof" as used herein refers to all permutations and combinations of the listed items preceding the term. For example, "A, B, C, or combinations thereof" is intended to include at least one of: A, B, C, AB, AC, BC, or ABC, and if order is important in a particular context, also BA, CA, CB, CBA, BCA, ACB, BAC, or CAB. Continuing with this example, expressly included are combinations that contain repeats of one or more item or term, such as BB, AAA, AB, BBC, AAABCCCC, CBBAAA, CABABB, and so forth. The skilled artisan will understand that typically there is no limit on the number of items or terms in any combination, unless otherwise apparent from the context. In certain embodiments, the present invention may also include methods and compositions in which the transition phrase "consisting essentially of" or "consisting of" may also be used.

As used herein, words of approximation such as, without limitation, "about", "substantial" or "substantially" refers to a condition that when so modified is understood to not necessarily be absolute or perfect but would be considered close enough to those of ordinary skill in the art to warrant designating the condition as being present. The extent to which the description may vary will depend on how great a change can be instituted and still have one of ordinary skilled in the art recognize the modified feature as still having the required characteristics and capabilities of the unmodified feature. In general, but subject to the preceding discussion, a numerical value herein that is modified by a word of approximation such as "about" may vary from the stated value by at least ±1, 2, 3, 4, 5, 6, 7, 10, 12 or 15%.

All of the compositions and/or methods disclosed and claimed herein can be made and executed without undue experimentation in light of the present disclosure. While the compositions and methods of this invention have been described in terms of preferred embodiments, it will be apparent to those of skill in the art that variations may be applied to the compositions and/or methods and in the steps or in the sequence of steps of the method described herein without departing from the concept, spirit and scope of the invention. All such similar substitutes and modifications apparent to those skilled in the art are deemed to be within the spirit, scope and concept of the invention as defined by the appended claims.

REFERENCES

U.S. Pat. No. 7,006,732 B2 February 2006 Gunn et al.
U.S. Pat. No. 7,068,887 B1 June 2006 Gunn et al.
U.S. Pat. No. 6,775,427 B2 August 2004 Evans.
U.S. Patent Application No.: 20020008215 Evans.
1. "Semiconductor Lasers and Heterojunction LEDs", H. Kressel and J. K. Butler, Academic Press, 1977.
2. "Diode Lasers and Photonic Integrated Circuits," L. A. Coldren and S. W. Corzine, John Wiley and Sons, 1995.
3. "Photonics: Optical Electronics in Modern Communications," $6^{th}$ edition, A. Yariv and P. Yeh, Oxford University Press, 2007.
4. "Silicon Photonics II: Components and Integration," David J. Lockwood and Lorenzo Pavesi (Eds.), Springer-Verlag Berlin Heidelberg 2011.
5. Dirk Taillaert, Peter Bienstman, and Roel Baets, "Compact efficient broadband grating coupler for silicon-on-insulator waveguides," OPTICS LETTERS, Vol. 29, No. 23, Dec. 1, 2004 p. 2749.
6. Johan Backlund, Jorgen Bengtsson, Carl-Fredrik Carlstrom, and Anders Larsson, "Input waveguide grating couplers designed for a desired wavelength and polarization response" APPLIED OPTICS, Vol. 41, No. 15, 20 May 2002.
7. Dirk Taillaert, Harold Chong, Peter I. Borel, Lars H. Frandsen, Richard M. De La Rue, and Roel Baets, "A Compact Two-Dimensional Grating Coupler Used as a Polarization Splitter," IEEE PHOTONICS TECHNOLOGY LETTERS, VOL. 15, NO. 9, SEPTEMBER 2003 p. 1249.
8. Soref, R. A., and Bennett, B. R., "Electrooptical effects in silicon," IEEE J. Quant. Electron., QE-23, 123-129, 1987.
9. Lee, K. K., Lim, D. R., Kimerling, L. C., Shin, J., and Cerrina, F., "Fabrication of ultra-low loss Si/SiO2 waveguides by roughness reduction," Opt. Lett. 26, 1888-1890, 2001.
10. Rowe, L. K., Elsey, M., Tarr, N. G., Knights, A. P., and Post, E., "CMOScompatible optical rib waveguides defined by local oxidation of silicon," Electronics Letters, 43, 392-393, 2007.
11. Doylend, J. K., and Knights, A. P., "Design and simulation of an integrated fiber-to-chip coupler for silicon-on-insulator waveguides," IEEE J. Sel. Top. Quantum Electron., 12, 1363-1370, 2006.
12. Fijol, J. J., Fike, E. E., Keating, P. B., Gilbody, D., LeBlanc, J. J., Jacobson, S. A., Kessler, W. J., and Frish, M. B., Fabrication of silicon-on-insulator adiabatic tapers for low-loss optical interconnection of photonic devices, Proc. SPIE, 4997, 157-170, 2003.
13. Day, I., Evans, I., Knights, A., Hopper, F., Roberts, S., Johnston, J., Day, S., Luff, J., Tsang, H., and Asghari, M., "Tapered silicon waveguides for low insertion-loss highly efficient high-speed electronic variable attenuators," Proc. IEEE Opt. Fiber Commun. Conf., Vol. 1, pp. 249-251, IEEE, Piscataway, N.J. (2003).
14. Ang, T. W., Reed, G. T., Vonsovici, A., Evans, G. R., Routley, P. R., and Josey, M. R., "Highly efficient unibond silicon-on-insulator blazed grating couplers," Appl. Phys. Lett., 77, 4214-4216, 2000.
15. Taillaert, D., Chong, H., Borel, P. I., Frandsen, L. H., De La Rue, R. M., and Baets, R., "A compact two-dimensional grating coupler as a polarization splitter," IEEE-Phon.Tech.Letts., 15, 1249-1251, 2003.
16. Bogaerts, W., Taillaert, D., Dumon, P., Pluk, E., Van Thourhout, D., Baets, R., A Compact Polarization-Independent Wavelength Duplexer Using a Polarization-Diversity SOI Photonic Wire Circuit, OFC/NFOEC, 20072007.
17. Almeida, V. R., Panepucci, R. R., and Lipson, M., "Nanotaper for compact mode conversion," Opt. Lett., 28, 1302-1304, 2003.
18. C. Elachi, G. Evans, and C. Yeh, "Transversely Bounded DFB Lasers," JOSA, Vol. 65, No. 4, April 1975.
19. G. Hadjicostas, J. Butler, G. A. Evans, N. W. Carlson, and R. Amantea, "A Numerical Investigation of Wave Interactions in Dielectric Waveguides with Periodic Surface Corrugations," IEEE Journal of Quantum Electronics, Vol. 26, No. 5, pp. 893-902, May 1990.
20. J. K. Butler, N. H. Sun, G. A. Evans, L. Pang, and P. Congdon, "Grating Assisted Coupling of Light Between Semiconductor and Glass Waveguides," Journal of Lightwave Technology, Vol. 16, No. 6, pp. 1038-1048, June, 1998.
21. "Surface Emitting Semiconductor Lasers and Arrays", Ed. G. A. Evans and J. M. Hammer, Academic Press, 1993.
22. Finite Element Methods for Maxwell's Equations, Peter Monk, Oxford University Press, 2003.
23. J. K. Butler, W. E. Ferguson, G. A. Evans, P. Stabile, and A. Rosen, "A Boundary Element Technique Applied to the Analysis of Waveguides with Periodic Surface Corrugations," IEEE Journal of Quantum Electronics, Vol. 28, No. 7, pp. July 1992.
24. A. Taflove and S. Hagness. Computational Electrodynamics: The Finite-Difference Time-Domain Method, 3 ed. Artech House, Boston, Mass., 2005.
25. M. Achtenhagen, N. V. Amarasinghe, G. A. Evans, "High-power distributed Bragg reflector lasers operating at 1065 nm," IEE Electronic Letters, Vol. 43, No. 14, 5 Jul. 2007.25.
26. David H. Seib, "Multiply Resonant Distributed-Feedback Lasers" Journal of Quantum Electronics, VOL. QE-12, NO. 1, January 1976.
27. H. Stoll, "Distributed Bragg deflector: a multifunctional integrated optical device," APPLIED OPTICS, Vol. 17, No. 16/15, August 1978.

What is claimed is:

1. A method of making a grating comprising:
   depositing on a first portion of substrate, a core on the substrate, a superstrate on the core, and a photoresist on the superstrate;
   etching the superstrate to the core;
   etching through a grating mask formed on the core to form the grating comprising one or more ridges and one or more grooves, wherein the one or more grooves are adjacent to, or between the one or more ridges;
   removing the grating mask;
   depositing a liner layer on the grating, wherein a first material having an index of refraction ($n_{core}$) is selected for the core and ridges, and a second material having an index of refraction ($n_{liner}$) is selected for the liner layer, wherein the first and second materials are selected to provide a first difference in the index of refraction sufficient to provide a contrast therebetween; and
   depositing an amorphous or crystalline cover layer on the liner layer, wherein a third material is selected for the amorphous or crystalline cover layer having an index of refraction ($n_{cover}$) to provide a second difference in the index of refraction between the second material and the third material, and the third material is not the same as the first material.

2. The method of claim 1, wherein the grating comprises at least a portion of a waveguide.

3. The method of claim 2, wherein the optical waveguide is at least one of a distributed Bragg reflectors (DBRs) or a distributed Bragg deflectors (DBDs).

4. The method of claim 2, wherein the optical waveguide is defined further as comprising at least two ECS gratings to make an edge-emitting DBR laser; one ECS grating and one regular DBR grating to make an edge-emitting DBR laser; two ECS gratings with a straight ECS outcoupler grating to make a surface-emitting laser; ECS grating and one regular DBR grating with a straight ECS outcoupler grating to make a surface-emitting laser; two ECS gratings with a "fan-out" ECS outcoupler grating to make a surface-emitting laser; one ECS grating and one regular DBR grating with a "fan-out" ECS outcoupler grating to make a surface-emitting laser; two ECS gratings with a standard grating outcoupler grating to make a surface-emitting laser; one ECS grating and one regular DBR grating with a standard grating outcoupler grating to make a surface-emitting laser; one or more ECS grating output couplers with low back reflection on both ends to make a surface-normal coupled semiconductor optical amplifier (SOA) or optical gain block; or one or more ECS gratings or regular DBR gratings configures as a mirror with high reflectivity and another ECS grating as an output coupler to make a surface-emitting reflective semiconductor optical amplifier (RSOA) or an optical gain block; a hybrid external cavity laser and tunable laser using SOA or RSOA with ECS grating output couplers integrated with a waveguide or free space wavelength control optics; or an enhanced grating for high density and low loss integration of III/V laser sources for silicon photonic interconnects.

5. The method of claim 2, wherein the optical waveguide is defined further as comprising a non-grating transition waveguide, wherein the non-grating transition waveguide comprises:
   a. a high index cover layer or a low index cover layer that converts a high loss discontinuity between the waveguide and the transition waveguide to a low loss discontinuity,
   b. a high index cover layer or a low index cover layer that converts a high loss discontinuity between the waveguide and the transition waveguide to a low loss discontinuity with a second contrasting cover layer;
   c. a tapered waveguide; or
   d. an inverse-tapered waveguide.

6. The method of claim 1, wherein the grating is defined further as comprising on at least one of:
   a bottom of the one or more grooves;
   one or more sidewalls of the ridges;

a top on the ridges;
two or more liner layers in the grooves; or
one or more sidewalls of the ridges that do not have a top.

7. The method of claim 6, wherein the liner layer selected from one or more of the following optional configurations:
(a) the liner layer is not contiguous;
(b) the liner layer is disposed on a first sidewall, a second sidewall or both the first and second sidewalls of the ridges;
(c) the liner layer is defined further as one or more liner layers that are contiguous and that follow the contour of the ridges and the grooves;
(d) the liner layer is not contiguous, wherein the liner layer is defined further as being substantially parallel to a bottom of the one or more grooves, and the non-contiguous layers are separated by one or more amorphous or crystalline cover layers;
(e) the liner layer is defined further as two or more liner layers that are contiguous and that follow the contour of the ridges, and each of the two or more liner layers are separated by one or more amorphous or crystalline cover layers;
(f) the liner layer is disposed on one or more tops of the ridges, one or more grooves between the ridges, or both the top of the ridges, and the grooves between the ridges;
(g) the liner layer is disposed on a first sidewall, one or more tops of the ridges, and one or more grooves between the ridges, to provide an effective blazed grating;
(h) the liner layer is disposed on a first sidewall and one or more tops of the ridges; or
(i) the liner layer is disposed on one or more first sidewall or second sidewall of one or more waveguiding structures for grating coupling (inward or outward).

8. The method of claim 6, wherein the ridges of the grating extend above the core layer.

9. The method of claim 6, wherein the thickness of each of the core layer, grating liner layer, and amorphous or crystalline cover layer are varied to optimize the ratio of upward coupled radiation to downward coupled radiation or in the upwards or downwards direction.

10. The method of claim 6, wherein the optical waveguide further comprises one or more additional grooves or ridges each with enhanced coupling strength gratings to provide a partially reflecting mirror that reduces or cancels a second-order in-plane Bragg reflection by destructive interference.

11. The method of claim 6, wherein the optical waveguide further comprises one or more additional grooves or ridges to provide a partially reflecting mirror that reduces or cancels a second-order in-plane Bragg reflection by destructive interference.

12. The method of claim 6, wherein the optical waveguide further comprises one or more additional grooves or ridges that are not covered by at least one of the liner layer or amorphous or crystalline cover layer to provide a partially reflecting mirror that reduces or cancels a second-order in-plane Bragg reflection by destructive interference.

13. The method of claim 6, wherein the grating period is adapted for use with wavelengths in the range of 0.1 to 0.4, 0.4 to 1.0, 0.5 to 1.1, 0.6 to 1.1, and greater than 1.1.

14. The method of claim 6, wherein the selection of the materials for the ridges is adapted for use with wavelengths in the range of 0.1 to 0.4, 0.4 to 1.0, 0.5 to 1.1, 0.6 to 1.1, and greater than 1.1.

15. The method of claim 6, wherein the core and the ridges are unitary.

16. The method of claim 1, wherein the liner layer is disposed on a high index contrast $Si/SiO_2$ waveguide to further enhance the performance of the grating.

17. The method of claim 1, wherein the amorphous or crystalline cover layer is selected to provide the second difference in the index of refraction between the amorphous or crystalline cover layer and the liner layer as the first difference in the index of refraction provided between the core and the liner layer.

18. The method of claim 1, wherein the liner layer is selected from at least one of SiO, $SiO_2$, $MgF_2$, $Al_2O_3$, $HfO_2$, $Ta_2O_{4-5}$, $Sc_2O_3$, $ZrO_2$, $TiO_2$, $CaF_2$, $ThF_4$, ZnS, ZnSe, polymers, and silicon nitride.

19. The method of claim 1, wherein the liner layer comprises a variable thickness to provide at least one of varying the strength of the coupling, an effective variable duty cycle, an effective variable grating depth, a Gaussian profile in a radiating coupler grating, or a near-Gaussian profile in a radiating coupler grating.

20. The method of claim 1, wherein the optical waveguide is formed into at least one of an enhanced grating on wherein the optical waveguide provides lateral optical confinement with a mesa structure and the enhanced grating is on at least one of: the top surface of the mesa structure; one or more lateral surfaces of the mesa structure; or on the surfaces adjacent the mesa structure; an enhanced grating for grating-assisted directional couplers; an enhanced grating for multiply resonant distributed feedback lasers; or an enhanced grating for multiplying resonant distributed Bragg reflector lasers; an enhanced grating in optical fibers for sampling or detecting light in optical fibers by grating outcouplers; an enhanced gratings in optical fibers for (1) sampling or detecting light in optical fibers by grating outcouplers operating near the second order Bragg condition; (2) sampling or detecting light in optical fibers by grating outcouplers operating as distributed Bragg deflectors; or (3) to couple light into optical fibers; a curved, enhanced gratings to make unstable resonator semiconductor lasers; an enhanced grating to reduce the etch depth for the placement of distributed Bragg reflector gratings in semiconductor lasers, which results in simplified processing for DBR lasers; an enhanced grating to reduce the etch depth for the placement of distributed Bragg reflector gratings in photonic devices, which results in simplified processing for photonic devices; and enhanced grating to reduce the etch depth for the placement of gratings in photonic devices, which results in simplified processing for photonic devices; or an enhanced grating to reduce the etch depth for the placement of coupling gratings in photonic devices, which results in simplified processing for photonic devices.

21. The method of claim 1, wherein the grating comprise a period that is equal to about the wavelength of the light propagating in the optical waveguide to produce an outcoupling in about 10 to 50 grating cycles.

22. The method of claim 1, wherein the grating comprise a period that is equal to about one half the wavelength of the light propagating in the optical waveguide, and up to about 100% in-plane reflectivity occurs in about 5 to 50 grating cycles for light in a typical III-V waveguide.

23. The method of claim 1, wherein the amorphous or crystalline cover layer selected from at least one of Si, GaAs, AlGaAs, InP, InGaAsP, GaN, AlGaN, InGaAsPSb, GaP, other column IV, column III-V, column II-VI semiconductors, SiO, $SiO_2$, $MgF_2$, $Al_2O_3$, $HfO_2$, $Ta_2O_{4-5}$, $Sc_2O_3$, $ZrO_2$, $TiO_2$, $CaF_2$, $ThF_4$, ZnS, ZnSe, spin-on polymers, and silicon nitride.

24. The method of claim 1, wherein the amorphous or crystalline cover layer is defined further as an amorphous or crystalline high index layer or an amorphous or crystalline low index cover layer and the amorphous or crystalline cover layer is deposited or formed by at least one of sputtering, vapor phase deposition, plasma enhanced chemical vapor deposition, vapor phase epitaxy, molecular beam deposition, molecular beam epitaxy, spin-on process, or atomic layer deposition or epitaxial growth over the liner layer through openings in the liner layer to exposed epitaxial material.

25. The method of claim 1, wherein the amorphous or crystalline cover layer is defined further as an amorphous low index cover layer deposited by at least one of sputtering, vapor phase deposition, plasma enhanced chemical vapor deposition, vapor phase epitaxy, molecular beam deposition, molecular beam epitaxy, atomic layer deposition, or by a spin-on processes.

26. The method of claim 1, wherein the amorphous or crystalline cover layer converts a grating from a grating region that docs not support a bound-mode to a grating region that does support a bound-mode.

27. The method of claim 1, wherein a period is selected that couples radiation at an angle sufficiently tilted from a surface-normal to reduce or eliminate second-order in-plane Bragg reflection.

28. The method of claim 1, wherein the optical waveguide further comprises one or more additional grating ridges that are not covered by the amorphous or crystalline cover layer.

29. The method of claim 1, wherein the index of refraction of the liner layer is the range of ~1.3 to ~1.7, 1.7 to ~2.2, ~2.2 to 3, or ~3 to ~3.8.

30. The method of claim 1, wherein the amorphous or crystalline cover layer is at least one of amorphous or crystalline silicon and is defined further as a high index cover layer that is compatible with silicon processing.

31. The method of claim 1, wherein:

$n_{liner} < n_{core}$;

$n_{liner} < n_{eff}$, where $n_{eff}$ is an effective index of refraction of the grating; and $n_{cover} > n_{eff}$.

32. The method of claim 1, wherein:

$n_{liner} > n_{core}$;

$n_{cover} < n_{core}$; and $n_{cover} \approx n_{substrate}$, where $n_{substrate}$ is an effective index of refraction of the substrate.

33. The method of claim 1, wherein:

the grating has a Figure of Merit (FOM) greater than 1.7;

FOM=(a relative permittivity difference)×(a grating confinement factor);

the relative permittivity difference=$(n_{core}^2 - n_{liner}^2)$; and the grating confinement factor=(a power contained in the grating)/(a total power in the grating).

34. The method of claim 1, wherein wherein an air layer is disposed above the amorphous or crystalline cover layer.

35. The method of claim 1, wherein:

the liner layer has a liner thickness of between 5 and 50 nm; and the amorphous or crystalline cover layer has a cover thickness of between 100 and 300 nm.

36. The method of claim 1, wherein:

the liner layer has a liner thickness of between $1/100^{th}$ and $1/10^{th}$ of a free space wavelength divided by an effective index of the grating; and the amorphous or crystalline cover layer has a cover thickness of between $1/5^{th}$ to 100% of the free space wavelength divided by the effective index of the grating.

37. The method of claim 1, wherein $n_{core} \neq n_{liner}$ and $n_{liner} \neq n_{cover}$.

38. A method of making a grating comprising:

depositing on a first portion of substrate, a core comprising a first material having an index of refraction ($n_{core}$) on the substrate, a superstrate on the core, and a photoresist on the superstrate;

etching the superstrate to the core;

etching through a grating mask formed on the core to form the grating comprising one or more ridges and one or more grooves, wherein the one or more grooves are adjacent to, or between the one or more ridges;

removing the grating mask;

depositing a liner layer comprising a second material having an index of refraction ($n_{liner}$) on the grating, wherein the liner layer has a liner thickness of between $1/100^{th}$ and $1/10^{th}$ of a free space wavelength divided by an effective index of the grating;

depositing an amorphous or crystalline cover layer comprising a third material having an index of refraction ($n_{cover}$) on the liner layer, wherein the amorphous or crystalline cover layer has a cover thickness of between $1/5^{th}$ to 100% of the free space wavelength divided by the effective index of the grating; and wherein the third material is not the same as the first material, $n_{core} \neq n_{liner}$ and $n_{liner} \neq n_{cover}$.

* * * * *